United States Patent
Soffer

(10) Patent No.: US 10,067,539 B2
(45) Date of Patent: Sep. 4, 2018

(54) 3-DIMENSIONAL MULTI-LAYERED MODULAR COMPUTER ARCHITECTURE

(71) Applicant: BEYOND BLADES LTD., Ma'Haral (IL)

(72) Inventor: Aviv Soffer, Geva Carmel (IL)

(73) Assignee: BEYOND BLADES LTD., Ma'Haral (IL)

( * ) Notice: Subject to any disclaimer, the term of this patent is extended or adjusted under 35 U.S.C. 154(b) by 0 days.

(21) Appl. No.: 15/637,718

(22) Filed: Jun. 29, 2017

(65) Prior Publication Data

US 2017/0308133 A1     Oct. 26, 2017

Related U.S. Application Data

(60) Continuation of application No. 14/886,606, filed on Oct. 19, 2015, which is a continuation of application No. 13/605,044, filed on Sep. 6, 2012, now Pat. No. 9,164,555, which is a division of application No. 12/066,003, filed as application No. PCT/IL2006/001041 on Sep. 6, 2006, now Pat. No. 8,274,792.

(60) Provisional application No. 60/714,681, filed on Sep. 6, 2005.

(51) Int. Cl.
| | |
|---|---|
| G06F 1/18 | (2006.01) |
| F28D 15/02 | (2006.01) |
| H05K 1/18 | (2006.01) |
| G06F 1/20 | (2006.01) |
| H05K 1/02 | (2006.01) |
| H05K 7/20 | (2006.01) |

(52) U.S. Cl.
CPC .......... *G06F 1/18* (2013.01); *F28D 15/0266* (2013.01); *F28D 15/0275* (2013.01); *G06F 1/20* (2013.01); *H05K 1/0284* (2013.01); *H05K 1/185* (2013.01); *G06F 2200/1635* (2013.01); *H01L 2224/16225* (2013.01); *H01L 2224/32225* (2013.01); *H01L 2224/73204* (2013.01); *H01L 2924/19105* (2013.01); *H05K 7/205* (2013.01); *H05K 2201/041* (2013.01)

(58) Field of Classification Search
USPC ........................................................ 361/764
See application file for complete search history.

(56) References Cited

U.S. PATENT DOCUMENTS

| | | | |
|---|---|---|---|
| 3,648,113 A | 3/1972 | Rathjen et al. | |
| 4,647,959 A | 3/1987 | Smith | |
| 5,079,619 A | 1/1992 | Davidson | |
| 5,181,167 A | 1/1993 | Davidson et al. | |
| 5,432,729 A | 7/1995 | Carson et al. | 365/63 |
| 5,583,990 A | 12/1996 | Birrittella et al. | |
| 5,748,452 A * | 5/1998 | Londa | H01L 23/3128 257/686 |
| 5,801,924 A | 9/1998 | Salmonson | |
| 5,864,738 A | 1/1999 | Kessler et al. | |
| 5,909,357 A | 6/1999 | Orr | |

(Continued)

*Primary Examiner* — Mukund G Patel
(74) *Attorney, Agent, or Firm* — William Dippert; Laurence Greenberg; Werner Stemer

(57) ABSTRACT

A stackable layer is provided for 3-Dimensional multi-layered modular computers. The stackable layer comprises at least one encapsulated chip die. Sets of electrical contacts are provided on each one of the large surfaces of the layer. The encapsulated chip die and the two large opposite surfaces of the layer are substantially parallel.

18 Claims, 62 Drawing Sheets

(56) References Cited

U.S. PATENT DOCUMENTS

| | | | |
|---|---|---|---|
| 5,920,714 | A | 7/1999 | Schiffleger |
| 6,055,157 | A | 4/2000 | Bartilson |
| 6,206,705 | B1 * | 3/2001 | Bolotin ................ H01L 25/105 |
| | | | 257/704 |
| 6,219,695 | B1 | 4/2001 | Guttag et al. |
| 6,230,252 | B1 | 5/2001 | Passint et al. |
| 6,297,960 | B1 | 10/2001 | Moden et al. |
| 6,580,609 | B2 | 6/2003 | Pautsch |
| 6,680,915 | B1 | 1/2004 | Park et al. |
| 6,746,894 | B2 | 6/2004 | Fee ..................... H01L 21/4846 |
| | | | 257/680 |
| 6,787,825 | B1 * | 9/2004 | Gudesen ................ G11C 5/02 |
| | | | 257/278 |
| 6,825,846 | B2 | 11/2004 | Mondal |
| 6,835,070 | B1 | 12/2004 | Law |
| 6,888,735 | B2 | 5/2005 | Nishihara ..................... 365/145 |
| 6,894,392 | B1 | 5/2005 | Gudesen et al. .............. 257/759 |
| 6,894,906 | B2 | 5/2005 | Sivertsen |
| 6,900,074 | B2 | 5/2005 | Miyamoto et al. |
| 6,906,721 | B1 | 6/2005 | Burrell |
| 6,909,183 | B2 | 6/2005 | Feiertag et al. |
| 8,824,163 | B2 * | 9/2014 | Kim ....................... H01L 23/13 |
| | | | 257/40 |
| 8,907,442 | B2 | 12/2014 | Or-Bach et al. ............. 257/499 |
| 2003/0128523 | A1 | 7/2003 | Moden et al. ................ 361/719 |

\* cited by examiner

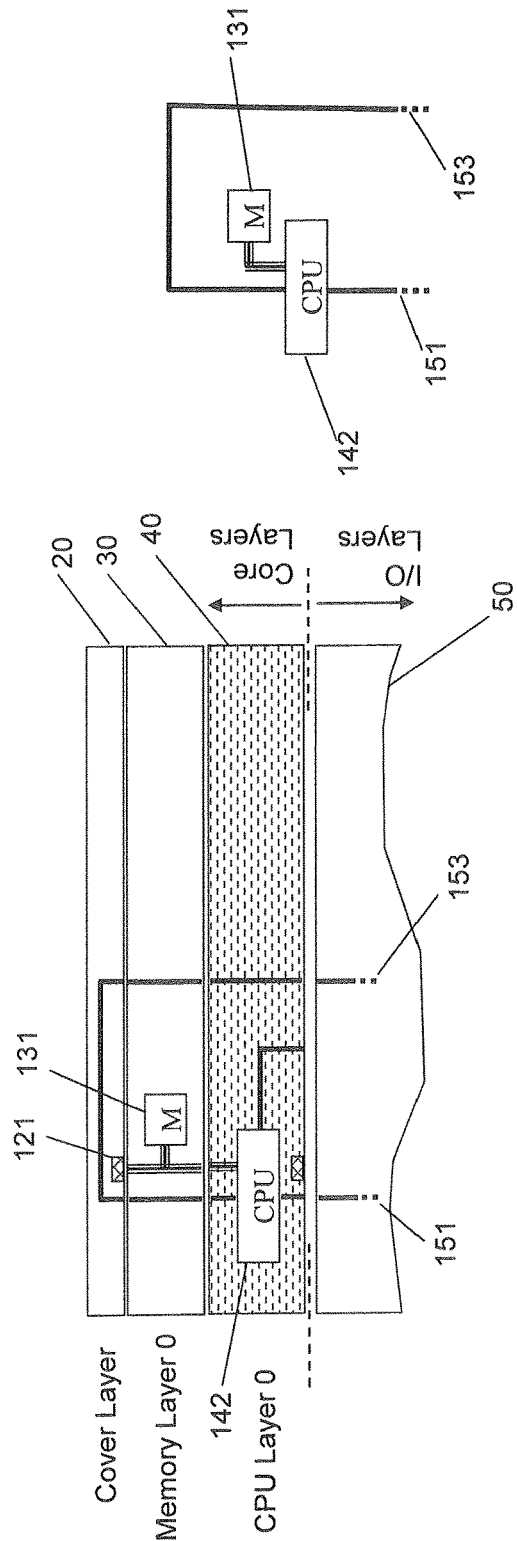

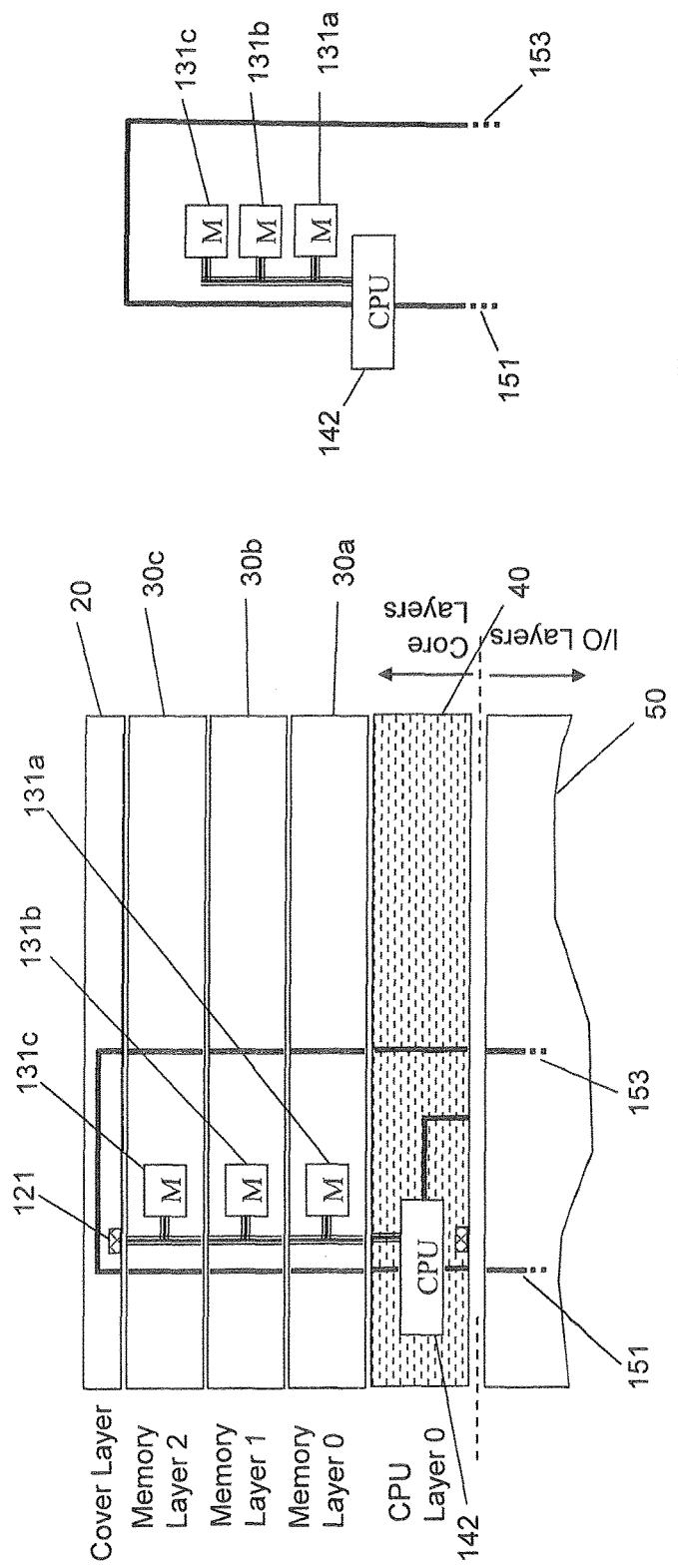

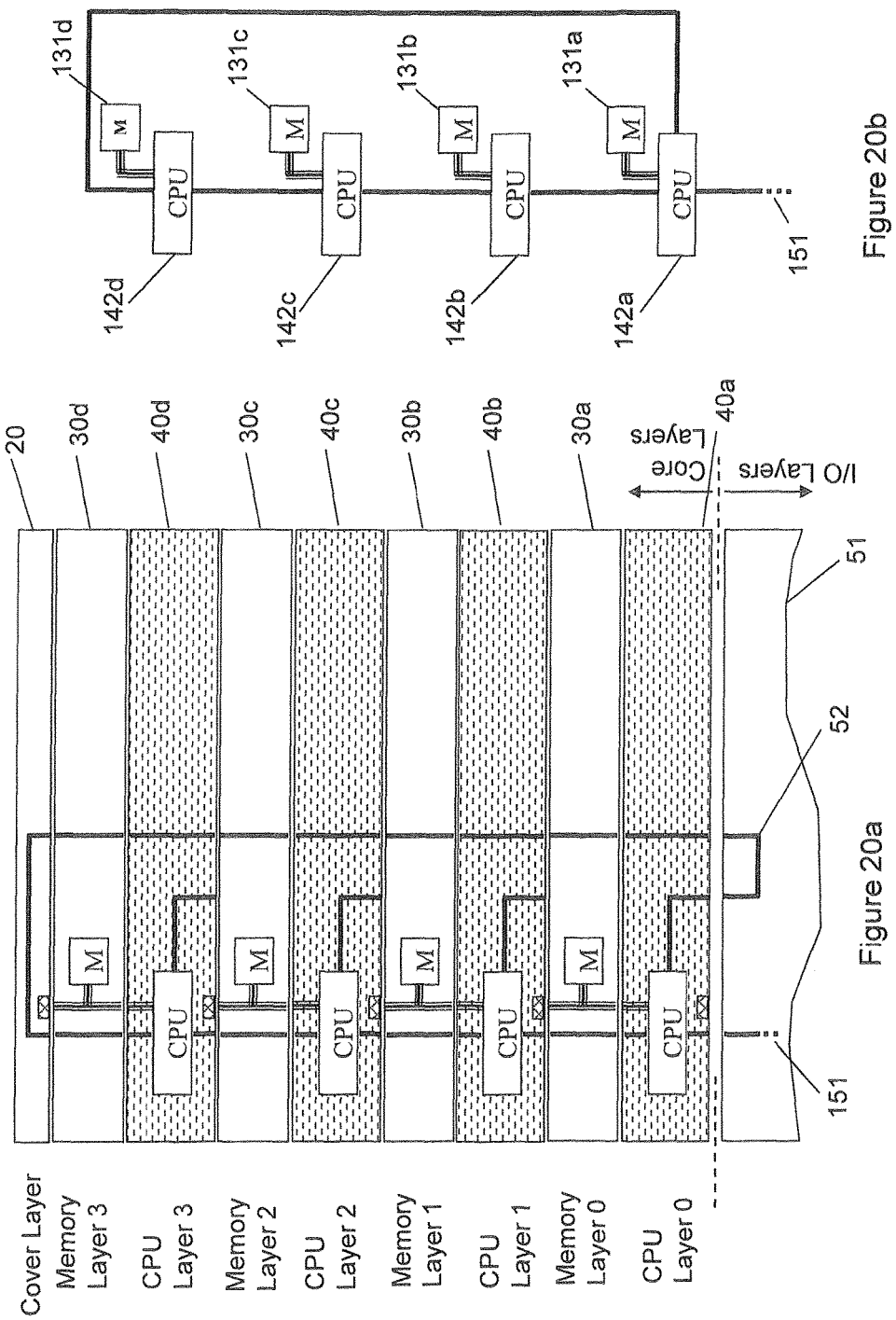

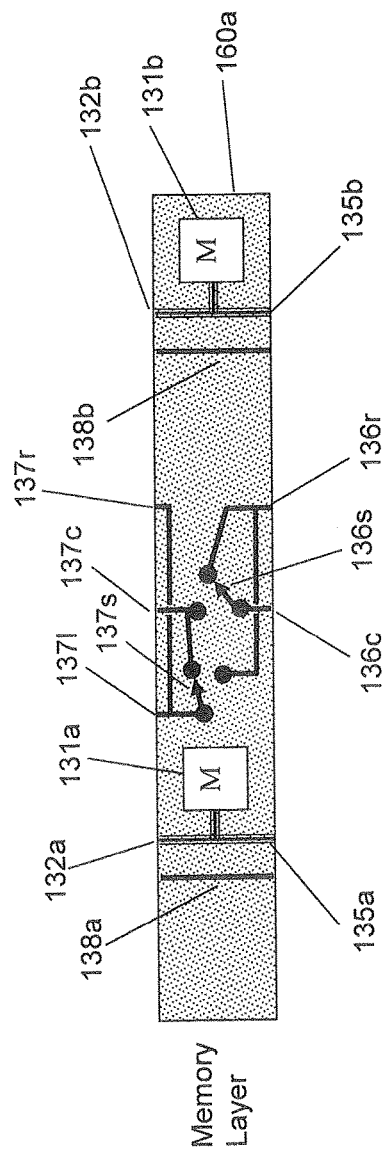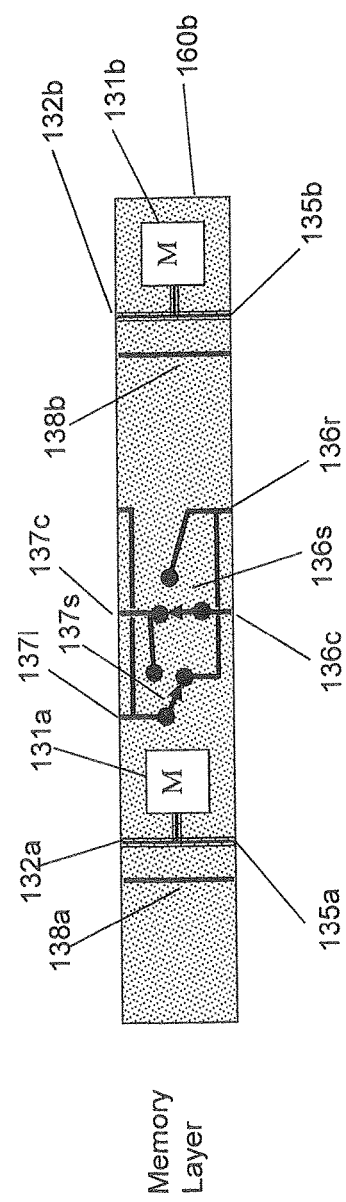

3-DIMENSIONAL MULTI-LAYERED MODULAR COMPUTER ARCHITECTURE

CROSS-REFERENCE TO RELATED APPLICATIONS

This application is a continuation of U.S. patent application Ser. No. 14/886,606, filed Oct. 19, 2015, which in turn is a continuation of U.S. patent application Ser. No. 13/605,044, filed Sep. 6, 2012, now U.S. Pat. No. 9,164,555, which in turn is a divisional of U.S. patent application Ser. No. 12/066,003, filed Mar. 6, 2008, now U.S. Pat. No. 8,274,792, which is a U.S. National Stage filing of PCT patent application No. PCT/IL2006/001041, filed Sep. 6, 2006, which is based upon and claims the benefit of the filing date of U.S. provisional patent application Ser. No. 60/714,681, filed Sep. 6, 2005, each of which is incorporated herein it its entirety.

FIELD OF THE INVENTION

The invention is intended for providing a computer architecture that significantly improves computer mass, volume, and power densities through the use of 3-Dimensional layered structure instead of traditional 2-Dimensional Printed Circuit Board structure. Such computing architecture can be useful for many applications ranging from mobile computers, desktop Personal Computers, servers to supercomputers.

BACKGROUND OF THE INVENTION

Computing power becomes a needed resource just like electricity and water supply that are essential resources for civilization. Computing power is necessary to process the ever increasing business data, engineering and scientific problems, to enhance digital multimedia and entertainment experience and in many other aspects that affect most people's life. Since computers were first introduced, the need for computational power is progressively increasing. Computer vendors are challenged by the ever increasing computing power demand. Every year new software applications are being released and typically requiring more computing resources. Every year computer vendors must upgrade their product offerings to provide better performance, more graphic power, and more memory and storage. To remain competitive in this ever changing market vendors must continuously adopt the fastest and higher density processors and chipsets. The demand for faster computing power pushes the computing supply-chain toward higher performance, larger capacities, and lower pricing. These trends are even more significant in the server industry as more powerful servers are needed for IT organizations to satisfy the ever increasing demand for computational power and data handling in their organizations.

Current technology computers and servers are characterized by low density compared to pure silicon mass and volume. As silicon is the platform "payload"—where computation and memory is taking place, the rest of the computer can be considered as "overheads" such as interconnects, cooling, enclosures, and power functions. This low density results from 2-D structure that is based on Printed Circuit Boards (PCBs) forming the motherboard. In a typical desktop only less than 1% of the volume and the mass of the computer is the silicon payload, the other 99% are overheads. Inefficiencies result from the 2-D nature of the chip interconnections, PCBs, and other connectors and wiring. Some perpendicular boards can improve the device density, but still both the volumetric efficiency and mass efficiency are typically low.

One option known in the prior art is the blade server—a combination of a rack that can host several parallel modules (blades) and a perpendicular backplane that interconnects these blades to one or more management modules, power supplies, and network switches. While this option tends to increase the device volumetric and mass efficiency, it suffers from cooling problems, standardization problems, and higher costs. The air-flow necessary to dissipate the heat generated at the blade chips and power components requires wide flow paths and generates strong acoustic noise. Another disadvantage of the current technology blade servers is the lack of standardization at any level. Chips, boards, and modules are not interchangeable between vendors or between different models of the same vendor. As density of blade servers increases so the heat dissipation problem increases. With increased components density there is a need to pass faster air while air-paths become smaller. This tends to challenge the modules and rack design and dramatically affect the system performance and reliability.

One area where volumetric efficiency is critical is in the data-centers. Data-centers are characterized by high cost per rack vertical space. Any increase in the performance or capacity per rack space can be immediately translated into cost savings. Organizations that operate large numbers of server cores at their data-centers are always seeking technologies that enable them to get more performance per U (vertical standard equivalent to 1.75 inches/44.5 mm) in their racks.

The rapid development of interconnect bus technologies, memory technologies, CPU technologies and storage reduces the capability to standardize components between platforms. As a result of that platforms that were the best technology just three years ago may become non-standard and obsolete today. A large amount of computer equipment is dumped as waste every year, and this becomes one of the most problematic types of environmental waste. Computer equipment contains many polluting and hazardous materials, and the short life cycle of this equipment generates a huge amount of waste materials. Increasing the life cycle of computing equipment together with reduction of volume and mass can dramatically reduce computer related wastes and therefore will be environmentally safer. New rules and regulations about waste electronics equipment were enacted to reduce pollution and waste. Electronic related products had becomes a global pollution source, and any innovation that reduces its volume will be embraced by the European community and many other governments).

Another major disadvantage of the current technology 2-D computers and servers is the signal trace length. To bridge between the different components located on the motherboard, longer PCB traces are needed. The design around longer traces limit the bus speeds, causes larger latencies, causes cross-talk between signals, increases the noise pickup, worsens the signal shape due to parasitic capacitance and parasitic inductance, and causes electromagnetic noise that may affect other devices nearby.

Another design problem with the current 2-D computers and servers is the low density interconnects. The need to include in the design the options to connect additional modules or components on the mother board requires designs to include many used or unused low density connectors. As these connectors are built for PCB modules, the maximum pitch possible is around 0.5 mm at each side. With today's 64 and 128 bit busses, this results a long connector.

The problem becomes even more severe if the connector stays unused. In this case many fast signals may stay exposed without proper terminations.

Another option to build higher performance and higher density computers known in the prior art is Massively Parallel Processing (MPP) systems. Computing systems comprised of hundreds or thousands of Processing Elements (PEs) individually interconnected by a common high-speed communication network. The arrangement of PEs in 3-D array structures enables better connectivity between PEs and therefore yield higher performance in these demanding applications. A typical example is Cray XT3 parallel processing supercomputer that relies on AMD Opteron commercial 64 bit processor and Cray's SeaStar 3-D interconnect technology. While this architecture offers higher density and 3-D cores connectivity scheme, it still suffers from high costs and limited density improvement compared to traditional servers. This current technology MPP is typically built as 3-D mesh structures at the motherboards level, and still each core being used as PE is 2-D structure with traditional PCBs structure. These design challenges described above and many other inherent problems typical for the current 2-D computer design methodology yield limited busses and interconnect performance and as a result-limited system overall performance and lower reliability.

REFERENCED PATENTS

1. U.S. Pat. No. 4,647,959—Integrated circuit package, and method of forming an integrated circuit package, Smith; Kenneth R.
2. U.S. Pat. No. 5,801,924—Method and Apparatus for cooling daughter card module, Richard B. Salmonson.
3. U.S. Pat. No. 5,583,990—System for allocating messages between virtual channels to avoid deadlock and to optimize the amount of message traffic on each type of virtual channel, Birrittella et al.
4. U.S. Pat. No. 5,864,738—Massively parallel processing system using two data paths: one connecting router circuit to the interconnect network and the other connecting router circuit to I/O controller, Kessler et al.
5. U.S. Pat. No. 5,920,714—System and method for distributed multiprocessor communications, Schiffleger; Alan J.
6. U.S. Pat. No. 6,055,157—Large area, multi-device heat pipe for stacked MCM-based systems, Bartilson; Bradley W.
7. U.S. Pat. No. 6,230,252—Hybrid hypercube/torus architecture, Passint et al.
8. U.S. Pat. No. 6,580,609—Method and apparatus for cooling electronic components, Pautsch; Gregory W.
9. U.S. Pat. No. 6,680,915—Distributed computing system using virtual buses and data communication method for the same, Park et al.
10. U.S. Pat. No. 6,835,070—Cooling arrangement for electronic systems, Law; Randall A.
11. U.S. Pat. No. 6,909,183—Substrate for an electric component and method for the production thereof, Feiertag et al.
12. U.S. Pat. No. 6,900,074—Method of manufacturing a semiconductor device having plural semiconductor chips, wherein electrodes of the semiconductor chips are electrically connected together via wiring substrate of the semiconductor chips, Miyamoto et al.
13. U.S. Pat. No. 6,219,695—Circuits, systems, and methods for communicating computer video output to a remote location, Guttag, et al.
14. U.S. Pat. No. 6,825,846—Systems and methods for capturing screen displays from a host computing system for display at a remote terminal, Mondal.
15. U.S. Pat. No. 6,894,906—Housing for in-line video, keyboard and mouse remote management unit, Sivertsen.
16. U.S. Pat. No. 6,906,721—Systems, methods, and computer program products for managing the display of information output by a computer program, Burrell.

OTHER REFERENCED DOCUMENTS

AMD Specification—"Open Platform Management Architecture Specification", AMD Publication #32200, Revision: 1.02, Issue Date: May 2005.

White Paper—Portals 3.3 on the Sandia/Cray Red Storm System, Ron Brightwell et al. Sandia National Laboratories, PO Box 5800, Albuquerque, N. Mex. 87185-1110, May 18, 2005.

Data Sheet—AMD-8131.™. HyperTransport.™. PCI-X Tunnel, AMD 24637 Rev 3.02—Aug. 10, 2004.

Data Sheet—AMD-8111.™. HyperTransport.™. I/O Hub, AMD Publication #24674 Revision: 3.03, Issue Date: July 2004.

HyperTransport.™. I/O Link Specification Revision 1.03, HyperTransport.™. Technology Consortium, Oct. 10, 2001.

HyperTransport.™. I/O Link Specification Revision 2.00b, HyperTransport.™. Technology Consortium Document #HTC20031217-0036-0009, Apr. 27, 2005.

Broadcom BCM5703 Product Brief, Broadcom 5703-PB03-R, Jan. 5, 2005.

Presentation—The New Generation of Cray Tools to Support Sustained Performance, Luiz DeRose, Sr. Principal Engineer Tools Manager, SC'2004 APART Workshop, Nov. 12, 2004.

Cray XT3 Datasheet—Cray Inc., May 2005.

Cray XD1 Datasheet—Cray Inc., June 2005.

Research paper—"Developing Custom Firmware for the Red Storm SeaStar Network", Kevin T. Pedretti, Scalable Computing Systems Department, Sandia National Laboratories Interface and Trammell Hudson OS Research, May 16, 2005.

Research paper—"Portals 3.3 on the Sandia/Cray Red Storm System" Ron Brightwell et al. Sandia National Laboratories for United States Department of Energy's, National Nuclear Security Administration under contract DE-AC04-94AL85000.

AMD Technical document—"Builder's Guide for AMD Opteron.™. Processor-Based Servers and Workstations", AMD Publication #30925, Revision: 3.04, Issue Date February 2004.

AMD Technical document—"BIOS and Kernel Developer's Guide for AMD Athlon.™. 64 and AMD Opteron.™. Processors", AMD Publication #26094 Revision: 3.24, Issue Date: January 2005.

AMD Technical document—"AMD Opteron.™. Processor Power and Thermal Data Sheet", AMD Publication #30417 Revision: 3.05, Issue Date: May 2004.

AMD Opteron.™. Product Data Sheet, Publication #23932 Revision: 3.11, Issue Date: June 2004.

AMD Functional Data Sheet, 940 Pin Package, Publication #31412 Revision: 3.05, Issue Date: June 2004.

AMD Brochure—AMD Opteron.™. Processor with Direct Connect Architecture 4-Socket Server Comparison, AMD Publication #31342B, Issue Date: June 2004.

Celestica product data-sheet—A8440 4U 4 Processor SCSI System.

International Rectifier data-sheet—Data Sheet No. PD94710, IR3082-XPHASE.™. AMD OPTERON.™./ATHLON 64.™. Control IC, Dec. 17, 2004.

Linear Technology design note—3-Phase LTC3733 Provides High Performance Power Solutions for AMD Opteron.™. and Athlon.™. 64 Processors—Design Note 326, Henry J. Zhang and Wei Chen.

Silicon Laboratories—Advanced Information—Si8250/1/2 Digital Power Controller, Preliminary Rev. 0.2 4/05.

Intersil data-sheet—, HIP6301—Microprocessor CORE Voltage Regulator.

Multi-Phase Buck PWM Controller, Dec. 27, 2004 FN4765.6.

Presentation—Red Storm, by Robert Alverso, Red Storm Hardware Architect, March 2003, Cray Computers Inc.

Specification—HyperTransport Cave IP—GDA Technologies, Inc, June 2002, version 1.0.

Specification—HyperTransport Host IP—GDA Technologies, Inc, June 2002, version 1.0.

Specification—HyperTransport Bridge IP—GDA Technologies, Inc, June 2002, version 1.0.

SUMMARY OF THE INVENTION

It is an object of the present invention to relate to a method and apparatus for providing scaleable computing platform that mitigates one or more of the previously identified deficiencies in the prior art.

Another object of the present invention relates to a method and apparatus providing high density computing platforms.

Another object of the invention relates to a method and apparatus providing multiple CPUs and memory modules to be assembled and interconnected together.

Another object of the invention relates to a method and apparatus serving as a modular computer enabling vendors or even users to easily assemble and mix plurality of different CPU memory and I/O configurations.

Another object of the invention relates to a method and apparatus for providing improved high density vertical signal interconnections which eliminate the need for bulky and unreliable Printed Circuit Boards and wiring.

Another object of the invention relates to a modular electronic system having shorter signal paths, and to a method for constructing such a system.

Another object of the invention relates to a modular electronic system wherein at least some of the signals between two dies, between two substrates or between a die and a substrate communicate via capacitive coupling.

Another object of the invention relates to a modular electronic system wherein at least some of the signals between two dies, between two substrates or between a die and a substrate communicate via magnetic coupling.

Another object of the invention relates to a modular electronic system wherein a module couples both capacitively and conductively to other modules.

Another object of the invention relates to a modular electronic system wherein a module couples both magnetically and conductively to other modules.

Another object of the invention relates to a method and apparatus for integrating modules of physically incompatible materials into a modular electronic system wherein signals couple between nearby, physically incompatible modules via capacitive or magnetic means.

It is therefore provided in accordance with a preferred embodiment of the present invention a 3-Dimensional multi-layered modular computer (3DMC) apparatus stacked in parallel layers comprising:

CPU functions adapted to perform various data processing tasks;

volatile memory functions adapted to temporarily store data necessary for the operation of said CPU functions;

Input/Output (I/O) interface function for communication;

management functions; and power supply function/s adapted to power other functions, whereby the parallel layers are electrically connected to create a computing apparatus.

There is also provided a description of each layer construction as well as a cooling system.

BRIEF DESCRIPTION OF THE DRAWINGS

An exemplary embodiment of the invention is described in the following section with respect to the drawings.

The same reference numbers are used to designate the same or related features on different drawings. The drawings are generally not drawn to scale. The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

FIGS. 17a and 17b illustrate core stack views of Single CPU 3DMC platform according to a preferred embodiment of the present invention.

FIGS. 18a and 18b illustrate core stack views of a preferred 1-Way Single CPU core 3DMC platform having three similar memory layers according to the present invention.

FIGS. 20a and 20b illustrate core stack views of a preferred 4-CPU cores 3DMC platform built of four single CPU layers according to the present invention; the core stack view and the core stack logic view, respectively.

FIGS. 22a and 22b show a simplified block diagram of crossed memory module to enable crossed lateral inter-processor links according to the present invention; Crossed Memory Layer in normal mode and crossed Memory Layer in crossed mode, respectively.

FIG. 26a illustrates the core stack side view, while FIG. 26b illustrates ore stack logic view.

DETAILED DESCRIPTION OF THE FIGURES AND THE INVENTION

The following detailed description is of the best presently contemplated modes of carrying out the present invention. This description is not to be taken in a limiting sense, but is made merely for the purpose of illustrating the general principles in accordance with the present invention. The scope of the present invention is best defined by the appended claims. For clarity, non-essential elements may have been omitted from some of the drawings. As used herein, an element or step recited in the singular and proceeded with the word "a" or "an" should be understood as not excluding plural elements or steps, unless such exclusion is explicitly recited.

Further reference will now be made to the drawings, wherein exemplary embodiments of the present claimed invention are illustrated.

Figure 1:
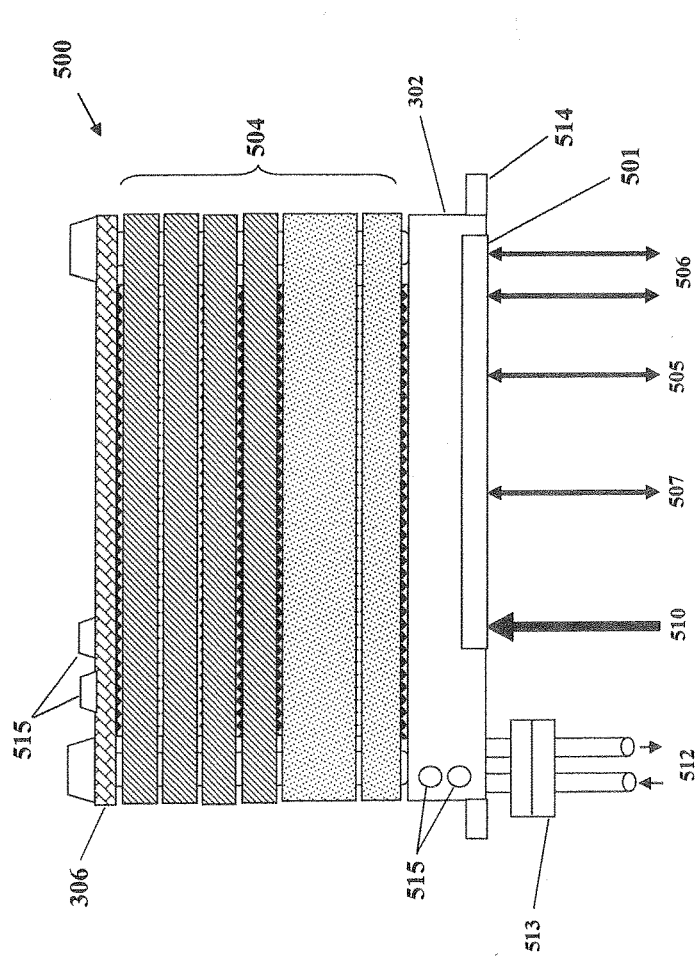
FIG. 1 illustrates external interfaces of a typical 3DMC server according to a preferred embodiment of the present invention.

Reference is now made to FIG. 1 illustrating a side view of a typical 3DMC embodiment of the present invention 500 with the external interfaces. In this figure the 3DMC Available Stacking Height (ASH) is occupied with six layers marked together as 504. The base layer 302 serves as a mechanical base for the whole 3DMC system. Attachment to a chassis or enclosure achieved through optional mounting flange/s 514. These flanges removably secure the 3DMC to the enclosure or chassis (not shown here) through fasteners. An optional removable electrical connector/s 501 enable quick and simple base layer connect/disconnect.

All external inputs and outputs to and from the 3DMC are concentrated at the lower side of the base layer as shown in this typical implementation by base layer 302 to facilitate for easy assembly and removal. These connections include at least one or more primary LAN interfaces 506, Management LAN interface 505, one or more storage interface/s 507, DC Power inputs 510 and coolant fluid input and output 512. Additional interfaces may be added to support legacy interfaces or any other required functions.

More specifically LAN interface 505 may be implemented using standard 100 Base-T, Giga LAN or faster LAN protocols, HyperTransport or Infiniband on copper wires, optical fibers or other suitable media.

Power, reset and recovery switches 515 enable system turn on and off functions, system hard reset function and system restore to factory defaults in case that the user fails to communicate with the management computer. These switches may be additionally or alternatively located at the cover layer 306 to enable easier user access from above.

Storage interface/s 507 may be standard interfaces such as SCSI, Parallel ATA, Serial ATA (SATA), Fiber Channel, HyperTransport, Infiniband or any other standard or proprietary storage interconnect protocol.

Coolant fluid attachments 512 may be implemented fast connect—disconnect fittings 513 to assist in assembly and maintenance of the system. Disconnect fitting 513 may also contain a coolant fluid filter to protect the internal cooling system from particles contamination.

Figure 2:
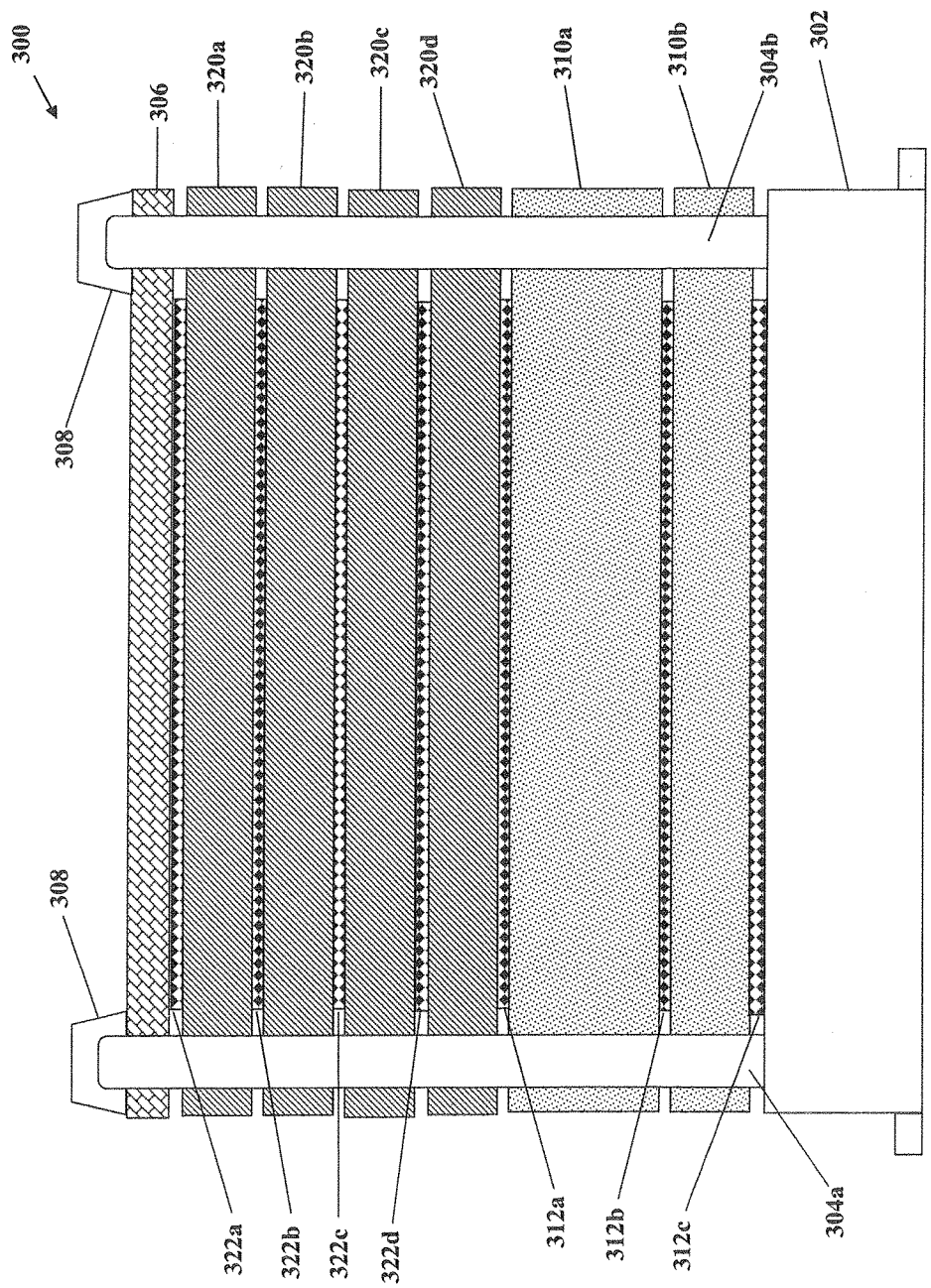
FIG. 2 illustrates a simplified cross-sectional view of one 3DMC according to an embodiment of the present invention. Thermal Conductive Rods are fixed to the base layer and power supply functions embedded in the base layer.

FIG. 2 shows a simplified side cross-sectional view of one 3DMC embodiment 300 of the present invention. In this figure the base layer 302 is the mechanical base for the whole stack. Two of the four vertical and perpendicular Thermal Conducting Rods (TCRs) 304a and 304b are visible through this cross-sectional view. The thermal conducting rods penetrate all other stacked layers and end on top of the cover layer 306 that serves as a pressure surface for all stacked layers. Two of the four pressure nuts 308 are visible. During the stack assembly process these nuts 308 are used to apply proper and even pressure on the stack. Optionally, springs (not shown) are placed between pressure nuts 308 and cover layer 306 to provide even pressure and allow thermal expansion. Optionally these springs are pre-stressed and optionally are part of the nuts or the cover layer.

Pressure nuts 308 may have different head shapes to enable assembly and disassembly of the stack by hands, screwdriver, Allen tool, wrench, automated powered tools, etc.

Top layer is optionally used to loop-back and terminate busses. It is advantageous to design all layers with the assumption that there may be another layer on top of it. Loop-back and terminations are thus preferably done at the top layer.

Additionally, top layer provides, and may specifically designed to provide an efficient primary or secondary thermal path to aid cooling of the layers below it.

Optionally, cover layer may have connectors and contacts for interfacing with external devices such as testing equipment or programming devices, etc.

Optionally, cover layer may have switches or jumpers for configuring it or layers below.

Optionally, cover layer may have indicators, for example, Light Emitting Diodes (LED's) or small LCD panel for indicating status of the device, for example: power on/off, mode of operation, faults, temperatures, computational loads etc.

The stack shown in this example is built of two I/O layers 310a and 310b and four core layers 320 on top. Four core interconnection layers 322a, 322b, 322c, and 322d are placed on top of each core layer 320a, 320b, 320c, and 320d, respectively, to enable electrical connection with the next layer. Core layers 320 may be of any suitable combinations of CPU layers and Memory layers.

In this context, I/O is the Input Output. It is typically include primary LAN/s, Disk/storage interfaces and boot storage. Three I/O interconnection layers 312a, 312b, and 312c connect the I/O layers. The upper I/O interconnect layer 312a connects the upper I/O layer 310a with the lowest core layer 320d. The middle I/O interconnect layer 312b connects the upper I/O layer 310a with the lower I/O layer 310b. The lower I/O interconnect layer 312c connects between the lowest I/O layer 310b and the base layer 302. As can be seen in FIG. 2, layers can be of different thickness. However, preferably the Available Stacking Height (ASH) is completely full by layers. In case that there are not enough layers to fill the Available Stacking Height, blank spacer layers may be assembled on top of the cover layer 306 or below if needed terminations available at the blank spacer layers.

Additional types of layers may be optionally or alternatively assembled in the 3DMC stack to enable plurality of additional function such as special computational cores, communications, routing, Analog to digital conversion, Digital to analog conversion, video processing, signal processing, etc.

Figure 2A:
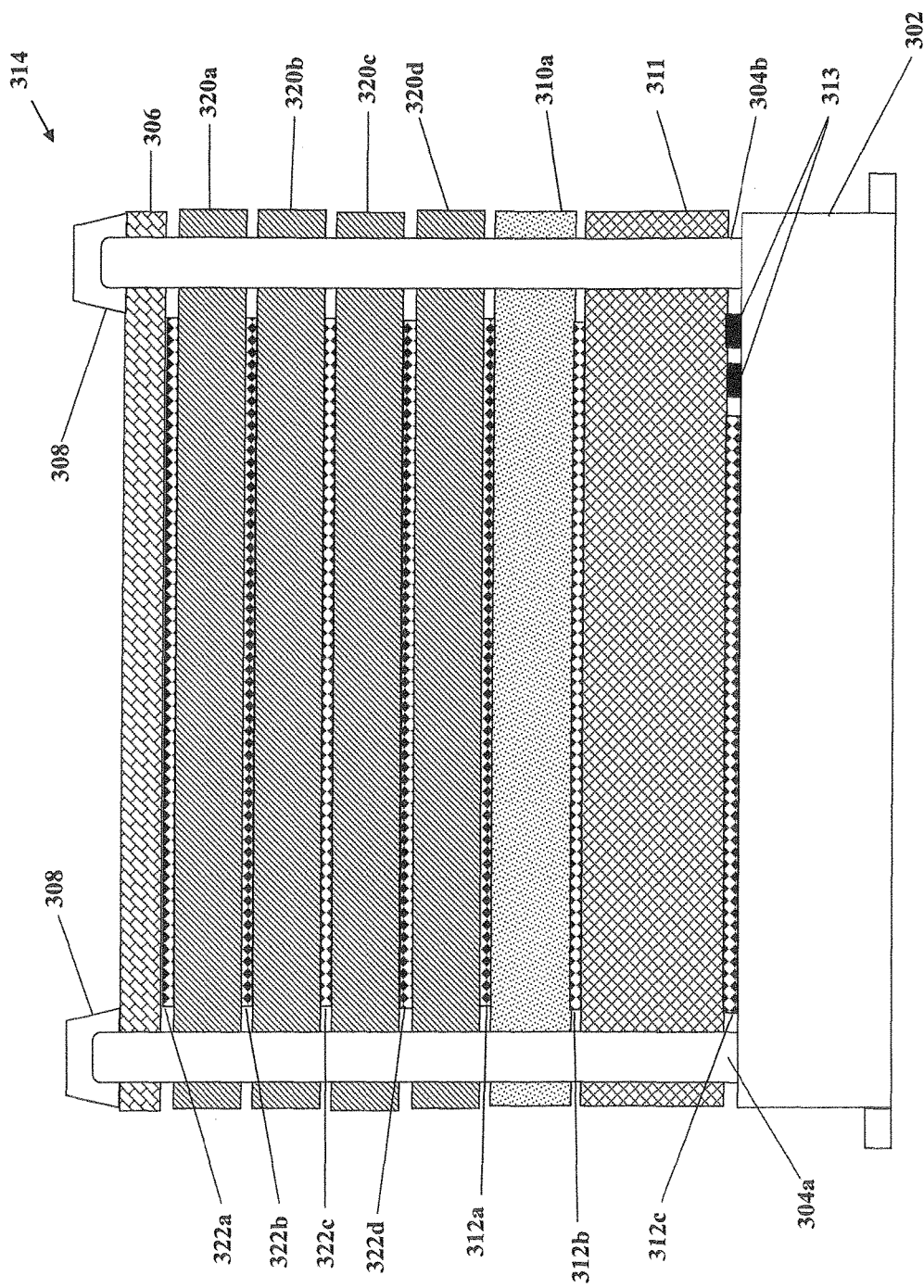
FIG. 2a shows another simplified cross-sectional view of one 3DMC according to another embodiment of the present invention having a separate power supply layer.

FIG. 2a illustrates yet another simplified side cross-sectional view of one 3DMC embodiment 314 of the present invention. In this particular example the power supply function is not located in base layer 302 but at the first layer on top of the base layer 311. High current DC power input to the power supply layer 311 is fed through large power pins 313 interconnecting the base layer 302 and the power supply layer 313. This implementation enables vendors to build the power supply function in a modular way to facilitate scalability and maintainability. Power output from the power supply layer 311 is delivered to the consumers in each layer using same four TCRs described above.

It is also possible to implement a distributed power supply scheme where more than one power supply layers assembled in the 3DMC stack at certain location to supply the needed power for one or more adjacent layers. In such case power output of these said layers can be delivered to the adjacent layers using dedicated power contacts, coaxial TCR layers or other high current interconnect means.

Figure 2B:
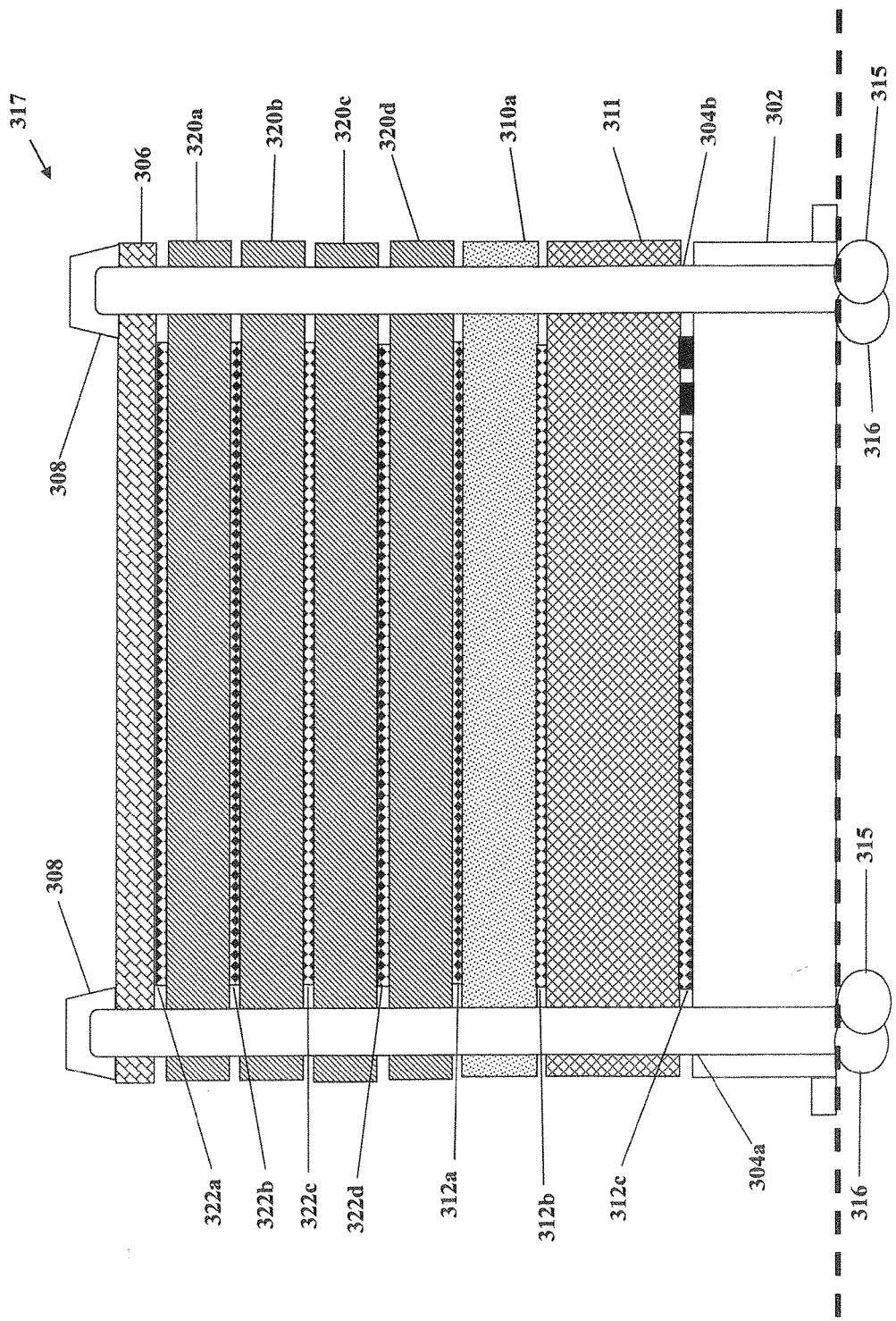
FIG. 2b shows another simplified cross-sectional view of one 3DMC according to yet another embodiment of the present invention having a separate power supply layer and Thermal Conductive Rods passing through the base layer.

FIG. 2b presents another implementation option of the current invention 317 having the four TCRs-only 304a and 304b can be seen in the figure-installed in the system rack under the base layer 302. Coolant fluid inlets 315 and outlets 316 provide coolant water flow around the four TCRs. One clear advantage of this arrangement is that coolant fluid does not enter the base layer and therefore the risk of leakage and flow problems is significantly reduced compared to TCR fixed to base layer configuration shown above.

Figure 3:
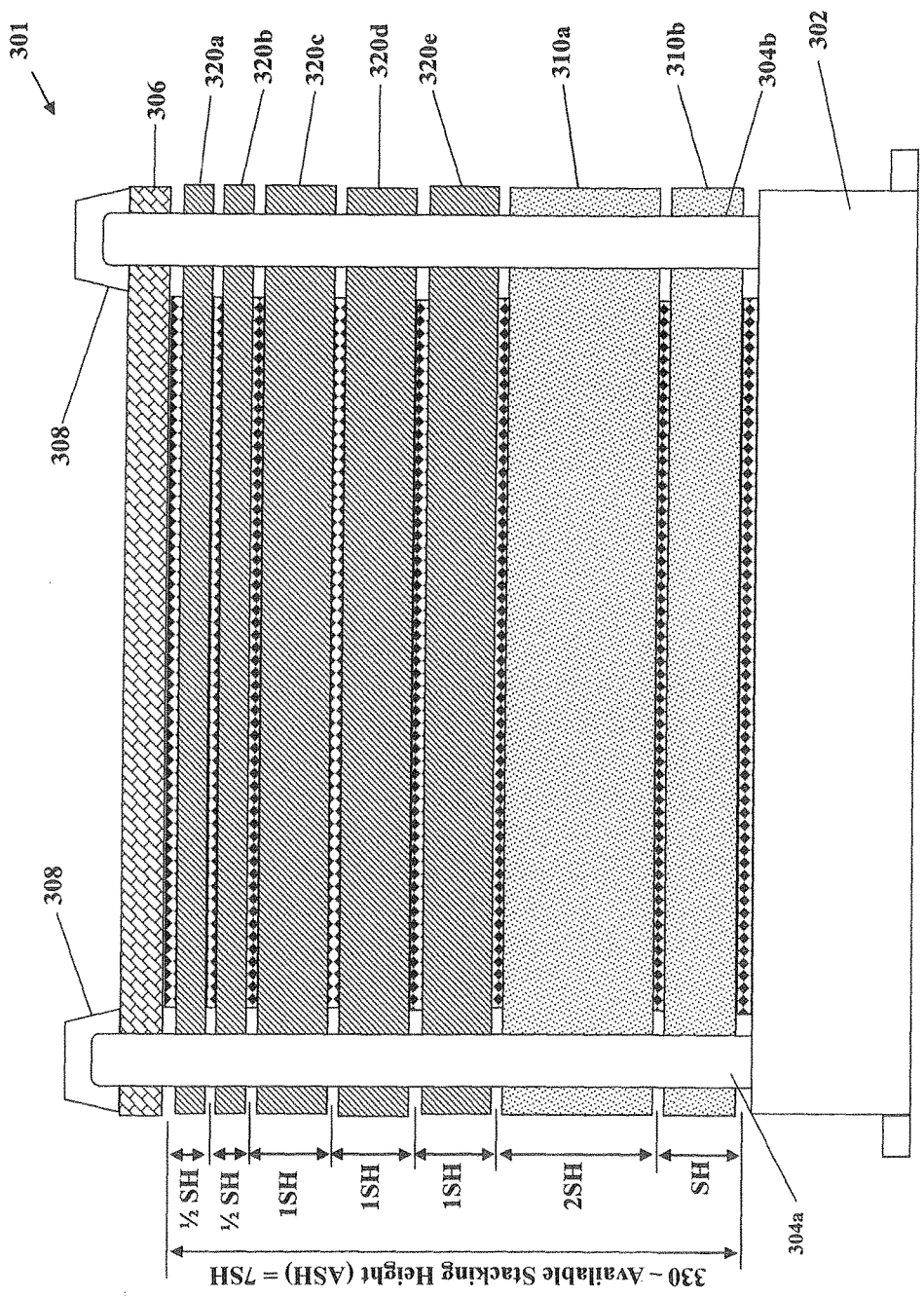
FIG. 3 shows a cross-sectional view of one 3DMC according to a preferred embodiment of the present invention depicting typical Stacking Heights.

FIG. 3 shows a similar cross-sectional view of one 3DMC embodiment 301 of the present invention showing exemplary values of layer thicknesses. The stacking configuration shown in the exemplary embodiment of FIG. 3 comprises of five core layers 320a, 320b, 320c, 320d, and 320e. Under the core layers there are two I/O layers 310a and 310b.

The vertical distance from the base layer 302 to the lower part of the cover layer 306 called Available Stacking Height (ASH). This height is optionally divided into arbitrarily but Standard vertical Heights called SH. In this example the ASH is 7*SH and the space is occupied with one 1*SH I/O layer 310b, one 2*SH I/O layer 310a, two ½*SH core layers 320a and 320b and three 1*SH core layers 320c, 320d, and 320e. All together these layers equal to the ASH of 7*SH in this example.

This height standardization advantageously provides flexible method of stacking wide range of different layers and still maintaining fixed 3DMC sizes. This is similar to standard rack mounted equipment having 1 or 2 U—a standard vertical measurement equal to 1.75 inches.

Layer vendors can select the proper height from ½*SH to 3*SH to fit their set of chips and components. In a similar way 3DMC vendors can offer different sizes of 3DMC stacks ranging, for example, from ASH of 3*SH to 12*SH. As vendors will improve layers manufacturing processes and cooling technologies, layers expected to take less vertical height thus will allow better utilization of same ASH through larger number of layers.

It should be appreciated that "blank layer" or several "blank layers" may be added on top or interspersed among the active layers to bring the device to the correct total height and configuration. These layers may help in heat removing as well.

Additionally or alternatively, bushings, or springs may be added below the nuts to allow securing configurations with low total height.

Additionally or alternatively, sets of rods with several sizes may be prepared to accommodate different configurations.

A typical dimensional example is 1U rack-mounted server having total height of 4.44 cm. Of the net height of 3.44 cm, base height may be 1.00 cm, cover layer height may be 0.44 cm, and remaining 2 cm may be the ASH of 4*SH. In this example 1*H=5 mm It is important to notice that currently 1U structure is not optimized for 3DMC in general due to the limited vertical dimension although in the future as layer heights will be reduced, 3DMC may fit 1U or smaller racks.

Another example is 3U rack-mounted server having total height of 13.335 cm. Of the net height of 12.0 cm, base height may be 5.00 cm, cover layer height may be 1.00 cm, and remaining 6 cm may be the ASH of 12*SH. In this example the 1*H=5 mm. This structure enables a stack of four dual processor cores each with one or more memory layer. Therefore the stack could implement an 8-way with single-core processors or 16-way with dual-core processors optimized server core.

At 40 cm width—8*3DMC cores each one is 5*5 cm, can fit in standard 19" rack mounted enclosure. At 27.5" (56 cm) deep enclosure, eight lines of 3DMC. Thus, a total of 8*8=64 3DMC cores may be fitted with proper space for power, cooling and LAN switches. This enables to build a 3U server having 64×8 (512) cores using a single-core processors or 64×16 (1024) cores using dual-core processors.

Height standardization is advantageous for making this method an industry standard "open architecture". In order to avoid non-standard dimensions the shape and size are dictated by the 3DMC standard while the vertical is open for vendors to implement as long as it is an integer multiple of SH, ½*SH or ¼*SH and so on. In any case proper blank layers may be inserted to enable partially populated stacks for future system growth.

The presence of the less thermally conducting interconnect layer made of silicone rubber forces the layer generated heat to flow sideways to the TCRs and from there downwards to the base layer. As the vertical heat conductance of the layers is less critical—the thermal design of the layer substrate can be improved and simplified.

Figure 4:
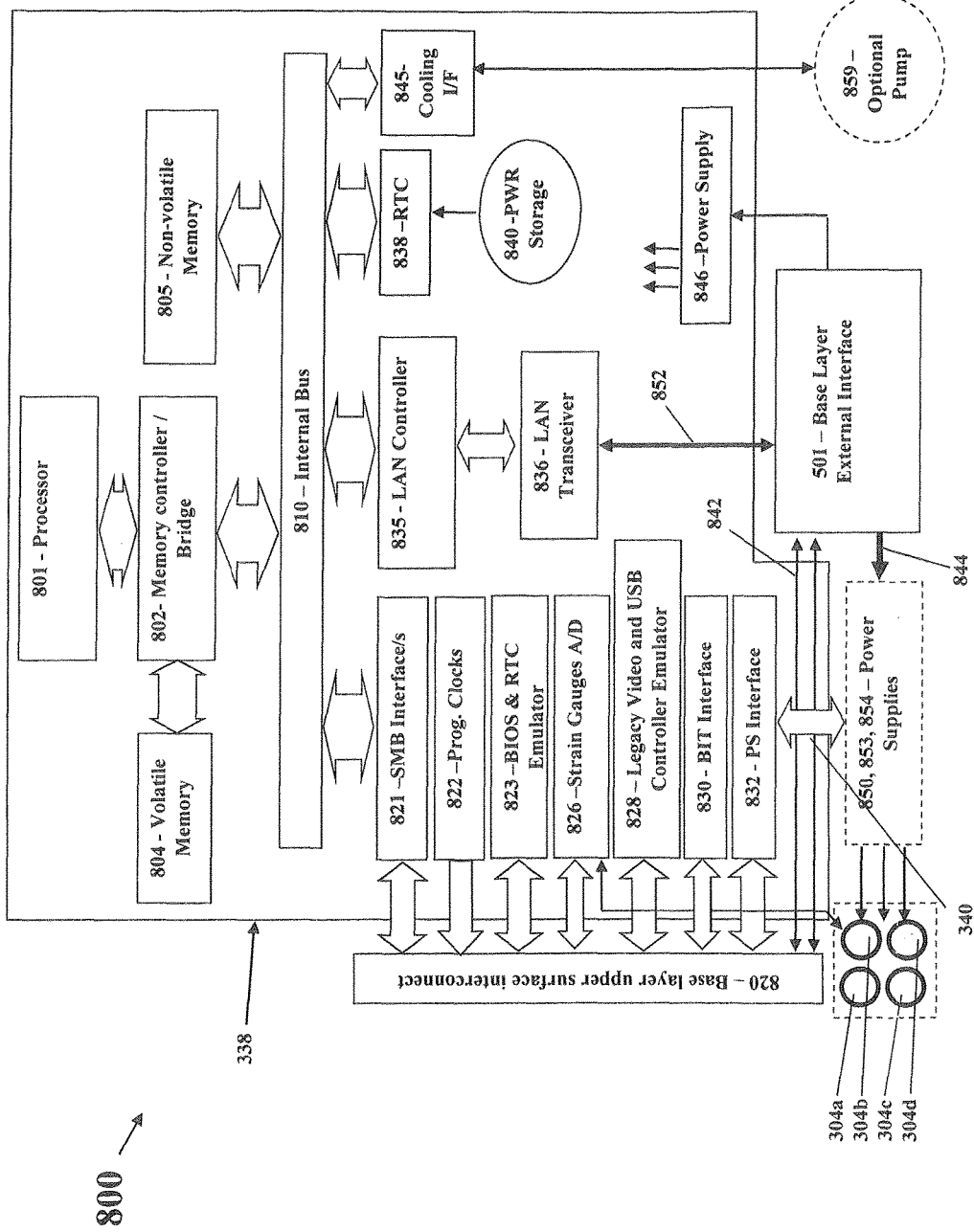
FIG. 4 illustrates a typical electrical block diagram of 3DMC Base Layer according to a preferred embodiment of the present invention.

Reference is now made to FIG. 4 illustrating a typical 3DMC Base Layer electrical block diagram 800. In the preferred embodiment, 3DMC base layer typically built from several major components: the System Management Computer (SMC) module 338 responsible for 3DMC control, monitoring, remote management, logging, thermal management, power management and many other tasks; Optional power supplies 850, 853 and 854 (three power supplies in this embodiment but naturally this may extend to any number of power supplies). Alternatively, power supply functions may reside in other layers as explained before.

Optional power supplies 850, 853, and 854 are responsible for the delivery of proper power plans to the power consuming components located in the different layer. Power supply function can vary from power conditioning, timing, switching and protection, to linear regulation and to DC to DC and AC to DC functions as needed. Typically power supplies are responsible for lowering and regulating the 3DMC input AC or DC power to the required voltage and stability for the different layers. These power supplies are typically controlled by the System Management Computer 338 to set their operating parameters and to monitor their activity; Optional Cooling pump or valve 859 to regulate cooling fluid flow based on power consumption and measured temperatures. This optional valve or pump may be controlled by the System Management Computer 338; Same SMC may alternatively control external pumps or valves if these are not assembled in the base layer. This architecture may be desirable to eliminate moving parts in the base layer.

Thermal Conductive Rods TCRs 304*a*, 304*b*, 304*c*, and 304*d* extend from the top surface of the base layer. Alternatively the TCRs may extend from a lower structure underneath the base layer and pass through the base layer. These TCRs serve three main functions:

a. As power conducting function—delivering power to the stacked layers;

b. As thermal conducting function—moving the heat from the layers to the lower side of the 3DMC through the TCR internal structure; and c. As a mechanical structure member applying equal pressure on all layers and accurately aligning them laterally one on top of the other.

The TCRs are electrically coupled to the different power supplies 850, 853, and 854 to deliver three different supply voltages to the power consumers at the stacked layers. In addition TCRs may be fitted with strain gauges to sense the strain caused by the said locking nut 308 on top of the cover layer and by the thermal expansion of the stack; Base layer external interfaces 501 enables connection of power and other inputs/outputs to that 3DMC; Base layer top interconnect 820 enables electrical interfaces with the stacked layers on top of the base layer.

It should be appreciated that modern computing device requires low voltage and high currents (for example, a typical modern AMD made 64 bit processor takes 100 A at 1.3V), and thus the use of heavy conductors such as the TCRs for delivering power is advantageous to reduce power plan parasitic resistance and inductance. The optional use of TCRs 304*a-d* for both heat removal and power delivery saves space.

In this embodiment, rods are electrically insolated at the base layer by means of insolating materials such as plastic or ceramic parts. Optionally, cooling fluids are also electrically insulating to avoid corrosion, leakage and electrolysis problems.

Alternatively, power passes through conductors in the layers or through the envelope around the layers.

The following text describes the System Management Computer function located at the base layer in more details. The System Management Computer 338 typically runs a small embedded operating system such as Linux, PSOS, VxWorks or Windows CE to enable user interaction through web-based portal and other remote management applications.

In server implementations of the preferred embodiment the SMC further functions as remote management system client providing remote monitoring, configuration, asset management and control through standard management protocols such as Simple Network Management Protocol (SNMP) and other standard and non-standard protocols.

Processor 801 runs continuously even if the host CPU/s is not running The processor is typically a low power RISC processor such as MIPS core, ARM or PowerPC. It calculates and operates all I/O interactions based on firmware program located on the non-volatile memory 805. The non-volatile memory is typically flash based to enable firmware patching and upgrades when the 3DMS is deployed. The non-volatile memory is preferably be loaded with proper layer drivers for all stacked layers. The user or administrator can load new firmware upgrades to the management computer via the management network 852.

A volatile memory 804 connected via the memory bridge 802 to the processor 801 temporarily stores data needed for processing and I/O activities. The volatile memory may be SDRAM, DDR type or any other suitable memory technology.

Internal bus 810 connects interfaces and peripheral circuitry to the management processor 801 via the bridge 802. This bus may be 16, 32 bit, PCI bus or any other suitable technology.

LAN Controller 835 connected to the internal bus 810 enables networking interface to the management computer 338. Through this port all management tasks such as configurations, upgrades, monitoring, remote reset, KVM (shadowing and remote interaction using Keyboard, Video and Mouse functions) may be performed remotely. LAN controller is typically 10/100 Mbps Ethernet to enable standard network interfaces. Management computer firmware and Operating System may support all standard network behaviors including static and dynamic IP, DNS and even resident VPN to improve management communications security. LAN Transceiver 836 connected to the LAN controller on one side and to the external interface 501 at the other side handles the physical layer of the LAN protocol. Link 852 is the management LAN interface typically comprising of several twisted pair conductors to interface with standard CAT5 or higher LAN cabling. Link 852 may be implemented using wireless LAN or fiber LAN to suit specific operational requirements.

Real Time Clock 838 contains precision clock reference and counters to maintain management system time and date. Time and date may be essential for encrypted protocols such as SSL, for logging purposes, events reporting and to update the host. Management computer time may be readjusted externally by connected time server or other precision clock references through the management LAN. Independent power source may be needed to maintain time and date while power is off For this purpose and others a small power storage device 840 may be connected to the RTC to power essential circuitry. This power storage device 840 may be primary battery, rechargeable battery, super-capacitor or any other suitable power storage device.

Optional cooling system interface circuitry 845 functions as an interface between the System Management Computer internal bus 810 and the controlled cooling system elements in the base layer (if installed). These controlled cooling system elements 859 may include an optional DC motor pump for cooling fluid, valves and regulators as well as thermal and flow sensors at various locations. Typical cooling system implementation requires Pulse Width Modulation control for one or more DC pumps and digital/analog inputs for several temperature sensors located at cooling fluid inputs and outputs in the base layer. Flow sensors may be used to measure cooling fluid flow as well. Firmware located in the non-volatile memory 805 responsible to manage the thermal aspects of the platform in various normal and abnormal situations. Thermal management is achieved through the control of the computing platforms on one side by:

a. Varying CPU parameters such as clock frequency, core voltage, etc.
 b. Removing or adding computation tasks from certain cores (application load leveling)
 c. Shutting down hot cores completely to avoid thermal damage
 d. Shutting down the whole 3DMC to avoid thermal damage.

From the support systems side, the SMC can affect the following parameters:

e. Change the cooling fluid flow speed
 f. Increase or decrease secondary cooling system flow
 g. Operate the system using a single cooling system in abnormal situations.

SMB interface/s 821 interfaces between the management computer internal bus 810 and the Base layer upper surface interconnect pads 820 connecting to the stacked layers. The one or more SMB functions many critical roles in the initialization and the operation of the 3DMC. Before powering the 3DMC host computers the management computer can interface with the different layers through the SMB to detect the layer type and model, to get critical operational parameters such as supply voltage, power consumption, list of compatible layers, position in the stack, critical temperatures, clock parameters, etc. During device operation the SMB can deliver real-time operational parameters from the layers reporting thermal parameters, power, health and functioning information. The SMB passes through all stacked layers and connects in parallel to special SMB interfaces located in each layers. Another important function of the SMB is to switch different functions at the layers. This switching may be necessary to enable proper layer stacking configuration through programming different Chip Select or address ranges at different layers.

Optionally programmable clocks and Phase Locked Loops (PLLs) 822 also connected between the system management computer internal bus 810 and the Base layer upper surface interconnect pads 820 connecting to the stacked layers. The purpose of this module is to generate required centralized clock signals to the different layers. Typically eight or more different clock signals can be programmed by the management computer to drive different circuitry located at the layers. System Management Computer may not only program the generated frequencies but also individual clock voltage level, duty cycle, starting sequence and the phase differences between different clock outputs. Spread spectrum function may be added to reduce Electromagnetic Interference emissions (EMI). Additional frequencies may be derived by particular circuitry at the layers through in-layer frequency dividers and PLLs.

As new processors may require synchronized differential clock sources, it may be impractical to route sensitive clock signal from the base layer to the CPU layer passing through all other layers and therefore local programmable clock generators at the CPU layers may take this function. Still the primary control of these distributed clock generators would remain with the System Management Computer.

Built-In Operating System (BIOS) and Real-Time Clock (RTC) emulator 823 also connected between the management computer internal bus 810 and the Base layer upper surface interconnect pads 820 connecting to the stacked layers. The function of this circuitry is to emulate the legacy x86 BIOS and RTC by using legacy registers at the host side and web managed advanced configuration and the management computer side. This module may not be needed if x86 legacy compatibility is not needed. The interface between the BIOS function 823 and the I/O or CPU layers is implemented through the upper surface interconnect function 820 using standard PC BIOS interfaces such as LPC (Low Pin Count) interface or the FWH (Firmware Hub) interface (Intel Spec rev1.1) or any other standard or non standard interface. The BIOS may not only store initial settings but also typically used as a boot loader to boot the host before the Operating System can be loaded. The boot code may be stored locally on the management computer non-volatile memory 805 or even loaded remotely through the management LAN connection 852 to enable remote boot processes. Specific BIOS segments may be used by the management computer to adopt the boot and settings to the stacked layers and the selected 3DMC architecture implemented.

Strain Gauges Analog to Digital interfaces 826 may be connected between the management computer internal bus 810 and the four or more strain gauges located at the root of each TCR 304a, 304b, 304c, and 304d. Strain gauges may be monitored by the management computer to assure proper layer pressure during 3DMC assembly and during operation.

Legacy Video and USB Controller Emulator 828 may be connected between the management computer internal bus 810 and the Base layer upper surface interconnect pads 820 connecting to the stacked layers. The function of this circuitry is to emulate the legacy x86 video controller and USB host controller to enable remote user interaction through built-in Keyboard Video Mouse (KVM) functionality and remote shadowing. Both video controller and USB host may be implemented in the I/O layers to enable local video generation and USB peripherals. In a typical server 3DMC implementation the KVM function is implemented using KVM over IP method thus enabling authorized remote user to see the 3DMC video and to control it using USB peripherals. Another possible enhancement of this module is to enable remote floppy or CD connection through local floppy or CD emulation.

Built-In-Test (BIT) interface 830 may be connected between the system management computer internal bus 810 and the Base layer upper surface interconnect pads 820 connecting to the stacked layers. The function of this circuitry is to run certain tests when the host is off to assure proper interconnection and layers functionality. Typically this module supports NAND trees, JTAG and on-die test reporting.

Power supplies interface 832 is the interface between the system management computer internal bus 810 and the Base layer primary power supplies 850, 853, and 854 in this specific implementation. This interface enables full control of power supplies parameters such as start sequence and ramp, voltage, voltage tolerances, current limit and other parameters. The interface also enable different real time power measurements such as—ripple level, actual current, current capacity, input voltage, temperatures and other essential parameters.

Primary DC power to the three or more base-layer power supplies is provided from the base layer external interface 501 by links 844.

Direct interface 842 enable direct connection of external devices to the stacked layers by connecting certain Base layer upper surface interconnect pads 820 with certain interfaces at the Base Layer External Interface 501. Typically this direct interface is used for one or more primary LAN, but also it may be used to interface external devices through IDE, SATA, SCSI, Serial, Parallel, USB, Analog Video, DVI, Fire-Wire, Fiber Channel and any other standard or non-standard interface.

Management computer power supply 846 is typically powered by separate power source to enable it to stay always on. This power supply powers only the system management computer circuitry and it generates the low voltage s needed for these circuitries. Potentially Power Over Ethernet (POE) circuitry may be used to derive this power from the management LAN connection as an independent always-on power source.

Figure 5:
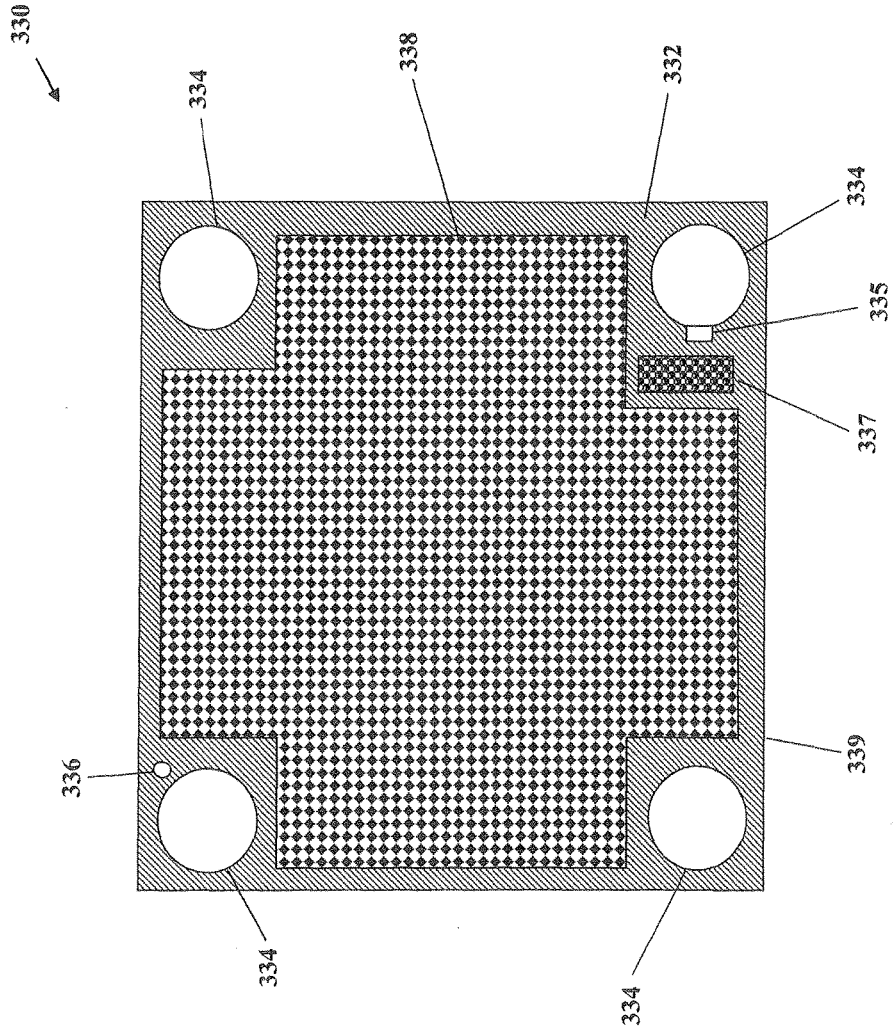
FIG. 5 illustrates a top view of a typical 3DMC layer according to a preferred embodiment of the present invention, showing layer surface structure.

FIG. 5 illustrates a top view of a typical 3DMC layer 330 according to exemplary embodiment of the present invention, showing layer surface structure. The upper surface of layers may defer to adapt to specific layer I/O requirements depending on many design considerations such as the number of electrical connections, cooling requirements, power requirements, die size and others. In general 3DMC layer vendors are free to develop layer interface standards to suite their proposed platforms as long as they adhere to some basic layer functional, mechanical, thermal and electrical characteristics.

The layer upper surface 332 is typically made of ceramic, glass or plastic substrate with several hundred gold plated pads in the layer Primary Interconnect Area (PIA) 338. Additional pass through interconnect area called Services Interconnect Area (SIA) 337 contains the System Management Bus or busses and some other services such as clocks and power lines. The difference between the PIA and the SIA is that PIA may be different for every layer interconnect while the SIA is identical interface and it is passed vertically with identical pin-out through all layers. Another difference is that the PIA is powered only when the host is powered while the SIA may be powered at all time.

Signals in the PIA may be arranged in various formats depending on signal characteristics, for example:

a. Busses may be arranged in a matrix or straight row;

b. Analog signals may be separated from other analog or digital signals and surrounded by ground pads;

c. Differential signals may be arranged in two close pads surrounded with ground pads; and/or d. Power may be implemented with wider diameter pads or multiple smaller diameter pads.

Four holes located at each corner 334 are fitted for the four thermal conducting rods (TCRs). The holes are surrounded by metal rings to improve thermal connectivity to the layer substrate.

Optionally at least one of the holes contains a special orientation key 335 to prevent inadvertent rotated or upside-down layer stacking. This key passed through all layers as standard. One additional key called configuration key 336 provided at the top surface to assure that layers stacked on top will be matched layers in terms of electrical specifications. As three rods available, each with 36 angular position, the number of possible options is $36^3 = 46,656$. These keys or holes may be different for the upper and the lower surfaces of the same layer as electrical interfaces may be different. This simple system of keys and matching holes assures that unmatched interfaces will not be stacked together as the key will prevent the layers from touching one another.

Alternatively, uneven location or size of rods may be used for orientation (rotation), inversion (up/down) of the layers during assembly.

Alternatively, electronic means of compatibility checking may be used.

Additionally, multiple pins/hole may optionally be used concurrently, increasing the number of permutations with a smaller number of holes.

Additionally, Versions and acceptability may optionally be programmed into the holes to ensure acceptable order of layers, version compatibility, etc. For example, layer using different voltages or communication protocols may use specific hole/pin combinations.

The side panels 339 of the layer are typically painted with color coding to identify layer type. Color convention may be developed to identify memory layers in certain color, CPU layers in another one etc. Layer manufacturer lot and model may be printed and bar-coded to enable human and machine reading.

Figure 6:
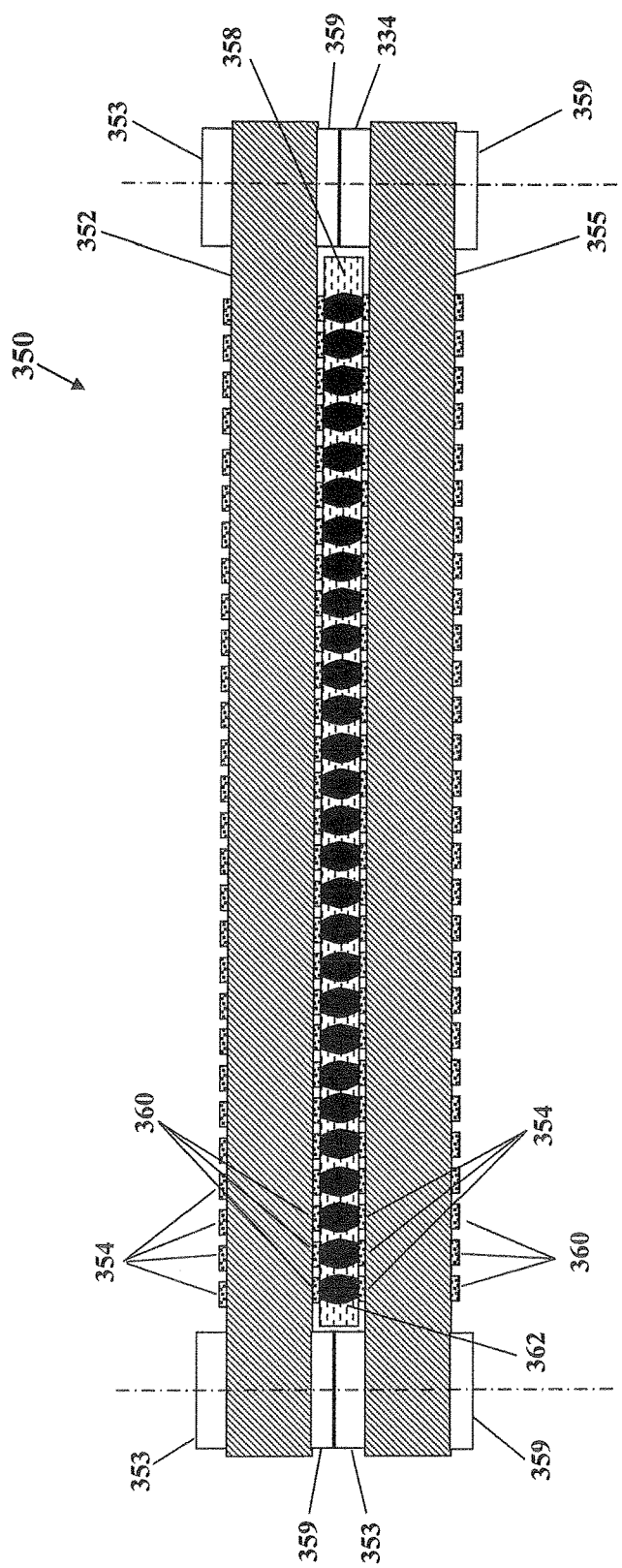
FIG. 6 illustrates a cross-sectional side view of a typical interconnect layer according to an embodiment of the present invention.

FIG. 6 illustrates a cross-sectional side view of a typical interconnect layer 350 of the present invention. It is important to note that separate interconnection layers are optional. It is possible to implement 3DMC embodiment with interconnect functions that are built-in one or two of the mating layers. These interconnects may be in a form of attached flexible conductive layer or electrical contacts from any type and structure.

In this view the upper layer 352 and the lower layer 355 are interconnected by an interconnect layer 358. The upper layer, preferably having gold printed matrix of pads 354 in its upper surface ceramic based surface and identical pads 360 in it lower surface. The lower layer 355 having on its upper surface mirrored image pad 354 aligned with the opposite pads 360.

A non-conductive thin layer of silicone rubber material form the interconnection layer 358 with a matrix of conductive column shaped islands 362 positioned vertically inside that layer. Each conductive island electrically bridges the upper layer pad with the matching lower layer pad. As layers are stacked together the pressure on the layers compresses the interconnection flexible layers. This pressure is adjusted and restricted by the metal bushings around each heat conductive rod. When each one of the lower bushing 334 touches its respective upper bushing 355, the layer movement and this the interconnect compression process is stopped. Each layer comprises of various bushings to adjust the layer interconnect distance and to regulate the compression force on the interconnection layers.

Preferably, conductive silicon on gold pads is used due to its excellent long-term performance. It is being used in many applications today. The self-sealing characteristics of the silicon eliminate humidity contamination.

Alternatively, a deformable soft metal such as indium is used. In this case it is likely that interconnect layer 350 may not be capable of being reused. Another alternative is to use amorphous conductive columns spread around the whole surface of the interconnect layer 358. This arrangement requires less accurate lateral positioning and pressure but suffers from less desirable electrical characteristics.

Figure 7:
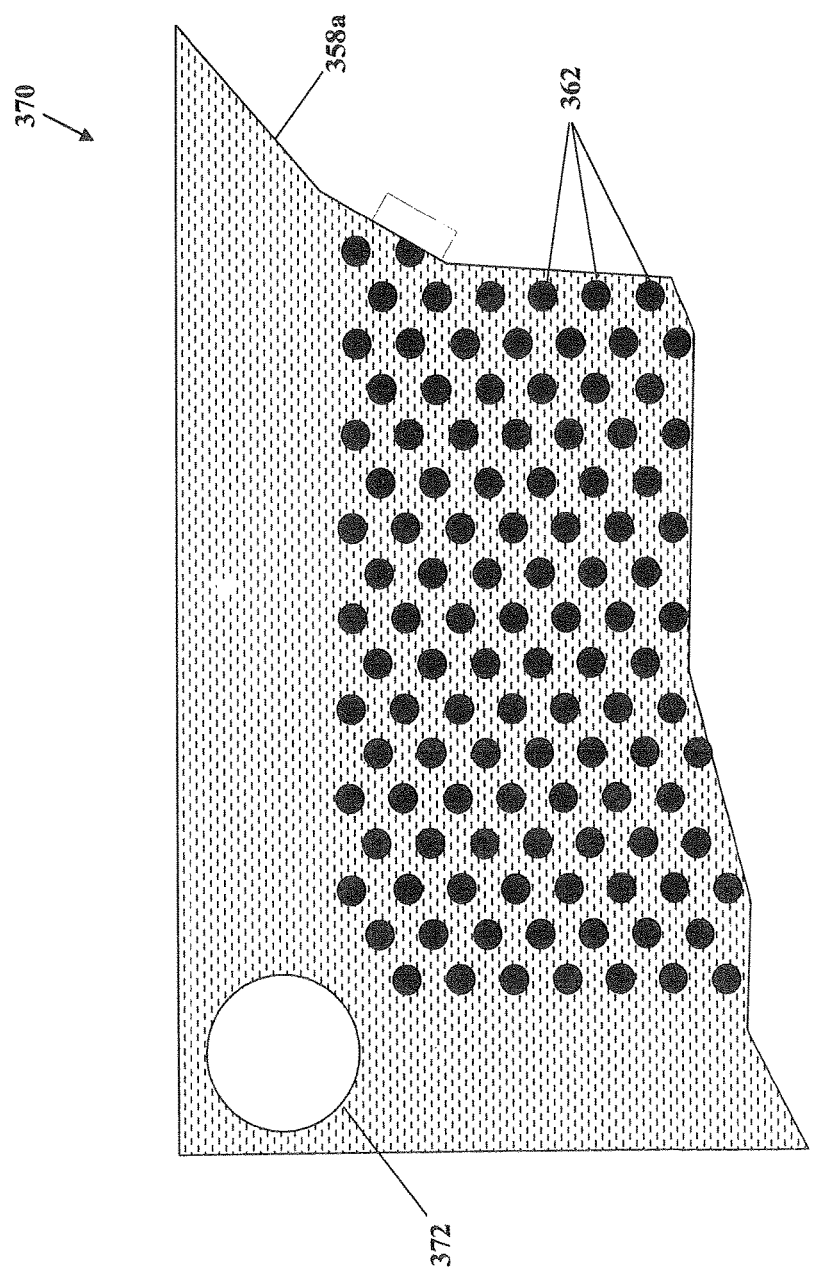
FIG. 7 illustrates an enlarged section of a top view of a typical 3DMC interconnect layer according to an embodiment of the present invention.

FIG. 7 illustrates more detailed top view of a typical 3DMC interconnect layer 370. For clarity only one corner of the layer presented.

The interconnection layer 358a is made of flexible thin layer non-conductive material. Typical materials are silicone and flurosilicone. This material is chemically stable over time and tends to create a gasket like sealed layer to protect contacting areas. Small round islands of conductive materials 362 arranged in a matrix in the Primary Interconnect Area (PIA) and in the Secondary Interconnect Area (SIA) not shown here. The PIA typically contains several hundreds of such conductive islands to bridge between interconnect pads of neighboring layers. Conductive islands are typically composed of similar base material having mixed with fine powder of conductive material such as silver, aluminum, carbon or copper. Examples for conductive island materials are: CONSIL-C (silicone based) with Silver-Copper powder, CONSIL-CF (flurosilicone based) also with Silver-Copper powder, CONSIL-A (silicone based) with Silver-Aluminum powder, SC-CONSIL (silicone based) with carbon powder and CONSIL-RHT (silicone based) with pure Silver powder. The last material is also characterized by resistance to high temperatures—characteristics that may be desirable for 3DMC interconnect layer implementation.

The use of a similar base material assures good bonding between the islands and the matrix and better short and long-term mechanical and temperature stability. Similar materials are also desirable characteristic to assure similar CTE (Coefficient of Thermal Expansion) as the layer is subjected to wide operational temperature range.

Four large holes in the interconnect layer 372 are cut to fit against the layer thermal conductive rods bushings 353 or 359 shown in the previous drawing. These holes at four corners may be used together other pins and sockets to secure the flexible interconnect layer to the attached layer and to restrict lateral movements under layer stacking pressure. Some mechanical pins may be used in order to further restrict the interconnect layer lateral displacement under pressure.

The interconnect layer is preferably attached to the layer to assist in the stacking process. A standard can be defined to attach it either to the lower surface or to the upper of the layer. As the cost of the interconnect layer is much smaller compared to the cost of the layer itself, it is desirable to enable interconnect layer removal and exchange either in the field or at a laboratory. Special inserts or plugs may be used to enable precision layer attachment while still allowing simple removal and replacement.

Excessive pressure may lead to shorted columns as the silicone based matrix behaves like an incompressible fluid the pressure tends to increase the columns diameter. Typical allowable deflection values are between 5% and 25%. Lighter pressure or uncompressed layer may cause higher contact resistance, lower current capacity, over-heating and open circuits.

Interconnect layer thickness is typically around 1 mm. At this thickness conductive island can deliver more than 50 mA of current and the contact resistance is typically less than 5 mili-Ohm.

Typical manufacturing process uses fine injection nozzles to extrude a continuous homogenous tube with the conductive islands and then laser or knife slicing into proper sheets without stressing or damaging the delicate matrix. Another manufacturing method comprises creating large sheets of silicon at the proper thickness and then through laser drilling or mechanical punching holes for the conductive islands are made. Diffusion of the conductive material in fluid state is then performed under positive pressure or vacuum to fill all sheet holes. After conductive material has cured the sheet is cleaned from excess materials, and it is ready for testing and for use. It is then cut into individual sheets. Obviously other manufacturing methods may be used to provide similar or better results within the general scope of the current invention.

The number of conductive islands depends on the layer architecture. First example is core interconnect of single CPU layer. In this example there is one memory bus (240 signals) and up to 3 HyperTransport busses (80 signals for each bus). This dictates 480 signals+approximately 100 control and other signals at the PIA. At a pitch of 1 mm this will require 580 $mm^2$ As pitch can be reduced to less than 0.5 mm—there is plenty of margins.

Second example is core interconnect of dual CPU layer. In this example there are two memory busses (480 signals) and up to four HyperTransport busses (80 signals for each bus). This dictates 480 signals+approximately 200 control and other signals at the PIA. At a pitch of 1 mm this will require 1000 $mm^2$. As pitch can be reduced to less than 0.5 mm—there is plenty of margins.

In layers producing little heat, for example, layer containing low speed electronics such as non-volatile flash memory; or passive components for example conductors and terminators, the design of the layer may be simpler and structure designed for heat removal may be made thinner or be omitted. Similarly, layer not needing some or all the supply voltages may have insulated or even non metallic bushings.

It should be noted that other technologies for providing interconnection between layers, known in the art and yet to be developed, may be used without departing from the general scope of the current invention.

Figure 8A:
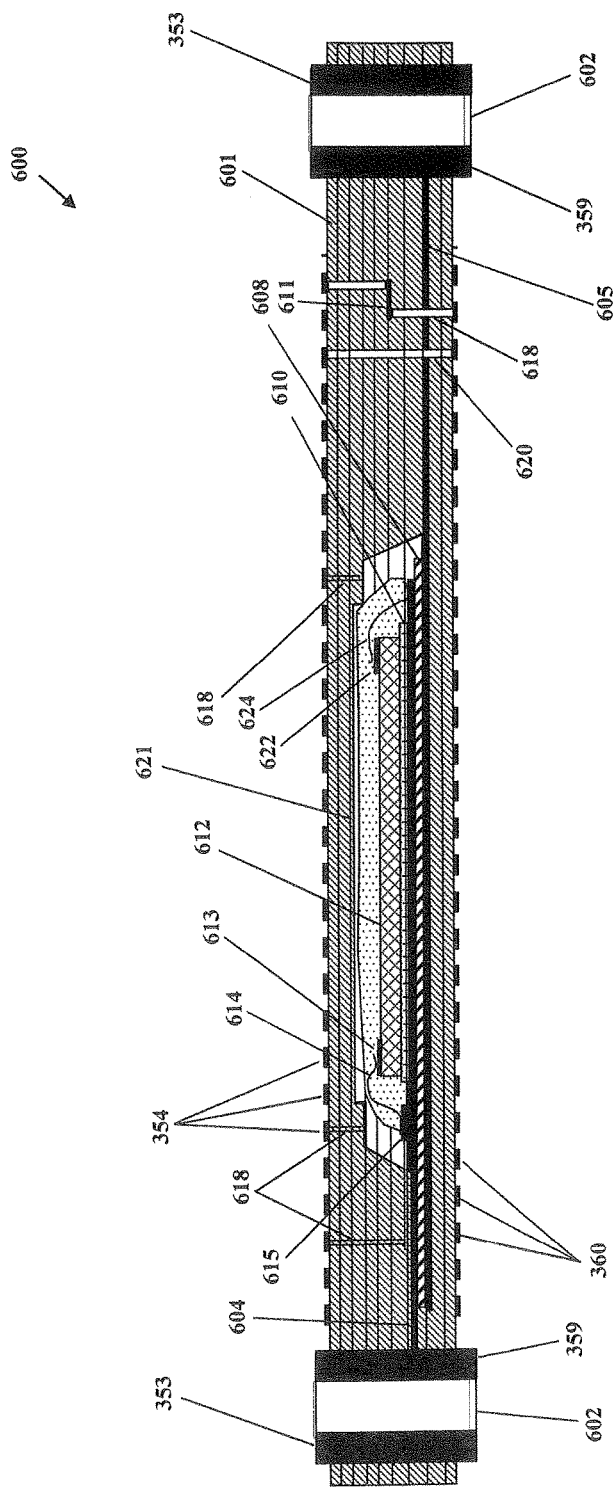
FIG. 8a illustrates side cross-sectional view of an implementation of a layer with wire bonding according to a preferred embodiment of the present invention.

FIG. 8a illustrates side cross-sectional view of a preferred layer implementation of the present invention with bonded die/s. Typical layer 600 having TCR holes 602 at four corners (only two are visible in this cross-sectional side view). TCRs functions both as thermal conducting elements to the base layer and as power distribution conductor delivering high-current low-voltages from the power supplies to the electrical loads (dies) located at each layer.

Thermal bushings 353 at the upper surface and 359 at the lower surface, reduces the layer thermal and electrical resistance. In addition to these functions these bushings adjust the spacing between neighboring stacked layers to assure proper and even pressure on the interconnect layer.

The layer (top) substrate 601 is the mechanical base for the layer structure. It is typically made of sub-layers of dielectric material such as ceramic material, glass-ceramic, plastic or epoxy resin. The substrate structure is typically built in thin sub-layers having thin metalized conductive planes 611 to interconnect signals internally. Conductive planes may be connected vertically between sub-layers through plated vias 618. Good material for layer substrate is high-performance glass-ceramic (HPGC). Another possible process and materials are DuPont Green Tape Low Temperature Co-fire Ceramic (LTCC) 951 or 943. Yet another substrate processes option are High Temperature Co-fired Ceramic (HTCC) and Thick Film technology. These and other processes may be used to create fine conductors and vias but also buried vias and buried electronic components inside the layers. Another available processes such ALOX that uses aluminum instead of copper as internal conductor 611 may further lower the manufacturing cost compared to the traditional Multi Chip Module (MCM) technologies mentioned above. The typical substrate sub-layer thickness may range between 1.5 to 10 mil. Some substrate processes enable thermal vias that can further improve the internal heat transfer from the die/s to the thermal plane.

As the layer temperature tends to rise during operation, materials with similar CTE should be used to match the substrate components expansion with the silicon die/s expansion to avoid excessive thermal stresses. To interconnect the chips in the layer, the upper and the lower interconnect pads Multi-Layer Ceramic (MLC) substrate technology or similar technology may be used.

A rigid or flexible Printed Circuit Board (PCB) may also be integrated in the layer substrate as the upper or the lower surfaces and even at both. Other materials may be used by layer vendors to achieve desired price and physical goals.

The upper surface of the layer is covered with interconnect pads 354 to enable interconnection with the upper stacked layer. Similarly the lower layer surface is covered with interconnect pads 360 to enable interconnection with the upper stacked layer. Passed through signals can be connected by direct vias such as 620 or indirect signals passing through different conductive layers 611, buried vias 618 and features inside the layer substrate 601.

Metal plan 604 is thermally and electrically coupled with the said left side thermal conductive rod bushings 353 and 359. This plan typically made of a thick copper layer or plate extends to the center of the layer and serves as a mechanical base for the silicon dies and other electrical components inside that layer. Since other bushings at the other corners may carry different supply voltage, the thermal plans extending from the four layer corners are usually vertically spaced to avoid power planes shorting. Another option of this preferred structure is the additional dielectric plan 608 that separates between plan 604 extending from the left side and plan 605 extending from the right side. Proper dielectric material and thickness selection can create a powerful large size capacitor that may contribute to the power supply stability through better step response and lower voltage ripples. Additional types of capacitors may be integrated in the layer to further reduce supply path ESR. These capacitors may be ceramic or electrolytic type.

In typical layer implementation the upper plan is usually the ground plan to enable direct coupling of the die/s 612 to that plan. Second plan is usually Vcore supply plan to enable proper decoupling capacitance to the top ground plan. Holes in the four plans are made to enable signal vias to pass between the surface interconnect pads and layer internal and external pads.

A thermal and possibly electrically conducting adhesive 610 is used to fix the die/s to the top plan 610. Typical adhesive is Ablestik adhesive Ablebond 2100A that is characterized by good electrical and thermal conductivity. Another example is the Ablestik ABLEFLEX 5206 series material that is electrically isolated. Good mechanical strength under wide temperatures range, stress relief capacity and low moisture absorption are desirable characteristics for the die attach adhesive. Die 612 may be a single day or multiple dies and other components may be used to perform the layer desired functionality. Dies may also be stacked to further increase the layer chip density and to reduce inter-die bonding length.

Different die connection technologies may be implemented inside the layer. To better illustrate layers of the present invention, two typical technologies brought here. The first shown in FIG. 8a is older metal wire bonding technology. While this technology is less efficient for fast and high density chips, it is still used for vertical die stacking and for other internal wiring configuration with other technologies or as a primary technology. With wire bonding, the power pads on the die/s 612 are connected by bonding wires such as 624 to the proper power plan such as 604. Exposed parts of the plan may be used to enable large number of power bonding wiring to the one or more die/s. Bonding wire in use may be gold (Au), aluminum or copper 0.9 mil or similar conductive metal wire.

Similarly signal pads on the die/s such as 613 shown may linked through bonding wire 614 to substrate signal pad 615 and from that pad the signal may be traced to upper or lower surface pads through conductive layer features and vias such as 618. Certain internal bonding and conductive layers inside the layer substrate may also be formed to enable proper signal interconnections between dies.

To protect the die/s after assembly in the layer manufacturing process, encapsulation material 624 seals the die/s and the chip sides completely. This material may be epoxy or any other suitable resin. It is essential to seal the assembled dies completely as the assembled die/s and lower sub-layers need to be covered by additional sub-layers through many aggressive electrochemical processes. Proper die/s encapsulation enables process completion without damaging the die/s inside.

Figure 8B:
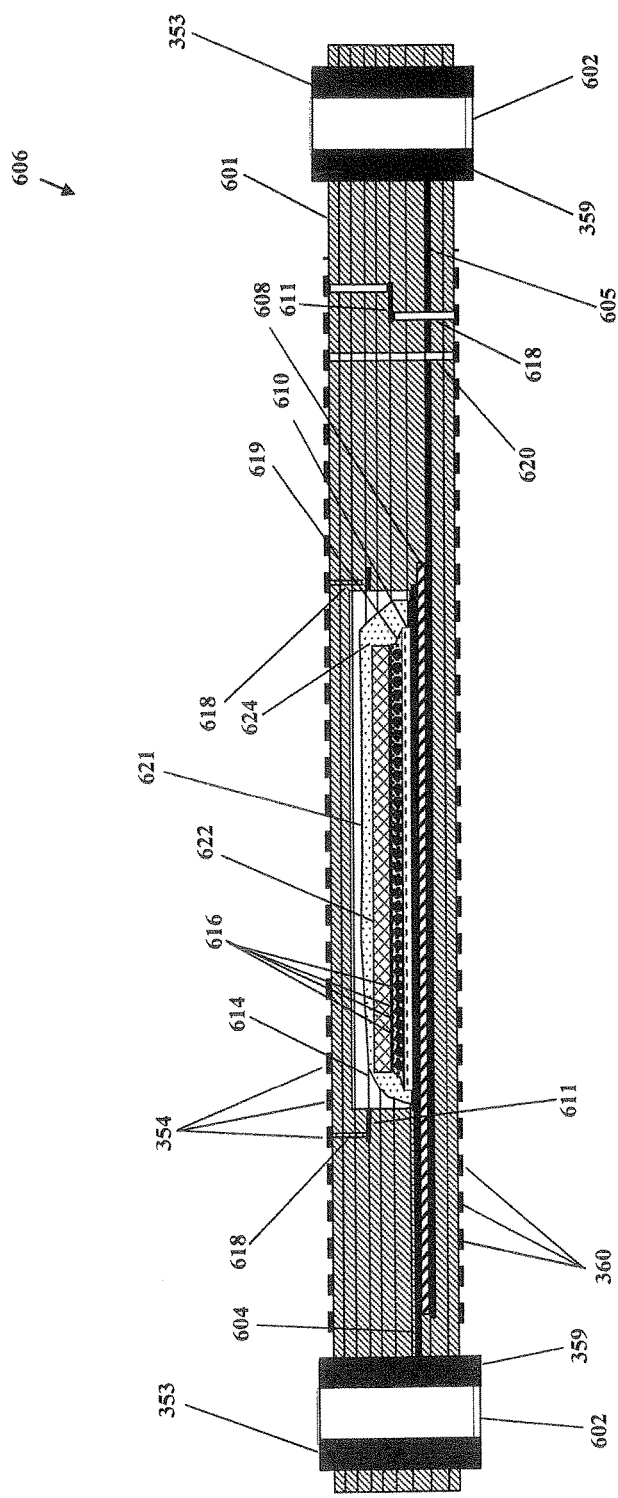
FIG. 8b illustrates a similar side cross-sectional view of an implementation of a layer with flip-chip according to a preferred embodiment of the present invention.

FIG. 8b illustrates a side cross-sectional view of yet another preferred layer implementation of the present invention similar to illustration 8a above but in this particular example die/s connection implemented using flip-chip technique. Instead of bonding wires, small columns of metal (called bumps) 616 extend from the substrate surface 610 bridging between metal pads on that surface and aligned pads at the die/s 622 lower side.

Flip-chip may be implemented by one or more of the following methods:

a. Solder Bump—The solder bumping process first requires that an under bump metallization (UBM) be placed on the chip die bond pads, by sputtering, plating, or other means, to replace the insulating aluminum oxide layer and to define and limit the solder-wetted area. Solder may be deposited over the UBM by evaporation, electroplating, screen printing solder paste, or needle-depositing. After solder bumping, the wafer is sawn into bumped die. The bumped dies are placed on the substrate pads, and the assembly is heated to make a solder connection.

b. Plated Bump—Plated bump flip chip uses wet chemical processes to remove the aluminum oxide and plate conductive metal bumps onto the wafer bond pads. Plated nickel-gold bumps are formed on the semiconductor wafer by electroless nickel plating of the aluminum bond pads of the chip dies. After plating the desired thickness of nickel, an immersion gold layer is added for protection, and the wafer is sawn into bumped dies. Attachment generally is by solder or adhesive, which may be applied to the bumps or the substrate bond pads by various techniques.

c. Stud Bump Flip Chip—The gold stud bump flip-chip process bumps die by a modified standard wire bonding technique. This technique makes a gold ball for wire bonding by melting the end of a gold wire to form a sphere. The gold ball is attached to the die bond pad as the first part of a wire bond. To form gold bumps instead of wire bonds, wire bonders are modified to break off the wire after attaching the ball to the chip bond pad. The gold ball, or "stud bump" remaining on the bond pad provides a permanent connection through the aluminum oxide to the underlying metal. The gold stud bump process is unique in being readily applied to individual single die or to wafers. Gold stud bump flip chips may be attached to the substrate bond pads with adhesive or by thermosonic gold-to-gold connection.

Since connections in this case are done through the lower side—the die/s 622 in this configuration are assembled facing downward. Underfill material 619 fills the gaps between the bumps under the die/s 622 and thermally and mechanically bridge between the die/s and the substrate 610. The thermal expansion mismatch, also known as the CTE (Coefficient of Thermal Expansion), between the flip-chip die and the substrate underneath is absorbed by the underfill protecting the small bumped joint. Underfill material also protects the chip from moisture, ionic contaminants, radiation, and hostile operating environments such as thermal and mechanical conditions, shock, and vibration.

The substrate 610 for the flip-chip assembly may be of ceramic, organic material (rigid like FR4 or flexible like Dupont's Kapton) or any other suitable material.

Figure 8C:
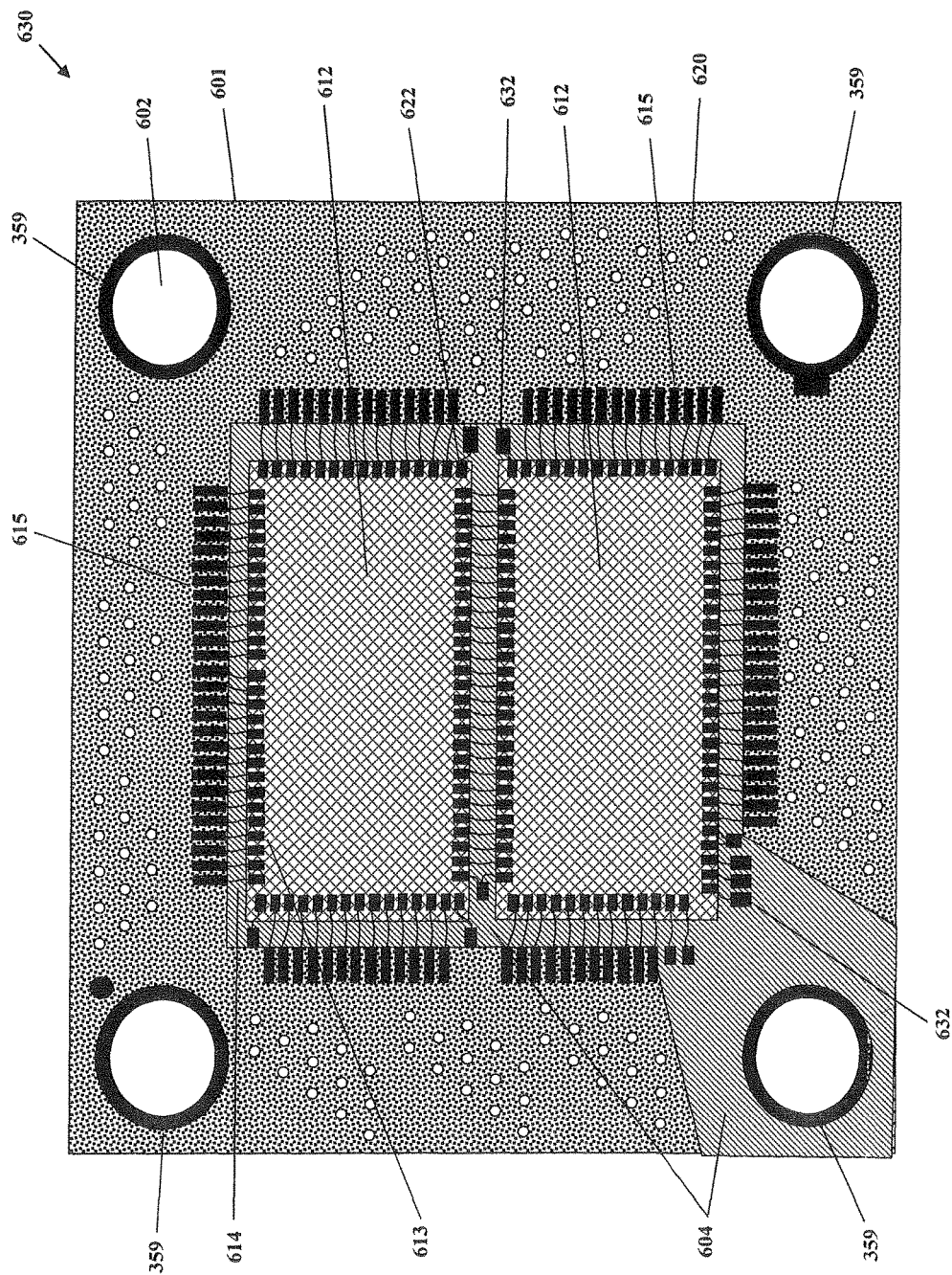
FIG. 8c illustrates a 3DMC typical layer top cross-sectional view with two wire bonded dies according to a preferred embodiment of the present invention.

FIG. 8c illustrates typical 3DMC layer with wire bonding top cross-sectional view 630 exposing the die/s 612, the internal bonding 614 and the vias 620. Layer substrate 601 shown in the figure was cut at half thickness and at this level the cut-out exposes bays for one or more silicon die/s 612. Lower surface interconnect pads (not shown here) are connected internally to signal pads 615 arranged around the die/s 612 or passed through to the upper surface pads (not shown here) through internal vias 620. Internal vias 620 can pass through the layer 630 in areas that are clear of the thermal planes 604.

The four lower thermal conducting rod bushings 359 located at the four layer corners and thermally coupled to the four thermal planes 604 that extend from each corner to the layer center. The four planes are electrically isolated to enable different supply voltage at each layer.

Die/s 612 fixed to the upper thermal plane 604 by special adhesive (not shown here). Usually the top plan is the ground. Power pads at some exposed areas of the different thermal planes are used as power pads 632 to attach bonding wires 614 to connect power to the die/s power pads 622.

Figure 8D:
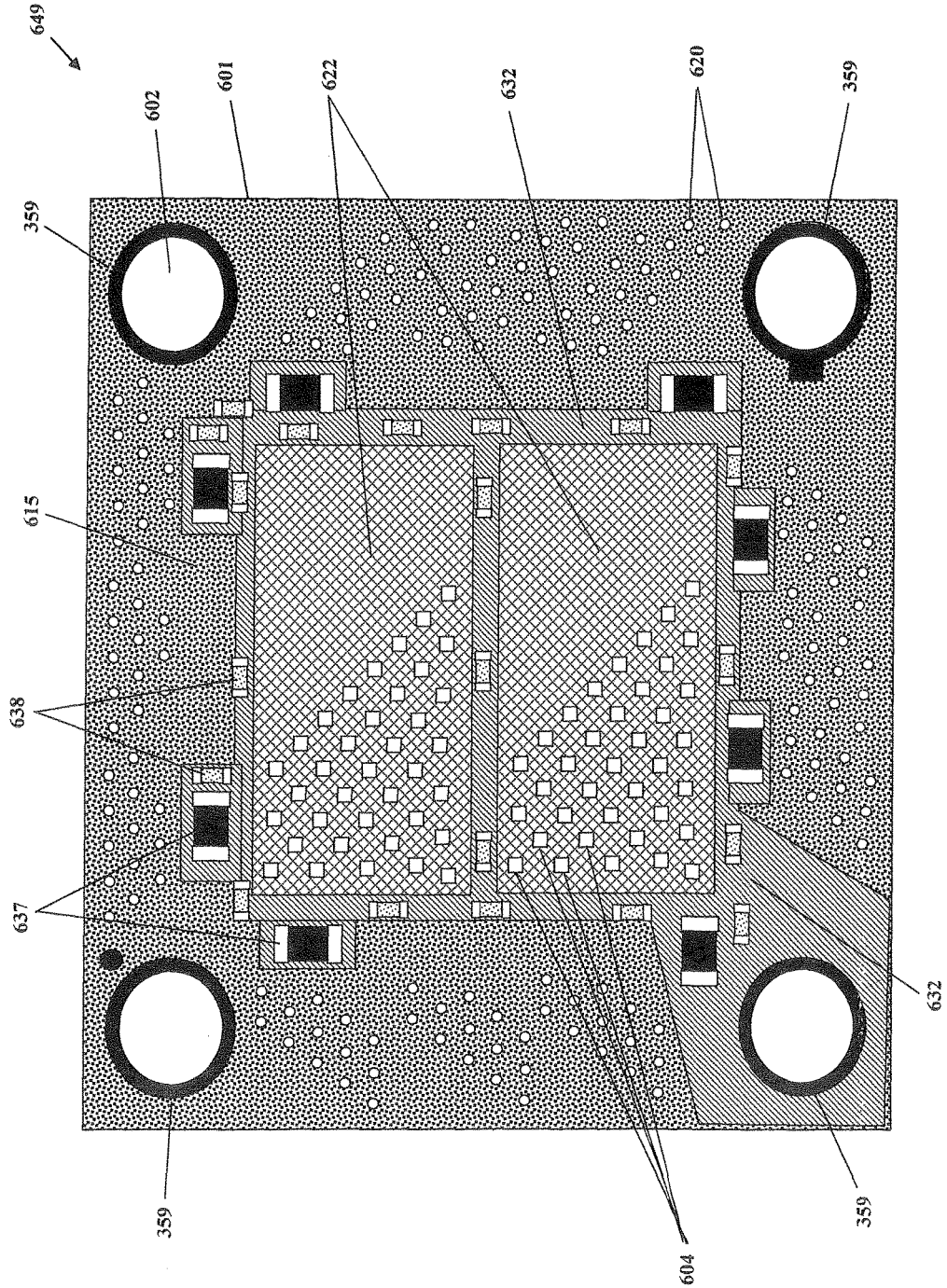
FIG. 8d illustrates a 3DMC typical layer top cross-sectional view having two flip-chip dies and integrated capacitors according to a preferred embodiment of the present invention.

FIG. 8d illustrates typical 3DMC layer with wire flip-chip dies top cross-sectional view 649 exposing the two dies 622 and the internal vias 620. Layer substrate 601 shown in the figure was cut at half thickness and at this level the cut-out exposes bays for one or more silicon die/s 622. Lower surface interconnect pads (not shown here) are connected internally to signal the flip-chip pads 604 (shown here as small squares although actually located under the dies 622) arranged under the die/s 622. Internal vias 620 can pass through the layer 630 in areas that are clear of the thermal planes 604.

Several electrolytic capacitors 637 and ceramic capacitors 638 are integrated in the layer to store power plan voltage and to filter supply noise. Electrolytic capacitors used may be tantalum, aluminum or any other suitable dielectrically substrate. Capacitors may be X7R, NPO, X5R, or any other suitable dielectrically substrate.

The four lower thermal conducting rod bushings 359 located at the four layer corners and thermally coupled to the four thermal planes 604 that extend from each corner to the layer center. The four planes are electrically isolated to enable different supply voltage at each layer.

FIGS. 9a to 9j briefly describes a typical 3DMC layer fabrication process having one flip-chip die. It is clear that actual manufacturing processes may vary significantly as well as the methods and technologies implemented by the vendor.

It is also obvious that this description provides only an overview of the process steps as many other steps and details may be needed to successfully meet layer assembly mass production.

Figure 9A:
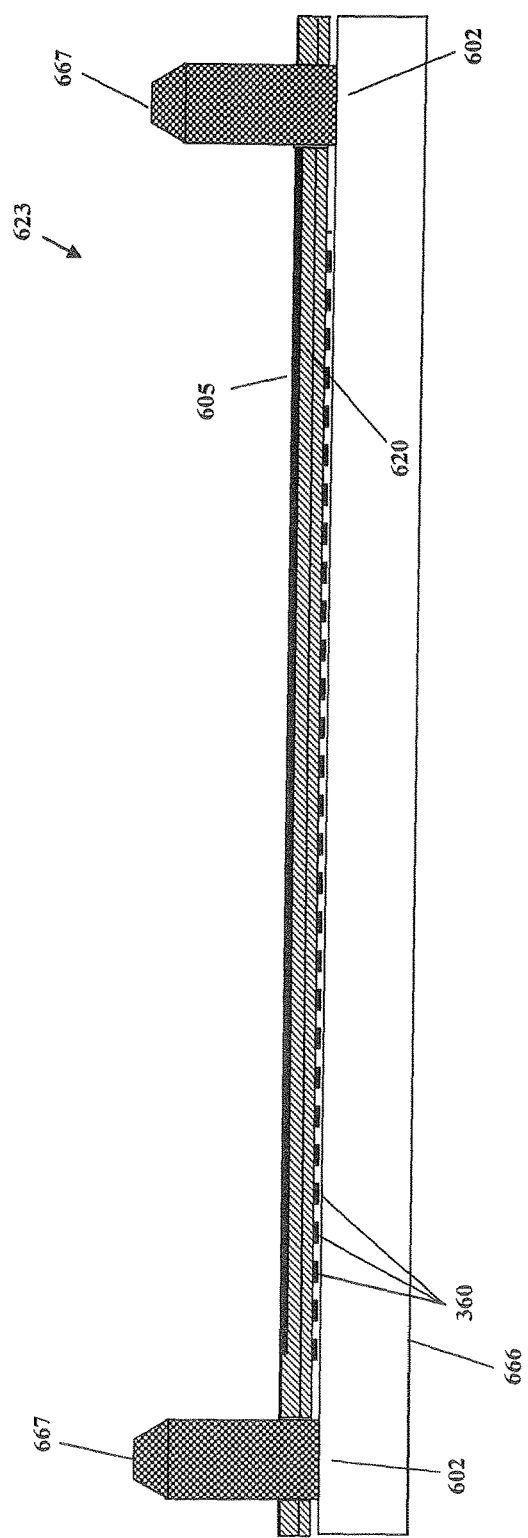
FIGS. 9a to 9j illustrate a production method of 3DMC typical layer with flip-chip bonded dies in accordance with a preferred embodiment of the present invention, in different stages and views.

FIG. 9a illustrates the preparation of the layer lower half 623. Sub-layers of ceramic 620, silica or alumina serves as the dielectric material or substrate. Certain conductive metal features are printed on each sub-layer to create the required circuitry electrical paths. Lower pads 360 are printed in gold layer using photoresist coating and etching methods.

A manufacturing jig 666 having one or multiple fixtures for layers is used to hold the sub-layer together and align them.

The four TCR holes 602 serves as aligning holes for matching guiding pins 667 to enable precision lateral positioning of each sub-layer that is being stacked. Additional smaller pins may be used to assure fine alignment of the sub-layers. The manufacturing jig 666 also assists in layers handling during the manufacturing processes.

As the sub-layer fabrication process may dictate extreme temperatures and corrosive treatments, it is typically necessary to apply some protective coatings to some layers to protect them from being damaged during fabrication.

During fabrication of the lower-half 623 some metal plans are stacked (one plan 605 shown here). These plans are typically terminated in the TCR holes with plated holes to enable proper thermal connection to the thermal bushings.

Figure 9B:
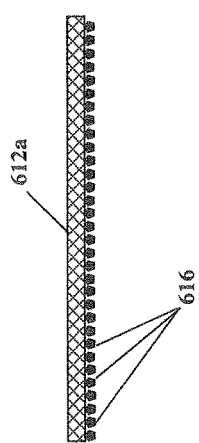

FIG. 9b shows the flip-chip die 612a. Preparations for assembly of the die requires many more steps not shown here. First Under Bump Metallization (UBM) is formed on all the die I/O pads to prepare the chip surface for bumping. The final metal layer of most chip I/O pads is aluminum, providing a satisfactory surface for conventional wire bonding but typically this surface is not directly compatible to most conductive bumps. Aluminum forms an oxide immediately upon exposure to air, and this native oxide is an electrical insulator. To enable successful bumping the first step is to replace the oxidized aluminum surface with a more stable and conductive material—the UBM. Proper UBM implementation generally requires multiple layers of different metals, such as an adhesion layer, a diffusion barrier layer, a solderable layer, and an oxidation barrier layer.

Typical multilayered UBM formation includes the following steps:

Sputtering etching the native chip surface oxide to remove oxide and exposing fresh aluminum surface.

Depositing 100 nm Ti/Cr/Al as the adhesion layer.

Depositing 80 nm Cr:CU as the diffusion barrier layer.

Depositing 300 nm Cu/Ni:V as the solder-wettable layer.

Depositing 50 nm Au as the oxidation barrier layer (optional).

After the UBM formed on the chips the tested wafer arrives for bumping process where the small bumps 616 are being added at each chip pad. Soldering bumps typical composition is typically 63Sn/37Pb, 95Pb/5Sn, or 97.5Sn/2.5Ag for lead-free processes. Solder bumps are formed using thin film metal deposition or electroplating and etching operations similar to those used to fabricate integrated circuits. Other bumping processes such as copper pillar structures bumping or "passive integration" method can be used to create the required bumps. After bumping the bumps are typically passivated using organic composite such as Polyimide, Dow CYCLOTENE® (BCB) or other materials.

After bumping process is completed, wafer is being carefully diced to separate each good die. After the testing and bumping complete, the flip-chip die is ready for assembly in the 3DMC layer lower-half 623.

Figure 9C:
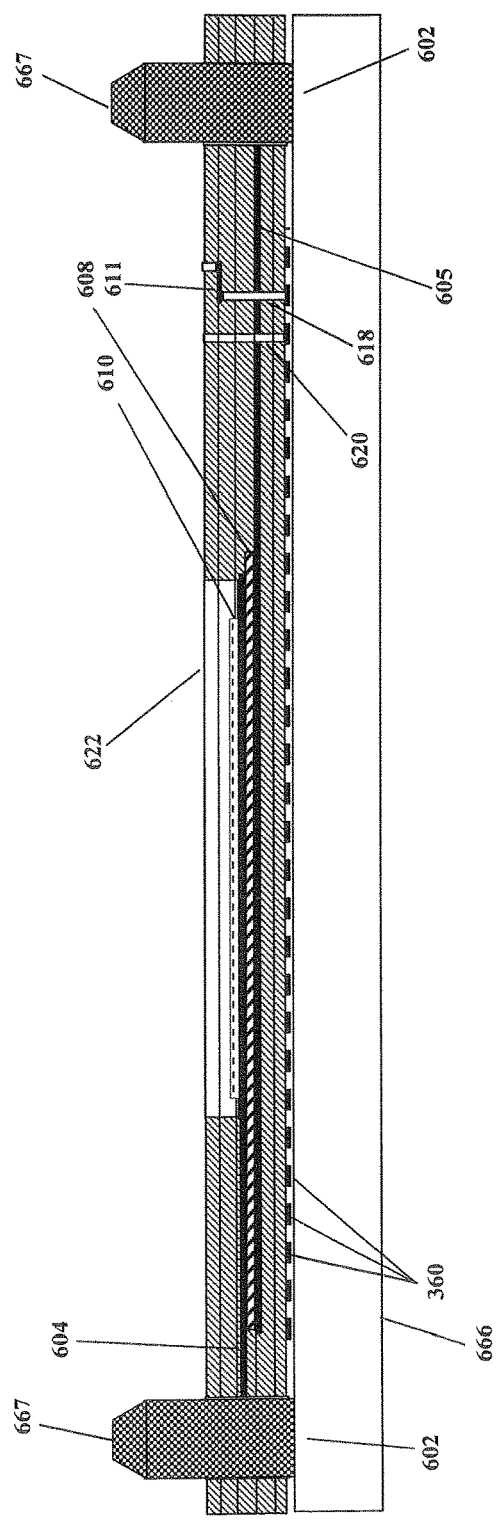

FIG. 9c depicts the layer lower-half 623 completion and preparation for flip-chip 612a assembly. During these steps all sub-layers are formed and the completed lower half substrate is tested to assure that proper connectivity was made. Soldering flux is being applied to the flip-chip pads to improve metal bonding short time before die assembly.

Figure 9D:
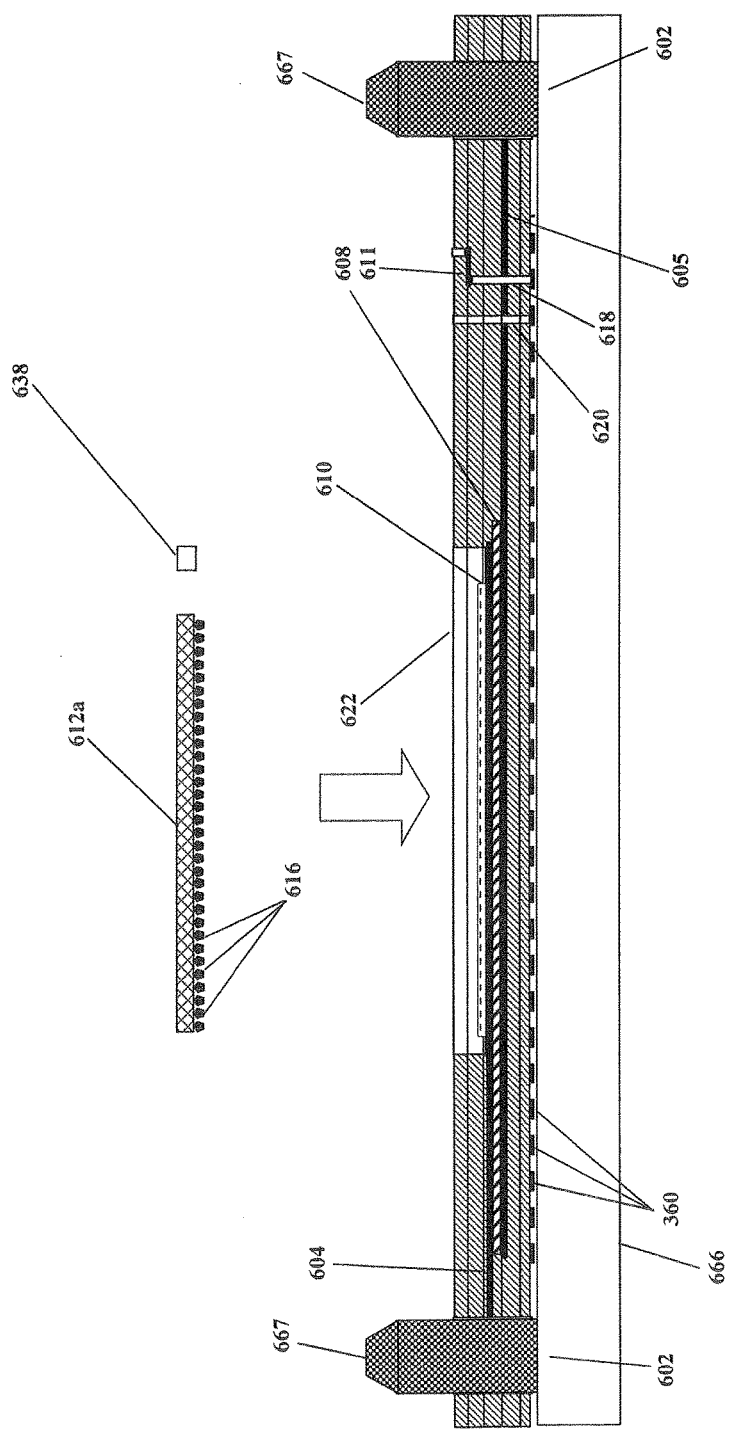

FIG. 9d showing the actual chip placement—The flip-chip 612a is aligned carefully on the substrate 610 and then the stacked assembly passed through a reflow oven. Another option is to apply thermo-acoustic pressure using thermosonic head. Other processes may be used to achieve proper bump adhesion and connection to the substrate pads. Plurality of flip-chips may be assembled in the same layer. In addition plurality of wire bonded or flip-chip bonded chips may be stacked one on top of the other to achieve the desired layer functionality. In addition to the flip-chip placement, passive components such as electrolytic or ceramic capacitors may be assembled around the die/s.

Figure 9E:
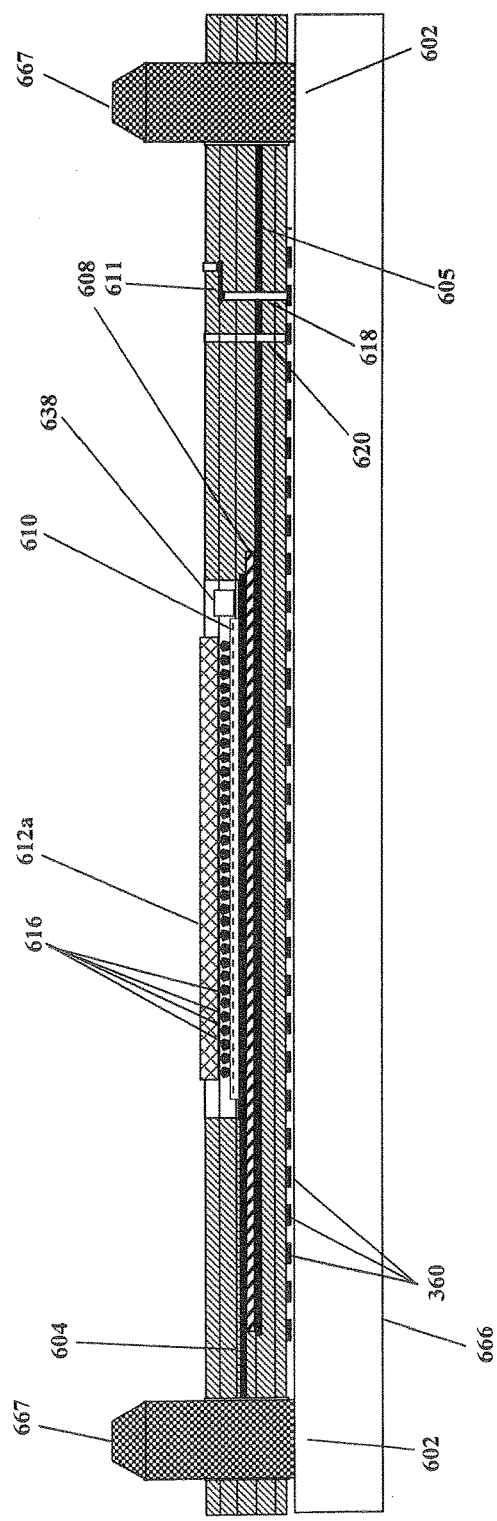

The end result of these processes can be seen is FIG. 9e—the bumps 616 are melted into the substrate pads 610 to form the required electrical connections from the chip to the substrate. Typically in large chips few hundreds of bumps are made to enable proper electrical interfaces. Similarly additional Surface Mount Technology passive parts such as ceramic capacitor 638 are placed on the substrate by solder paste through reflow process.

Typically at this stage, the lower-half with the chip is tested again to assure that the integrated parts are forming the proper electrical circuit. After successful testing—the flip-chip is ready for underfill and encapsulation steps.

In the case that the test is failing, it is still possible to do some rework at this stage similar to standard flip-chip processes. This may save the whole assembly or just recover the die.

Figure 9F:
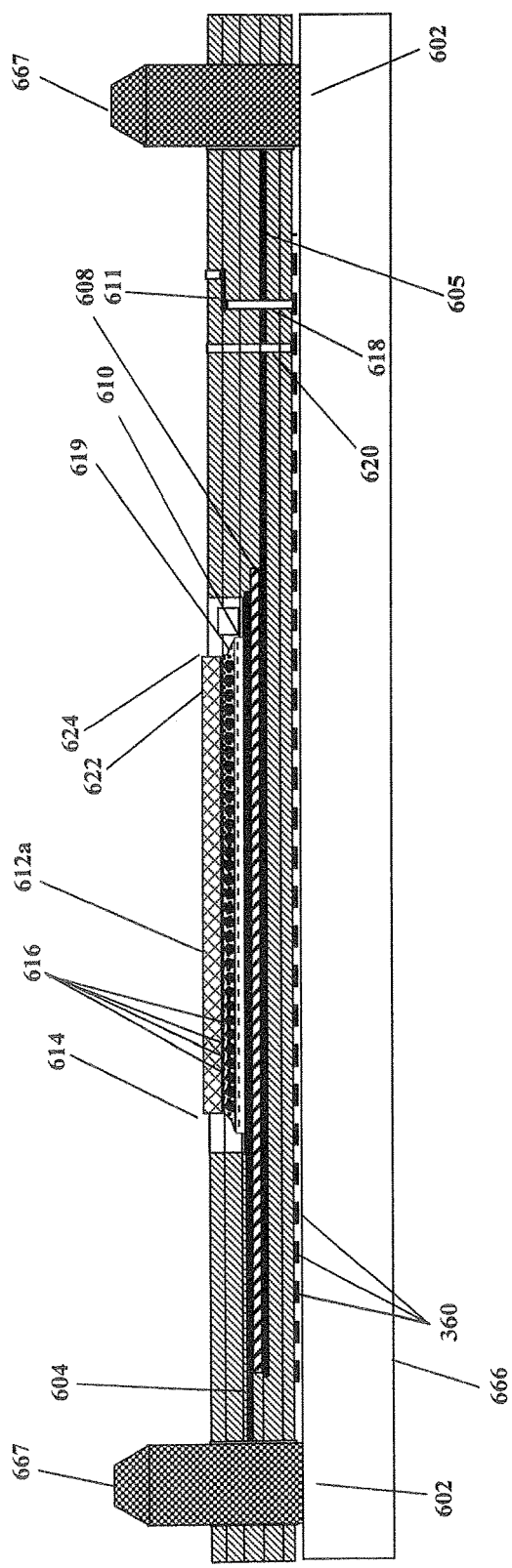

FIG. 9f illustrates the next step where underfill 619 is being applied to protect the bumps 616 and secure the chip to the substrate 610. Underfill may be needle-dispensed along the edges of the chip 612a. It is drawn into the under-chip space by capillary action, and heat-cured to form a permanent bond. After the curing process is complete, the chip 612a is firmly secured to the substrate 610.

Figure 9G:
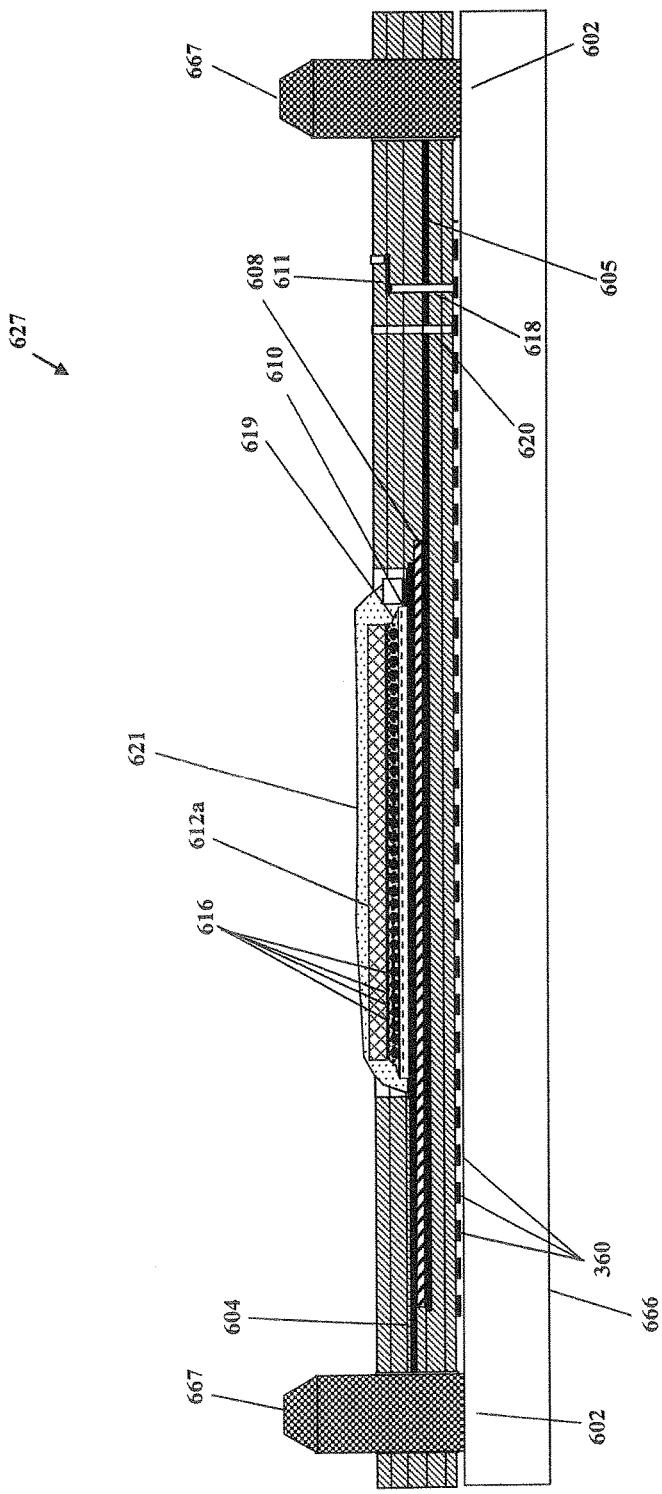

FIG. 9g illustrates the next step where encapsulation material 621 is applied to seal the flip-chip die 612a from the process environment. After further testing and inspection, the lower half 623 is ready for integration with the upper half part.

Optionally, multiple chips and various other electrical parts can be integrated into the lower half in a similar way to form the required layer functionality.

Figure 9H:
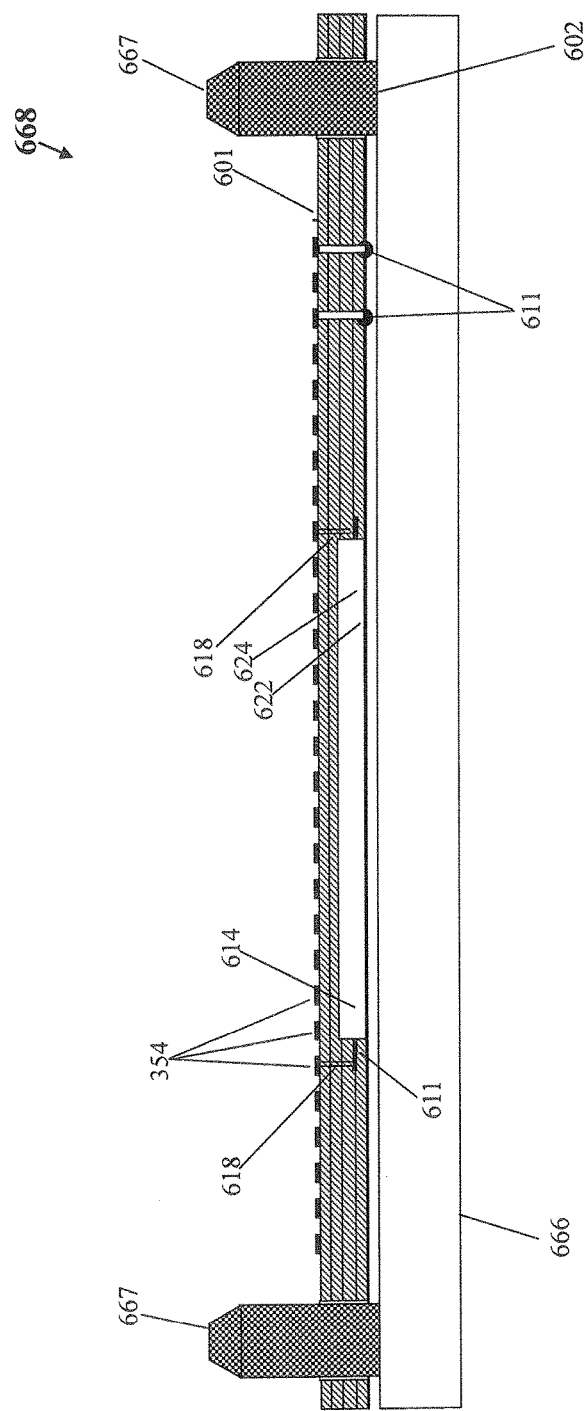

FIG. 9h illustrates the fabrication process of the upper half 668. This fabrication process is done in a process very similar to the lower-half fabrication.

In order to enable proper electrical connections between the lower-half 623 and the upper-half 668, pads are printed at the bottom of the upper half to match similar pads in the lower-half Miniature bumps or solder material balls 611 are formed to enable soldering of the two mating layer halves.

Figure 9I:
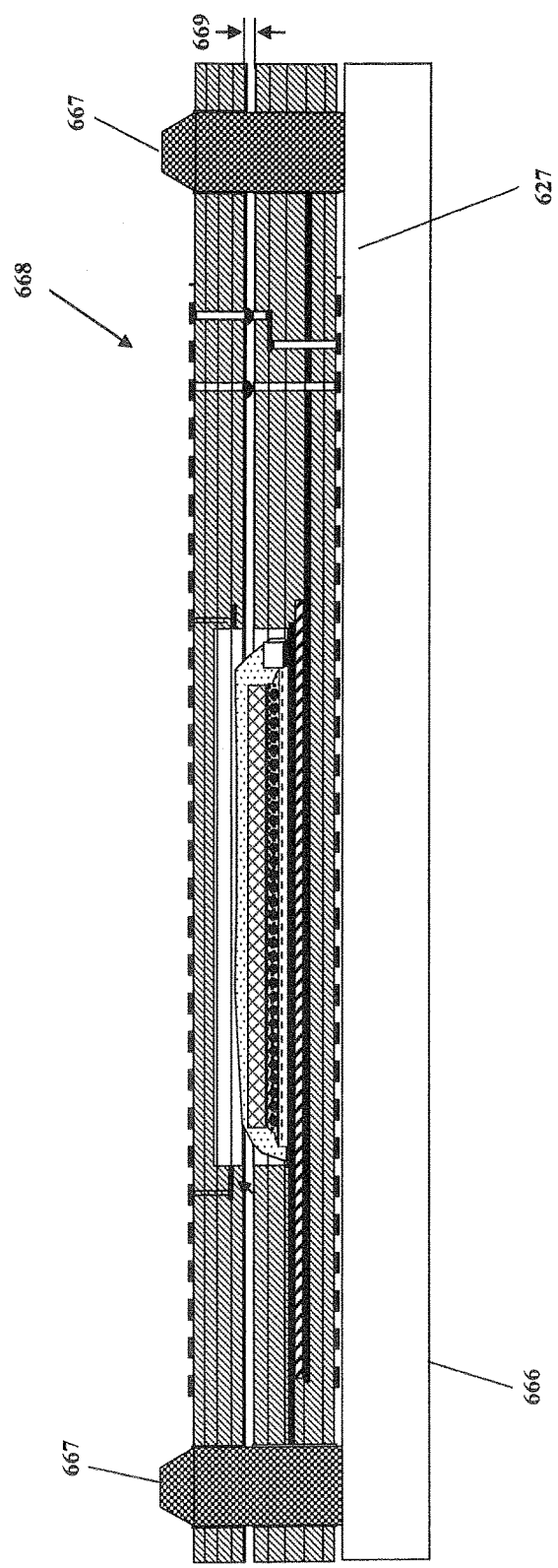

FIG. 9i illustrates the attachment process of the two mated layer halves 627 and 668. The attachment of the two layer halves performed similarly to a BGA of flip-chip process. The two halves are precisely aligned together and then passed through a reflow oven where the bumps or balls are soldered together. After soldering is completed, the assembled part is fully tested. In case that a problem is detected some rework can be done to recover the part.

Figure 9J:
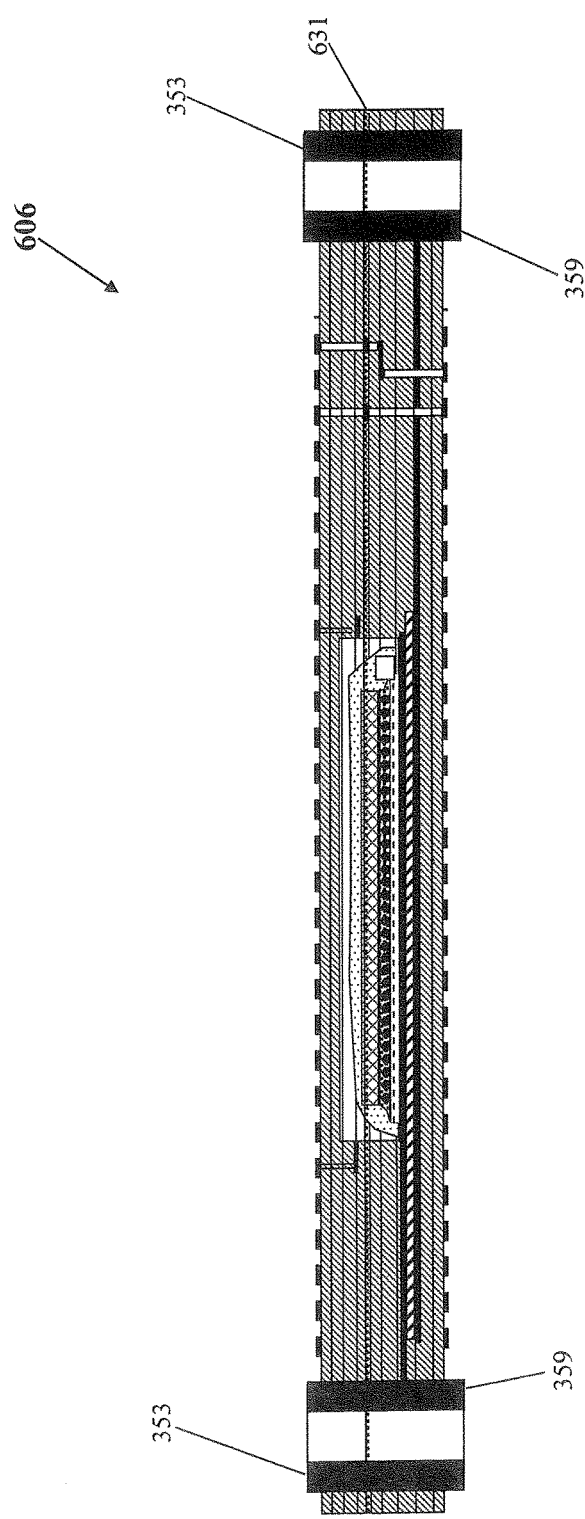

FIG. 9j illustrates the layer final assembly processes. After full electrical testing, underfill material 631 is injected into the small gap between the two halves. As the underfill material 631 cures, the gap is sealed and the whole layer becomes a single solid part. Four upper metal bushings 353 are pressed into the TCR holes in the finished layer, followed by the four lower bushings 359.

The final layer is tested and inspected again and then packaged for shipment in proper container.

It should be noted that bonding technologies (i.e., flip-chip and wire-bonding) may be combined in the same layer. It should be noted that the terms "upper" and "lower" half are arbitrary and do not necessarily indicates directions along the vertical axis. In fact, electrical components may be bonded to both upper and lower half Generally, a layer may comprise plurality (for example, more than two) of component carrying surfaces.

Figure 10A:
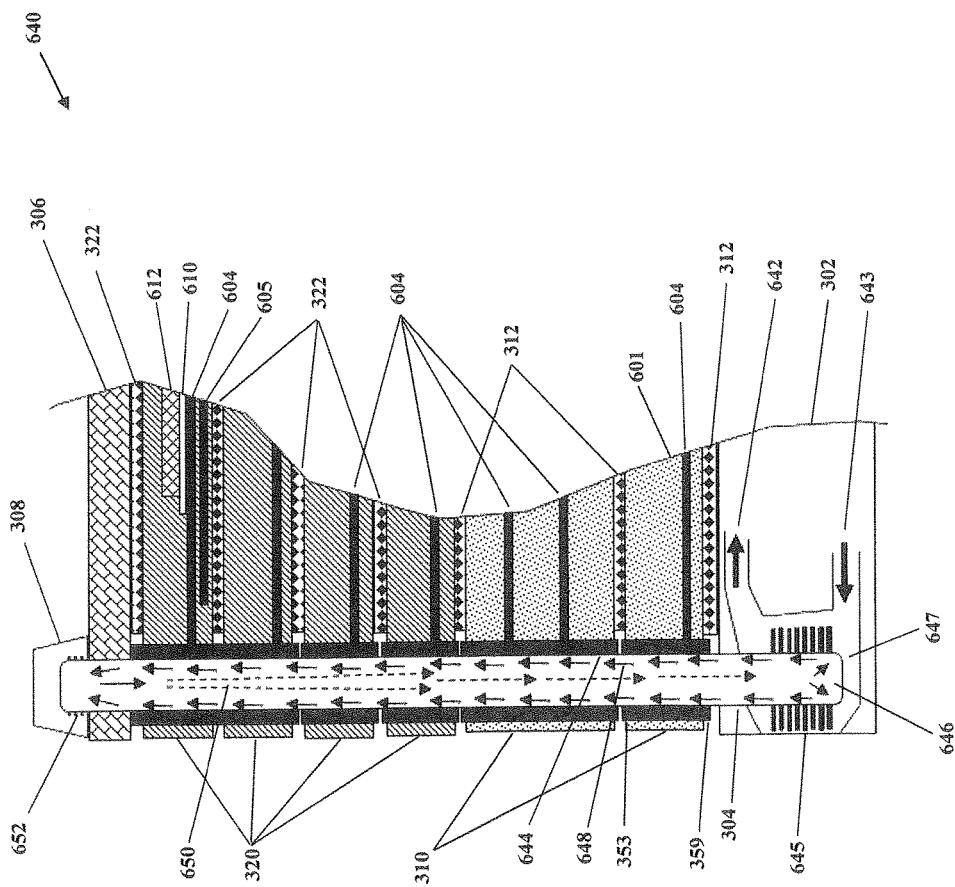
FIG. 10a illustrates 3DMC adiabatic heat-pipe type Thermal Conductive Rod (TCR) attached to a base layer cross-section with its surrounding layers, demonstrating the heat transfer path from the layer mounted die to the coolant fluid at the base layer according to an embodiment of the present invention.

FIG. 10a illustrates 3DMC Thermal Conductive Rod (TCR) with heat-pipe structure attached to the base layer cross-section with its surrounding layers. This illustration is used to demonstrate the heat transfer path from the layer mounted die to the coolant fluid at the base layer.

The Thermal Conductive Rods (TCRs) of the preferred embodiment are built as heat-pipes having extremely high effective thermal conductivity in order to transfer heat from the stacked layers to the heat exchanger at the base layer 302. It should be noted that TCRs 304a-d may be secured to a structure underneath the base layer to enable simple multiple 3DMC matrix implementations. The TCRs 304a-d are closed, evacuated cylindrical vessels with the internal walls 644 lined with a capillary structure or wick that is saturated with a working fluid 646. Since the TCR is evacuated and then charged with the working fluid prior to being sealed, the internal pressure is set by the vapor pressure of the fluid. The working fluid 646 may be water, methanol, lithium, cesium, potassium, sodium or any other suitable fluid. The TCRs are typically made of copper with the internal surface 644 finished as screen wicks or powder metal wicks to improve the working fluid pumping effect.

Heat generated by the silicon dies 612 and other components inside the layers is transferred via the chip adhesive layer 610 to the thermal plan underneath 604. Heat is also conducted to the other 3 thermal plans to deliver heat to the 4 corners of the layer. In each corner, the TCR bushing 353 and 359 thermally coupled to the thermal plan 604, deliver the heat to the TCRs 304a-d that passes through the bushing.

As heat is input at the evaporator side of the TCR 650, working fluid is vaporized, creating a pressure gradient in the pipe. This pressure gradient forces the vapor to flow along the pipe to a cooler section at the bottom 646 where it condenses giving up its latent heat of vaporization. The working fluid is then returned 648 upward to the evaporator by the capillary forces developed in the wick structure 644. On the internal side of the TCR's side-walls a wick structure exerts a capillary force on the liquid phase of the working fluid. This is typically a metal powder sintered or a series of grooves parallel to the tube axis, but it may in principle be any material capable of soaking up the coolant.

The TCRs are typically designed to perform well within their design limitations. The specific TCR characteristics may be programmed into the management computer to enable efficient thermal management. In general there are five primary TCR heat transport limitations. These heat transport limits, which are a function of the TCR operating temperature, include: viscous, sonic, capillary pumping, entrainment or flooding, and boiling. These limitations may be programmed into the management computer firmware to manage thermal cycles efficiently and reliably. A failure to control TCR heat transfer may lead to thermal runaway and this may cause 3DMC shut-down or even permanent thermal damages.

The condenser side 646 of the TCR 304 is fitted with cooling fins 645 to increase the contact area between the TCR walls and the cooling fluid in the heat-exchanger chamber 647. Coolant fluid is entering the heat-exchanger chamber 647 through the inlet pipe 643 at the lower part. The fluid is circulating around the TCR condenser fins 645, heat is being transferred to the fluid and then it leaves the chamber at the higher part through the coolant fluid outlet 642.

The threads 652 at the top section of the TCR are built to enable pressure nut 308 to fit on the TCR.

From the above description of the preferred embodiment cooling system it is obvious that the whole stacked structure may be assembled inverted. This upside-down installation may have a thermal advantage as heat flowing in the TCR is moved upwards. Still there are other considerations for having the base layer stacked lowest mainly due to gravitation effect during assembly. Similarly it is also possible to assemble the 3DMC stack sideways if desired.

Alternatively, thick, heat conductive rods or blocks are used for heat removal and optionally for power delivery. In this embodiment, these heat conductive elements are in the periphery of the layers.

Figure 10B:
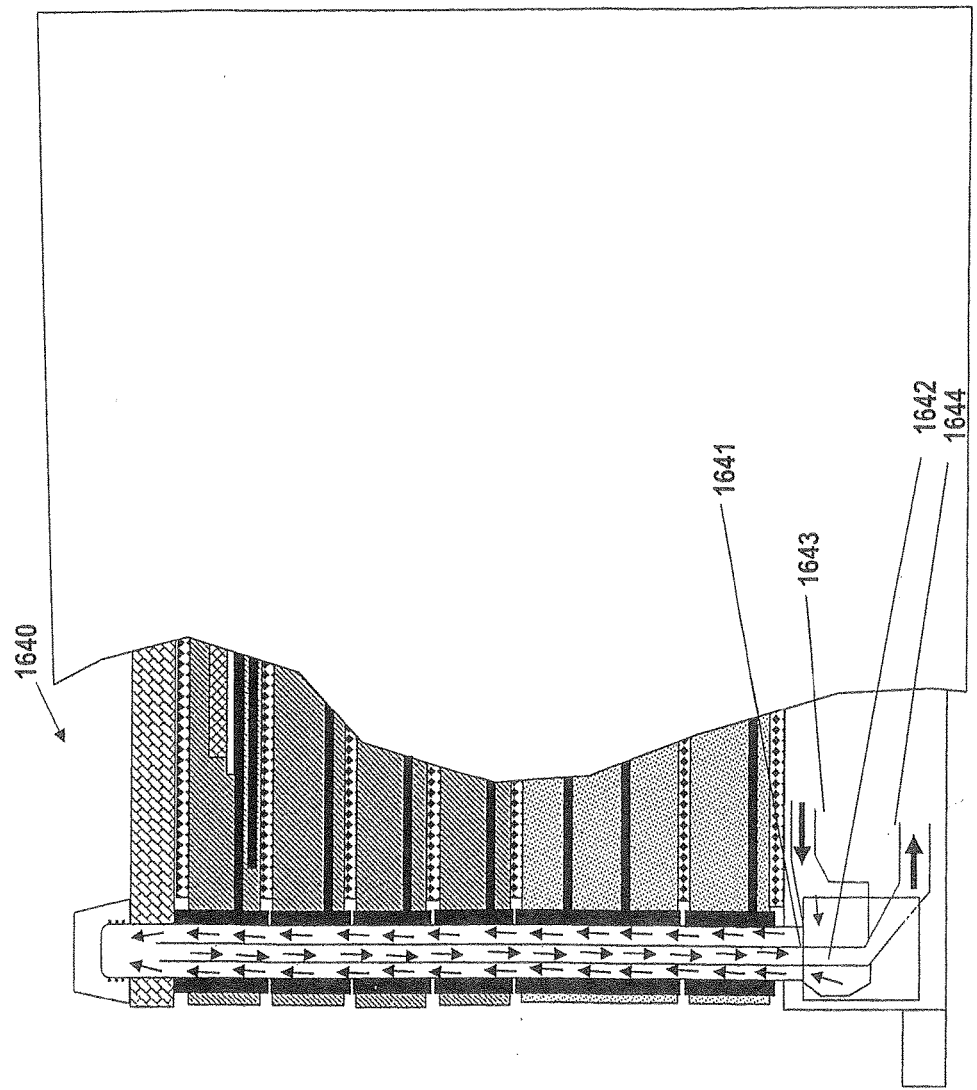
FIG. 10b illustrates 3DMC internal circulation type TCR cross-section with its surrounding layers, demonstrating the heat transfer using coolant fluid co-axial circulation in the rod according to another embodiment of the present invention.

FIG. 10*b* depicts an exemplary embodiment for a TCR having internal flow of coolant fluid 1640. Preferably TCR having circulation fluid 1640 has two lumens: lumen 1641 conducting cold input fluid 1643 and lumen 1642 conducting hot exhaust fluid 1644. In the depicted embodiment lumen 1642 is central to 1641; however, flow direction may be reversed or lumens may be located side by side. This arrangement may transfer heat at higher rates compared to a heat pipe option disclosed above as coolant fluid may be circulated at high speed inside the TCRs.

Figure 10C:
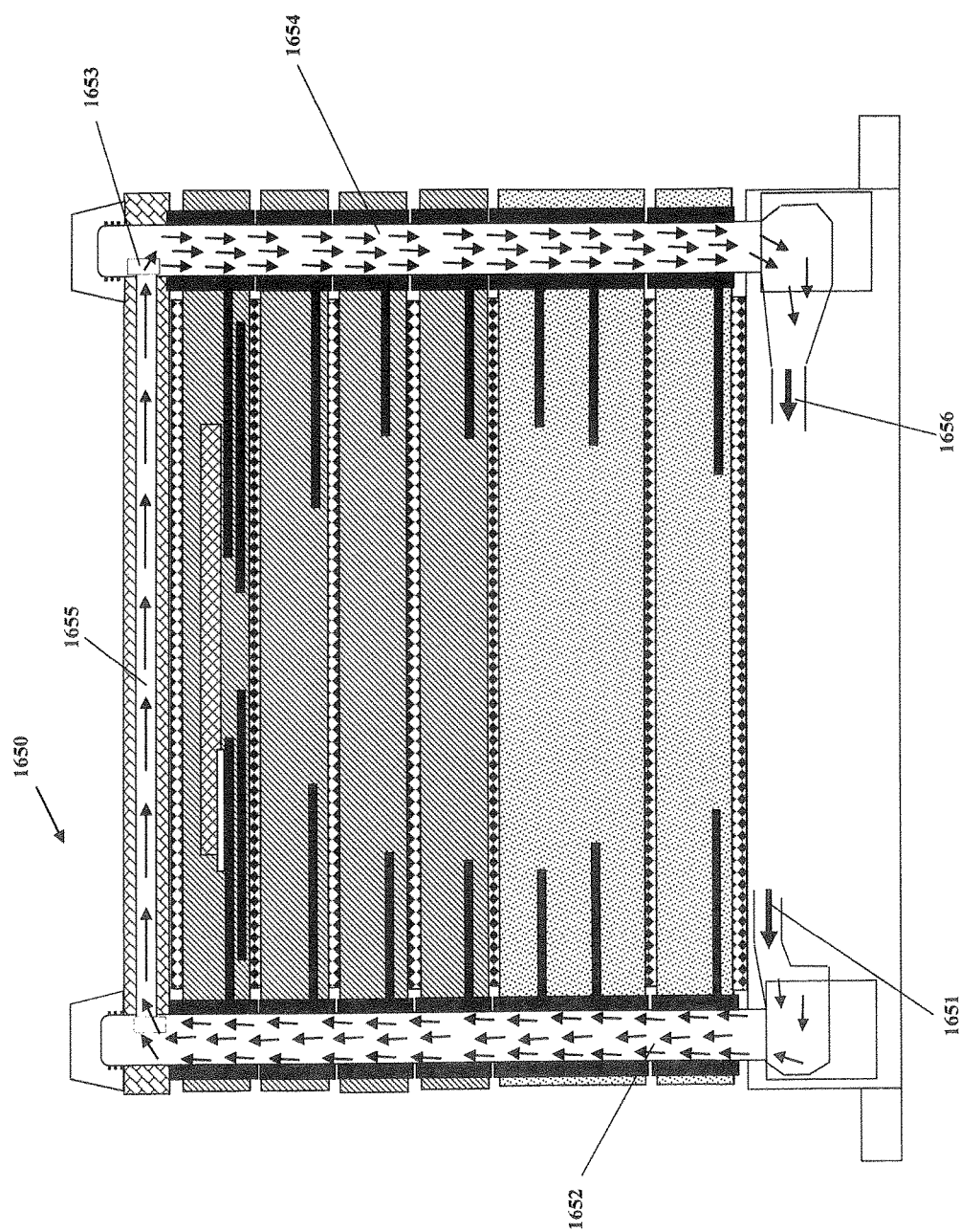
FIG. 10c illustrates 3DMC internal coolant fluid flow type TCR cross-section with its surrounding layers, demonstrating the heat transfer using coolant fluid flow in the rods and in the cover layer.

FIG. 10*c* presents yet another exemplary embodiment for a 3DMC 1650 having coolant fluid flowing into the TCR 1652 through inlet pipe 1651, then the fluid passes through a pipe in 1655. From the cover layer fluid enters the opposite side TCR through side holes 1653 and flow down through the TCR 1654 and through the exhaust pipe 1656. More specifically cold inlet fluid may enter two opposite TCRs at the base and warm fluid exhaust may flow down to the base layer through the other two TCRs. Alternatively coolant fluid may enter at one side (base layer, for example) and leave the 3DMC at the other side (cover layer for example).

Alternatively the TCR circulation loop may be closed using interlayer fluid passes fluid passes or even in-layer passes.

Alternatively, cooling fluid is forced to flow around the 3DMC stack.

Figure 11A:
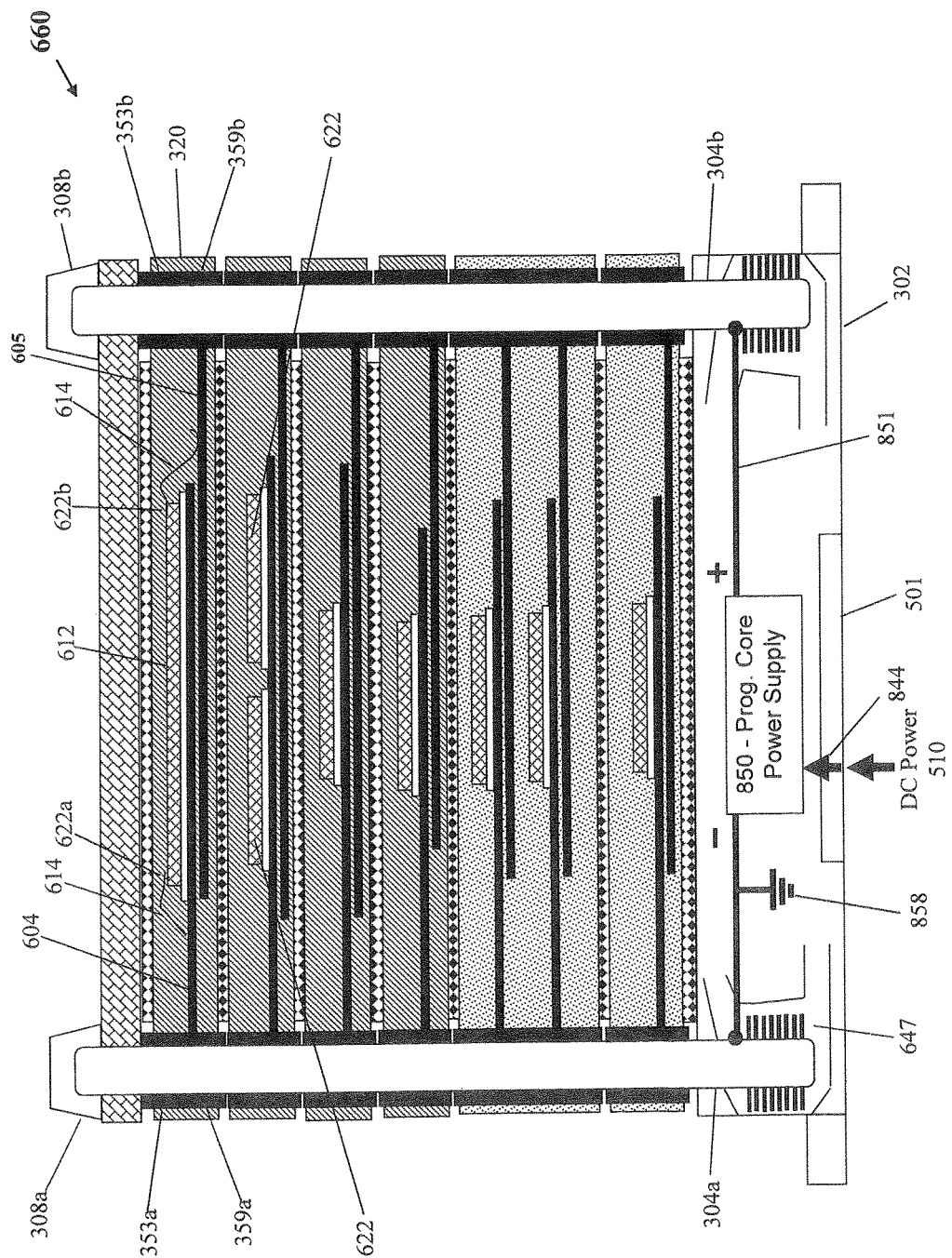
FIG. 11a illustrates a cross-sectional view of a 3DMC apparatus having power supply functions embedded in the base layer highlighting power distribution elements according to a preferred embodiment of the present invention.

FIG. 11*a* illustrates a cross-sectional view of a preferred embodiment of a 3DMC apparatus having power supply at the base layer highlighting power distribution elements 660.

For the purpose of this illustration a single power plan will be followed from the power-supply located at the base layer to the chip die consumer at the top stacked layer. Additional power plans and layer power distribution method is essentially the same.

Main DC power 510 of 5V or higher voltage connected into the base layer 302 through the optional removable electrical connector/s 501 by link 844. Power supply 850 converts the power input to a lower voltage through programmable settings from the management computer (not shown here) or from CPU direct commands using VRM or any other CPU to Power supply protocol. Power supply 850 negative output is connected to the chassis and to the Ground TCR 304*a* while positive output connected through power conductor 851 to the second TCR 304*b*. Power supply connections are implemented using thick metal planes to reduce resistance and inductance in traces from power supply to the layer. As the TCRs designed as very good electrical conductors, the left side TCR 304*a* becomes Ground plan and the right side 304*b* becomes one of the power planes (Vcore in this example).

Similar architecture may be implemented to enable power delivery from power supply located in a dedicated layer or layers.

Another design alternative of the present invention enables redundant power input from two separate DC power sources through the optional removable electrical connector/s 501. In this arrangement the 3DMC may switch automatically to secondary DC power source in case that the primary power source is failing or operate continuously on one or two power sources.

Yet another design alternative of the present invention enables the implementation of power supply 850 as two separate power sources feeding from two separated DC power sources. In such arrangement, failure of one power source or one power supply will not affect the 3DMC operation.

Top layer 320 is electrically coupled to the TCRs by the lower side bushings 359*a* and 359*b* and the upper side bushings 353*a* and 353*b*. As internally in the layer the left side TCR 304*a* is coupled to the thermal plane 604—this plane becomes a ground plane that extends all the way to the die/s 612. Similarly on the right side, Vcore thermal plane 605 is coupled to the right side TCR 304*b* and thus delivers positive side of power plan close to the die/s 612. Bonding wires 614 are used to deliver power connections from the substrate to the power pads on the die/s. 622*a* is die ground pad and 622*b* is die Vcore pad in this example. To compensate for TCR and layer voltage drop, optional voltage sensing at the consumer die can be implemented. This analog or digital signal can be connected back to the base layer 302 or to the power supply layer 311 of FIG. 2*a* to close the power-supply feedback loop more accurately.

Figure 11B:
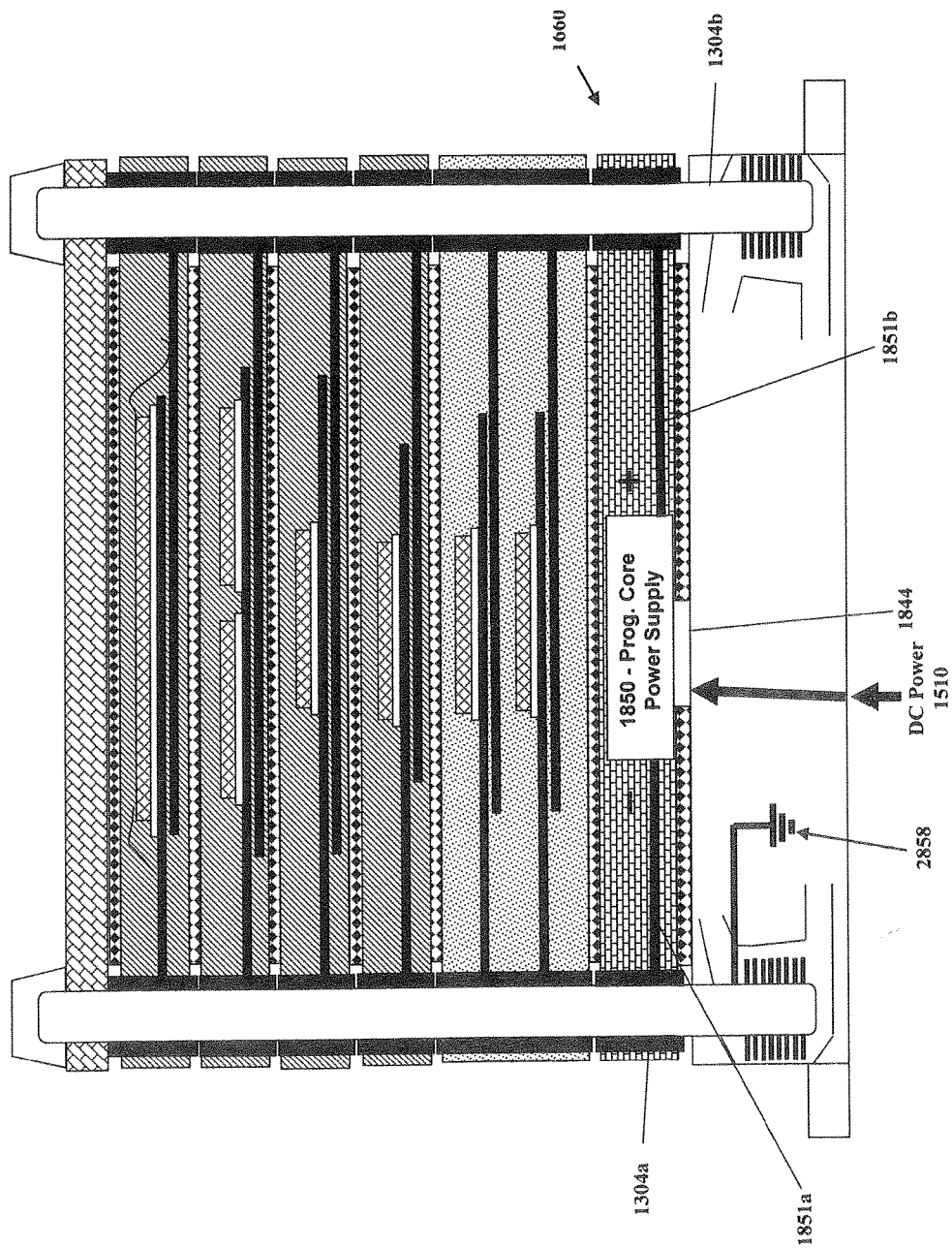
FIG. 11b illustrates a cross-sectional view of a 3DMC apparatus having power supply functions in separate bottom layer highlighting power distribution elements according to the preferred embodiment of the present invention.

FIG. 11*b* illustrates a cross-sectional view of another embodiment of a 3DMC apparatus using exchangeable power layer located as bottom layer in the 3DMC stack, highlighting power distribution elements 1660.

For the purpose of this illustration a single power plan will be followed from the power-supply at the bottom layer to the chip die consumer at the top stacked layer. Additional power plans and layer power distribution method is essentially the same.

Programmable power supply 1850 (or supplies) is located in bottom power layer 1660.

Power lines (or power planes) 1851*a* (1851*b*) are leading from power supply (supplies) 1850 to bushings 1304*a* (1304*b*) respectively.

Power connector 1844 is connecting power 1510 to supply layer 1160, this connector may comprise control signals.

Ground potential 2858 is connected to at least one TCR.

Advantages of this embodiment comprise: ability to exchange power supply to meet the power need of the module; and the ability to easily replace failed power supply.

Figure 11C:
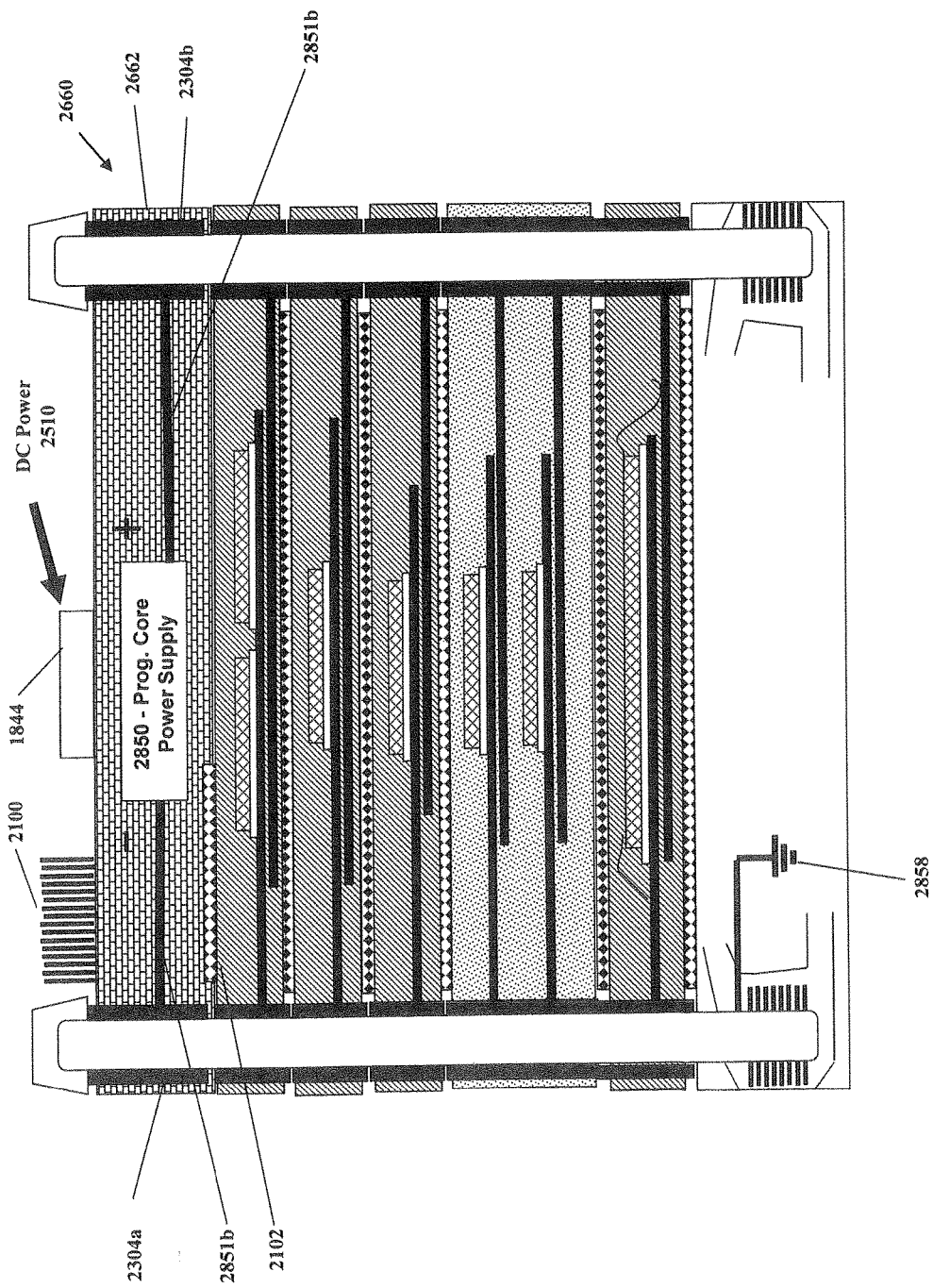
FIG. 11c illustrates a cross-sectional view of a 3DMC apparatus having power supply functions in separate top layer highlighting power distribution elements according to a preferred embodiment of the present invention.

FIG. 11*c* illustrates a cross-sectional view of another embodiment of a 3DMC apparatus using exchangeable power layer located as top layer, highlighting power distribution elements 2660.

For the purpose of this illustration a single power plan will be followed from the power-supply located at the top layer to the chip die consumer at the top stacked layer. Additional power plans and layer power distribution method is essentially the same.

Programmable power supply 2850 (or supplies) is located in top power layer 2662.

Power lines (or power planes) 2851a (2851b) are leading from power supply (supplies) 2850 to bushings 2304a (2304b), respectively.

Power connector 2844, located on top of power layer 2662 is connecting external DC power 2510 to supply layer 2662, this connector may comprise control signals.

Ground potential 2858 is connected to at least one TCR.

Heat from the power supply 2850 (or supplies) flows through the power plans and other elements in the layer 2662 to the TCRs. Optionally cooling fins 2100 assist in removing heat from power layer 2662.

Optionally, signal connector 2102 connects power layer 2662 to the layer below. Optionally this connector comprises terminators or looping connector so that top power layer may serve functions of cover layer 306. Alternatively a layer comprising terminations and looping connector is placed below top layer 2660.

Advantages of this embodiment comprise: ability to exchange power supply to meet the power need of the module; ability to easily replace failed power supply and easy heat removal from top power layer.

Figure 12:
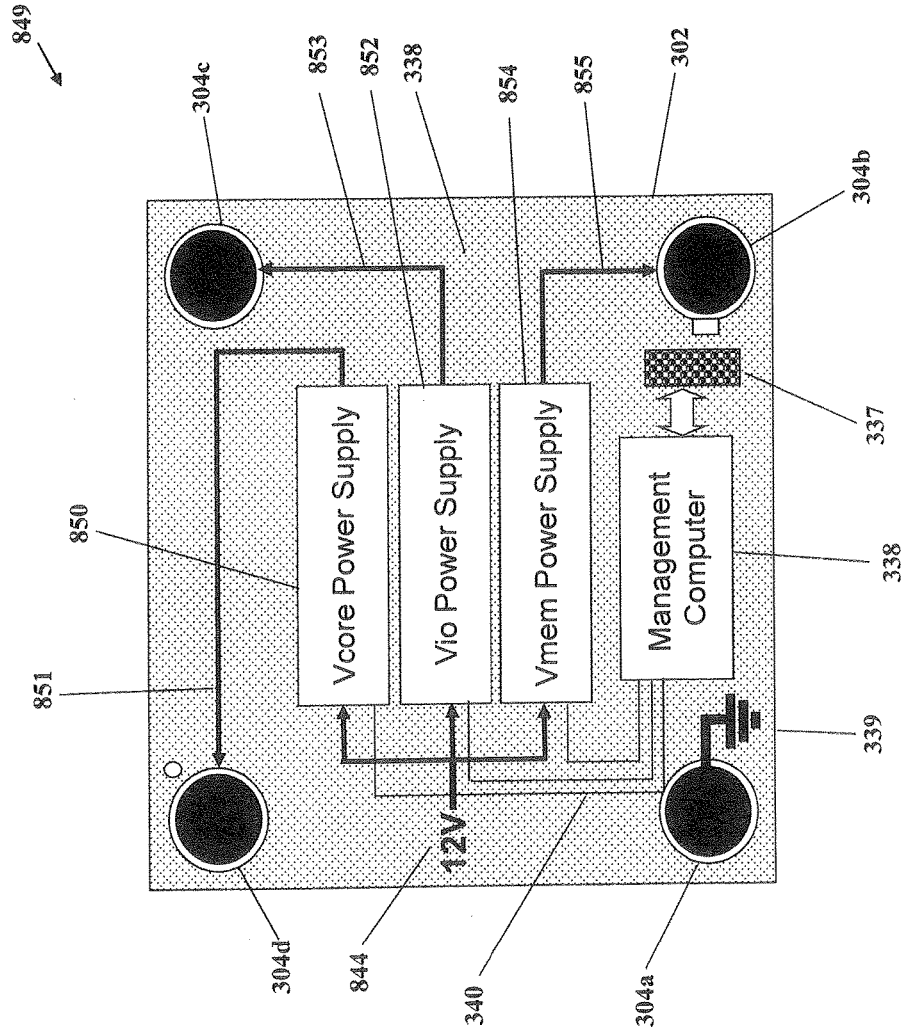
FIG. 12 illustrates a high-level block diagram of base/bottom/top layer power supplies subsystem exposing the three power supply blocks all powered from one or more DC supply line according to an embodiment of the present invention.

FIG. 12 illustrates a high-level block diagram of base layer power supplies or bottom/top layer power supplies highlighting the power subsystem 849. In this figure a top view of the layer 302 exposing the three power supply blocks all powered from one or more DC supply line 844. The three power supply outputs are electrically coupled to the TCRs:

Vcore power supply 850 output is electrically coupled with TCR 304d through power line 851. This power line should be as short and wide as possible to reduce parasitic resistance.

Vio power supply 852 output is electrically coupled with TCR 304c through power line 853.

Vmem power supply 854 output is electrically coupled with TCR 304b through power line 855.

The return (Ground) output 339 of all three power supplies is connected to the forth TCR 304a.

Control and monitoring of the three or more power supplies is done by the management computer 338 through analog or digital connection link 340. Critical real-time parameters measured in the layer such as Voltage feedback, temperatures are optionally measured and transmitted by individual layers and delivered to the management computer 338 through the Services Interconnect Area (SIA) 337 or directly to the power supplies.

If needed, additional power supplies may be added to enable generation of additional supply voltage or to provide power redundancy. In case that the number of voltage planes exceeds the number of TCRs-1 additional delivery planes are needed. In such case additional power delivery can be done through the stack outer walls or at lower currents through the Services Interconnect Area (SIA) 337 signals.

With the miniaturization of power supplies and the development of flat high-current power planar inductors it is possible to design additional power supplies or power conversion in the layers. This enables additional power plans to be generated from primary power plans inside the layers.

If only one or two voltages are needed, same voltage may be connected to two TCRs to reduce supply parasitic resistance.

Figure 13:
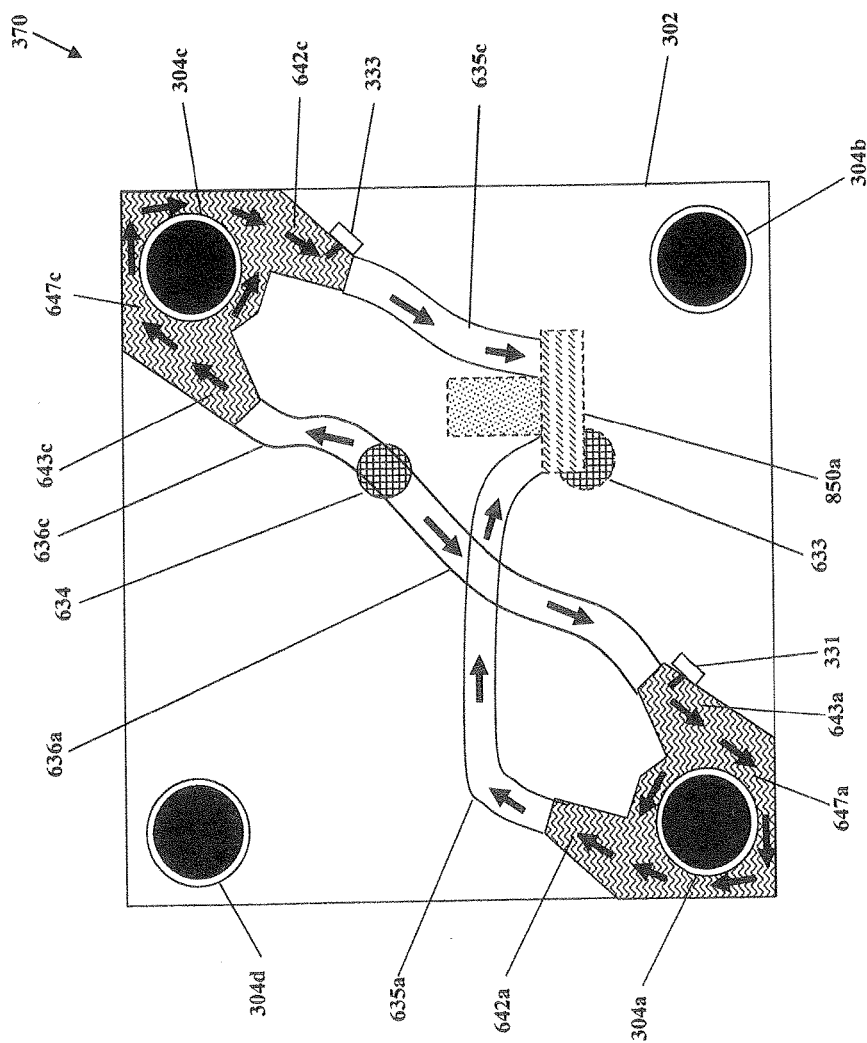
FIG. 13 illustrates a simplified diagram of the base layer cooling subsystem according to an embodiment of the present invention.

FIG. 13 illustrates a simplified diagram of the base layer cooling subsystem. Although one system may supply enough cooling to support the whole 3DMC cooling requirement, it is desirable to build two independent cooling systems for redundancy. In case that one system fails—the second system may function at higher intensity to keep the 3DMC at normal operating temperature. Optionally, in order to achieve this redundancy the four TCRs are divided into two crossed groups—TCR 302a and 302c are cooled by System A, while TCRs 302b and 302d are cooled by System B.

To avoid complication in the figure—only System A is shown. It is clear that System B would be similar.

Cooling fluid is entering the 3DMC through fitting in the base layer 634. This fitting preferably comprises of fine filter to avoid cooling system contamination by loose particles that may travel with the cooling fluid. This filter is preferably designed to enable service from outside the 3DMC.

After the cooling fluid enters the base layer it is divided into two optional ducts—one 636a leads to heat exchanger chamber 647a around TCR 302a. The second 636c leads to heat exchanger chamber 647c around TCR 302c. The cooler cooling fluid enters the heat exchanger chamber at the inputs 643a and 643c where it is circulating the TCR base cooling fins 645. After it absorbs the heat from the TCR, the wanner fluid leaves the heat-exchanger chamber through output port 642a and 642c. Return duct 635a and 635c delivers the warmer fluid to the optional electrical pump 850a. This optional pump controlled by the management computer and to set the fluid flow rate according to the heat removal requirements. The optional pump 850a may be replaced by electrically or thermostatically controlled flow regulator or valve. In addition the optional pump may be installed before the heat-exchanger chamber to supply positive pressure. It may be advantageous to install coolant fluid pumps in locations outside the base layer to reduce maintenance complexities. In such case, the base layer cooling system becomes a passive cycle and therefore fluid pressure is generated by external pump/s. Still flow control may be regulated locally in the base layer using thermostatically or electrically operated regulation valves or bypass valves.

The warmer fluid is passed through an optional filter again as it leaves the base layer at fitting 633. Input and output fittings are typically connected to quick connect—disconnect feature 512 (not shown here). Filter may be located in the fitting 633 to enable easier access and service.

In order to monitor heat efficiency and thermal conditions, cooling fluid temperature is measured by thermal probe 331 at the heat exchanger chamber input 643a. Cooling fluid output temperature is measured by similar probe 333 at the second heat exchanger chamber output 333. If needed by the specific design—additional temperature or flow sensors may be added. The cooling fluid and the various connecting ducts must be non-conductive to avoid current leakage and electrochemical erosions of the TCRs. Optionally thermal sensors may be installed within one or more of the layers and used for monitoring and/or regulating the cooling system.

Optionally regulation valves may be installed within one or more of the layers to enable per-layer thermal management and temperature control.

Typical high performance AMD Opteron based 3DMC with eight processors may dissipate 400-600 W in worst case—this may require fast fluid flow and high temperature differences to maintain allowable temperatures. Any momentary reduction or failure of one system should be sensed immediately by the management computer and compensated by increasing the other system capacity. In case that the capacity is marginal or second system affected then the management computer may decrease power dissipation by throttling the 3DMC operating frequency. If this doesn't help then the 3DMC should shut down the 3DMC immediately to avoid permanent damages to the overheated layers.

Alternatively, single pump or several pumps may supply cooling fluid at constant temperature to plurality of 3DMCs. It should be appreciated that heat is removed from the system by a cooler of large enough capacity, for example, by air-conditioning device or heat exchanger.

Figure 14:
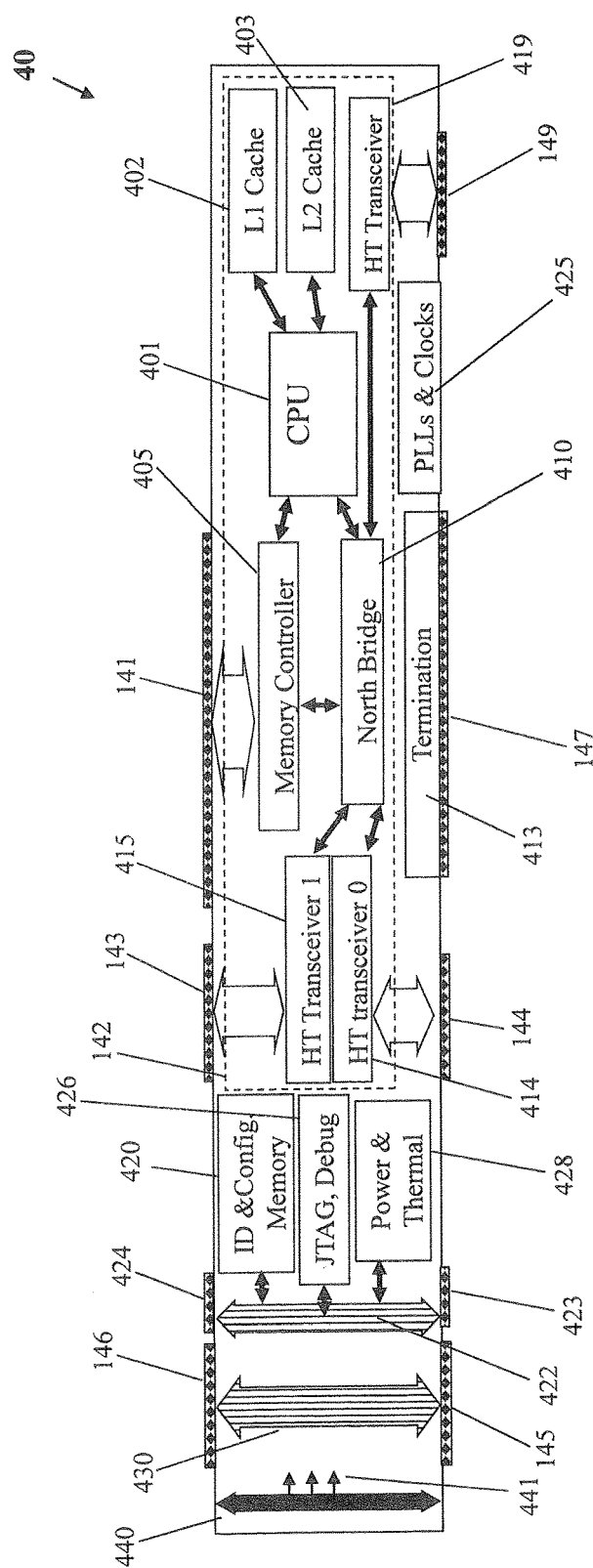
FIG. 14 illustrates block diagram of a typical single CPU layer according to an embodiment of the present invention.

FIG. 14 illustrates a more detailed block diagram of a typical single CPU layer 40 of the present invention. In this layer CPU core 401 responsible for primary 3DMC data processing. A typical implementation may comprises of x86 compatible processor such as Intel Xeon or 64 bit processor such as AMD Opteron. To better illustrate the architecture of the present invention AMD Opteron processor will be used although many other current and future processors may be used in single multiple processors per layer. The processor core 401 is typically connected to a fast on-die L1 instruction cache 402. This cache improves the processor performance by storing usable instructions available on faster memory compared to the standard memory. This cache may be organized in two-way set associative structure of 64 KB or more. To enhance core reliability L1 cache and CPU may implement Error Correction Code (ECC) protection function. This function is desirable in server implementations.

A second L2 data and instruction cache 403 typically connected to the processor to enable faster storage and retrieval of both instructions data sets. L2 data and tag may be stored and protected with ECC. ECC bits may also be used store pre-decode and branch prediction information to further improve processor performance.

Memory controller 405 interfaces between the CPU and the connected memory banks. Typical memory controller supports 128 bit bus DDR DDR2 SDRAM with memory ECC protection. Memory controller 405 connected to external memory layers located on top of it through connections on the upper surface 141. Optionally certain amount of memory may be embedded on the CPU layer.

Memory bus connection at the layer lower surface 147 terminates the optional memory bus at lower memory layers. The bus is terminated actively or passively by the termination block 413. It is important to note that it is possible to terminate the memory bus by proper logic at the memory layer and though avoid the termination at the cover layer completely. While this implementation may offer some advantage in terms of bus signals load capacitance, inductance and reliability it suffers from the disadvantage of additional costs and complexity. Since non-active HyperTransport busses may not be terminated but transceiver may be disabled instead, it is possible to build a platform where the cover layer is completely passive (without terminations).

North-bridge 410 may be included to perform host to I/O functions. In the case of the AMD Opteron core used in this example both inter-processor communications and I/O communications are done through one or more HyperTransport links. HyperTransport is a low-latency fast chip-to-chip interconnect technology for that is ideally suited for usage in open-architecture systems such 3DMC. It currently provides up to 22.4 Gigabyte/second aggregate CPU to I/O or CPU to CPU bandwidth in a chip-to-chip technology that replaces existing complex multi-level buses. In addition to delivering high bandwidth, frequency scalability, and low implementation cost, the HyperTransport technology is software compatible with legacy Peripheral Component Interconnect (PCI) and PCI-X and emerging PCI Express technologies. HyperTransport technology delivers high bandwidth and low latency by means of Low Voltage Differential Signaling (LVDS) point-to-point links, delivering high data throughput while minimizing signal crosstalk and EMI. It employs a packet-based data protocol to eliminate many sideband (control and command) signals and supports asymmetric, variable width data paths.

Collectively, components 401, 402, 403, 405, 410, 414, and 415 are designated as Computer Core 142.

Depending on the CPU layer functionality and maybe on commercial reasons vendor may enable only one link for single processor platforms, two links for Dual Processor or three links for multiple processors. Some or all links may support coherent cache transactions to enable efficient inter-processor cache sharing.

HyperTransport Transceiver #0 414 is available to allow HyperTransport link to lower layers such as CPU or I/O. This link connected through HyperTransport connection at the layer lower surface 144.

The second optional HyperTransport Transceiver #1 415 enables HyperTransport link to additional processors or I/O layers positioned on top of that CPU layer. This link connected through the HyperTransport connection at the layer upper surface 143.

The third optional HyperTransport Transceiver #2 419 enables HyperTransport link to additional processors or I/O layers positioned bellow that CPU layer. This link connected through the HyperTransport connection at the layer lower surface 149.

HyperTransport links may operate as tunnels to enable packets delivery through that layer from different origins to other destinations.

In addition to the one to three HyperTransport links there may be one or more passed through HyperTransport buss/es 430. This bus may pass through the layer to enable looped back buss from different layer. The bus connected inside the layer between the passed through HyperTransport bus connection at the layer lower surface 145 and at the upper surface 146.

Phase Locked Loops (PLLs) and clocks block 425 generates the necessary clock frequencies and phases by local crystal based frequency generator or by using derived centralized clock delivered from the base layer. Centralized frequency may be multiplied or divided as needed through external commands from the management computer 338 located at the base layer.

Passed through one or more System Management Busses (SMB) 422 passed through all layers from the base layer to the cover. The SMB connected to the CPU layer by the SMB connection at the layer lower surface 423, and by the SMB connection at the upper surface 424. Inside the CPU layer the SMB connected to the ID and Configuration memory module 420. This module provides essential identification and operational parameters such as supply voltages, supply currents, architecture and processor type, cooling requirements, critical temperatures etc. The SMB also connected internally to the JTAG and Debug ports 426 to enable centralized testing and trouble-shooting. The SMB also connected to the Power and thermal management module 428 that monitors die temperatures and deliver real-time health information to the management computer 338.

Four passed-through TCRs 440 (only one shown here) enables layer heat dissipation and power delivery. Preferably all layer dies and components are thermally coupled to these four rods to enable efficient heat flow to the base layer. Power distribution 441 to all other layer circuitry connected to these four rods and distributed internally. Ceramic or electrolytic capacitors may be embedded in the layer substrate to reduce supply lines ESR and thus ripple voltages.

It should be noted that this diagram is not intended show the actual locations or size of the various elements, but only their interconnection, except the fact that some connections are on the lower or upper face.

Figure 15:
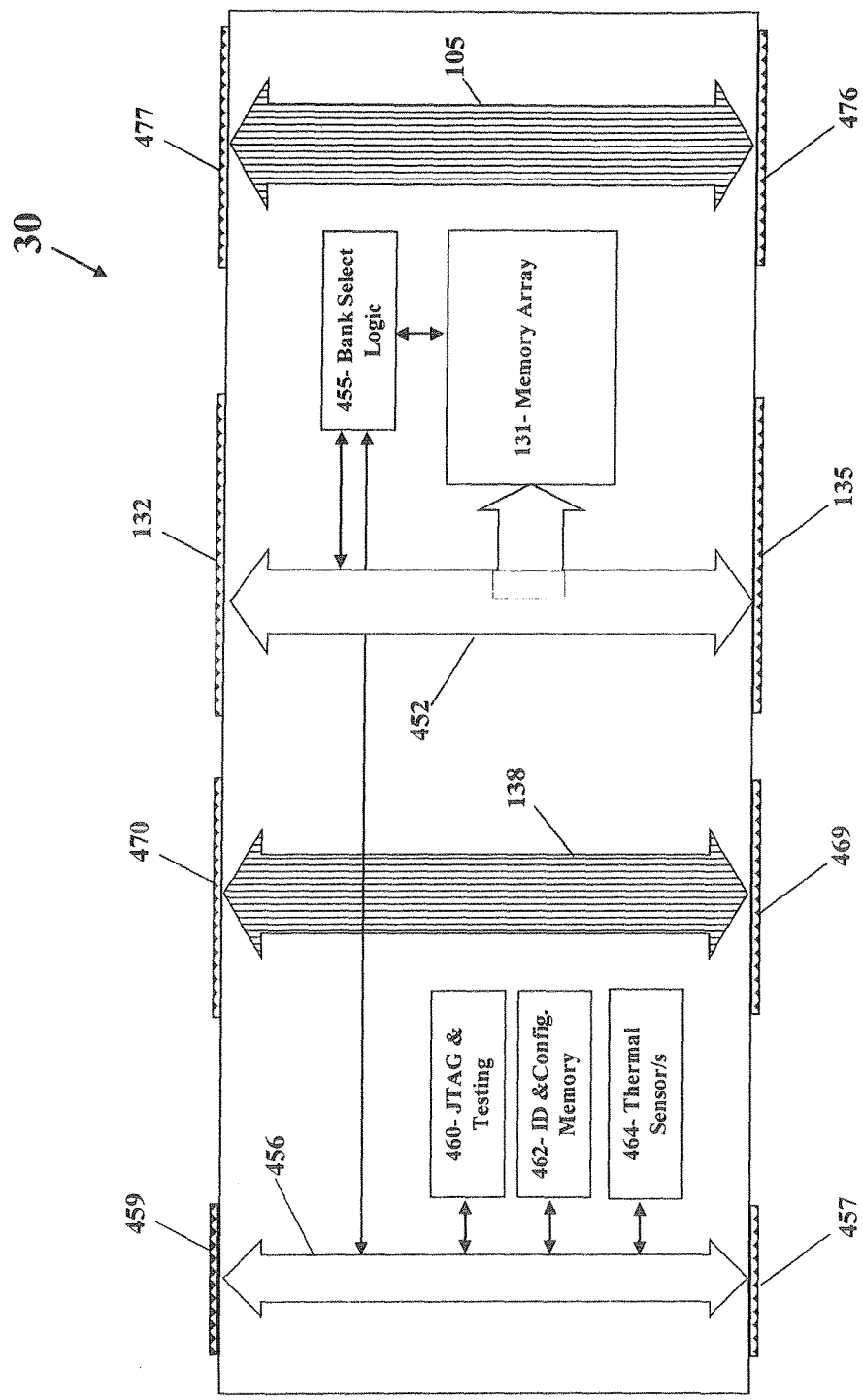
FIG. 15 illustrates a functional block diagram of a typical single memory layer according to an embodiment of the present invention.

Reference is now made to FIG. 15 illustrating a functional block diagram of a typical single memory layer 30 of the present invention. Memory bus from the CPU or memory layer bellow that layer interconnected with the layer through the memory bus interconnect at the layer lower surface 135. The memory interface bus may be of different types depending on the platform architecture and the implementation. The memory bus is passed through the layer internally by vertically routed conductors 452 and connected to the memory interconnect at the upper surface of the memory layer 132. Internally the memory bus also connected to the memory matrix 131. The memory matrix 131 may be Dual Data Rate (DDR) SDRAM type, RAMBUS memory or any other volatile memory technology. Most memory layer implementations enable stacking of more than one memory layer per one connected processor layer. To achieve this function using identical memory layers without manual settings and configurations, memory bank selection logic 455 is built into the memory layer to enable pre-defined configuration to be statically controlled by the management computer 338 located at the base layer. A typical implementation switches Memory Chip Select signals to each memory layer to emulate a single DIMM with that layer. More complex bank selection logic may enable wider flexibility in terms of the number of connected memory layers and types supported. Bank select logic 455 is controlled by the passed-through SMB 456 and the passed-through memory bus 452.

The SMB 456 is passed through the memory layer from the lower surface interconnect 457 to the top surface interconnect 459. Within the memory layer the SMB connected to: the JTAG and testing module 460 responsible for layer built in testing and trouble-shooting; the ID and Configuration memory module 462 that stores essential layer data such as model, speeds, voltages, power settings, timing, thermal parameters, etc.

One or more CPU interconnect busses may be passed through the memory layer to provide proper linking between processors. In the particular implementation shown, one interconnect bus 138 is passed through the layer from lower surface connection 469 to the upper surface connection 470. A second pass-through interconnect bus 105 is passed through the layer from lower surface connection 476 to the upper surface connection 477.

Similar components structure with the addition of multiple identical components may be built to support dual CPU (or more) in a single layer as shown above.

Figure 16:
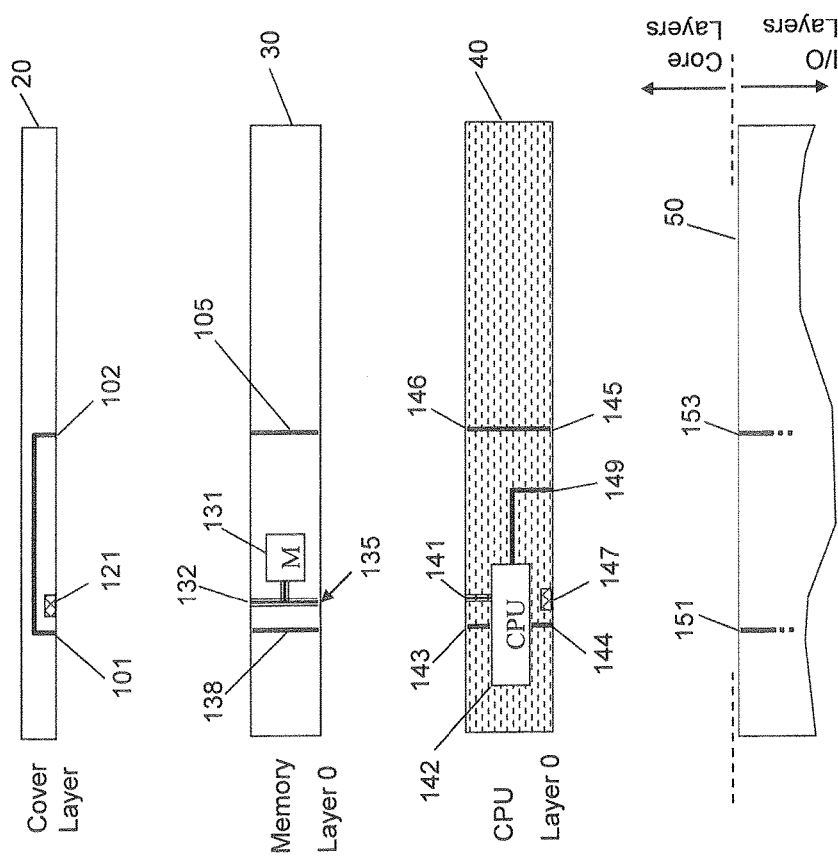
FIG. 16 illustrates schematically the various core components of Single CPU Core architecture 3DMC according to an embodiment of the present invention.

FIG. 16 illustrates schematically the various core components of Single CPU Core architecture 3DMC.

Referring now to FIG. 16—the cover layer 20 is the upper layer of the whole stack. It comprises of passive or active terminations 121 of the various connected active busses (one Memory bus in this arrangement of the typical embodiment shown here). A looped back HyperTransport bus entering the layer at the lower surface 101 and leaving at the lower surface 102 to enable multiple CPU Cores configuration as will be explained below.

Memory layer 30 is an example of a simplified single processor compatible memory. Memory layer is comprises of RAM bank 131 that is connected to CPU Core 142. Memory bank may be of any volatile memory type such as DDR SDRAM or RAMBUS.

Memory bus with 64, 128 bit or any other type of memory bus implemented passes through the memory layer from the lower side connection 135 to the upper side connection 132. The lower side is always starts from the connected CPU while the upper side always ends with a termination. This termination may be a cover layer termination 121 or CPU termination 147 in multi-processor platforms. More than one memory layers 30 may be stacked on top of a single CPU layer 40 to enable memory scalability and upgrades. Passed-through HyperTransport Coherent bus 138 on the left side enables platform expansion to additional processors placed on top of the memory layer. Another passed-through HyperTransport Coherent bus 105 on the center of the memory module enables torus type HyperTransport bus topology for multi-processor implementations.

CPU Core 142 contains a CPU such as AMD Opteron, Memory controller to interface with the connected memory and fast bus links to interconnect with I/O and other CPUs. Fast bus links are typically HyperTransport with coherent interconnection to other CPU that enables each CPU to search for latest data in other CPU cache before accessing the slower memory banks. Connection 141 on the top side of the CPU layer enables memory layer interfacing with the CPU Core 142.

CPU Core 142 connected to additional processors above by HyperTransport bus 143 (may not be implemented for single processor layer) and connected to additional processors or I/O devices bellow by HyperTransport bus 144. This combination of HyperTransport links creates a host interface together with tunnel implementations that is highly efficient low-latency multi-processor architecture that enables inter-processor coherent operation.

Additional side HyperTransport bus connection 149 may be implemented to enable efficient multi-processor implementations. Vendors may select to disable this connection for commercial or technical reasons to create models differentiation.

Loop-back of HyperTransport bus from the top CPU layer may pass through memory layer 30 via pass-through bus 105 and then passed through the CPU layer from the upper surface connection 146 to the lower surface connection 145.

I/O Layer 50 is shown here for reference only as it is not part of the core stack. Upper side HyperTransport loop-back connection 153 enables bridging between left side HyperTransport and center HyperTransport for the CPU layer positioned on top. The I/O HyperTransport connection 151 is typically connected to the HyperTransport Caves or tunnels located under that core stack in the I/O layers stack.

In general Torus topology is desired in order to get the fastest link between any two nodes in chained structure. Therefore, the last and the first nodes are usually connected together.

Although it is possible to avoid termination at the cover layer, by adding termination logic in each memory layer the current embodiment is preferred as it allows modularity. Alternatively functions of cover layer 20 is integrated into the last layer, for example memory layer 30.

FIGS. 17a and 17b illustrate core stack views of a preferred embodiment of a Single CPU 3DMC platform, made by putting together elements from FIG. 16. This implementation is the simplest core stack possible having a CPU layer 40 and one memory layer 30 forming the core stack. A cover layer 20 terminates the stack. This topology enables connection of 2 I/O chains to the core, first 151 connected directly to the processor core 142 and second 153 connected through the cover layer 20 loop-back bus.

The equivalent core stack logic view FIG. 17b shown on the right side illustrates this simple configuration having a single CPU core 142 and a single connected memory block 131.

FIGS. 18a and 18b illustrate core stack views of a preferred 1-Way Single CPU core 3DMC platform having three similar memory layers. The core stack of these figures is similar to the core stack of FIGS. 17a and 17b only this implementation uses three similar memory layers 30a, 30b, and 30c stacked on top of a single CPU core layer 40. The memory layers 30a, 30b, and 30c pass through and connect to the memory bus until it terminates at the top layer 20. FIG. 18b presents the core stack logic view illustrating the CPU core 142 and the three memory blocks 131a, 131b, and 131c connected on top. I/O direct bus 151 and looped back bus 153 enable various I/O connections at the I/O layers.

It should be clear to a man skilled in the art that the number of memory layers may vary using the same general construction according to the embodiment of the current invention, for example, one (as in FIGS. 17a and 17b), two, three (as in FIGS. 18a and 18b), four or more layers may be placed between CPU and cover layers.

Although it is possible to avoid termination at the cover layer, by adding termination logic in each memory layer the current embodiment is preferred as it allows modularity. Alternatively functions of cover layer 20 are integrated into the last layer, for example, memory layer 30c.

Figures 19A, 19B:
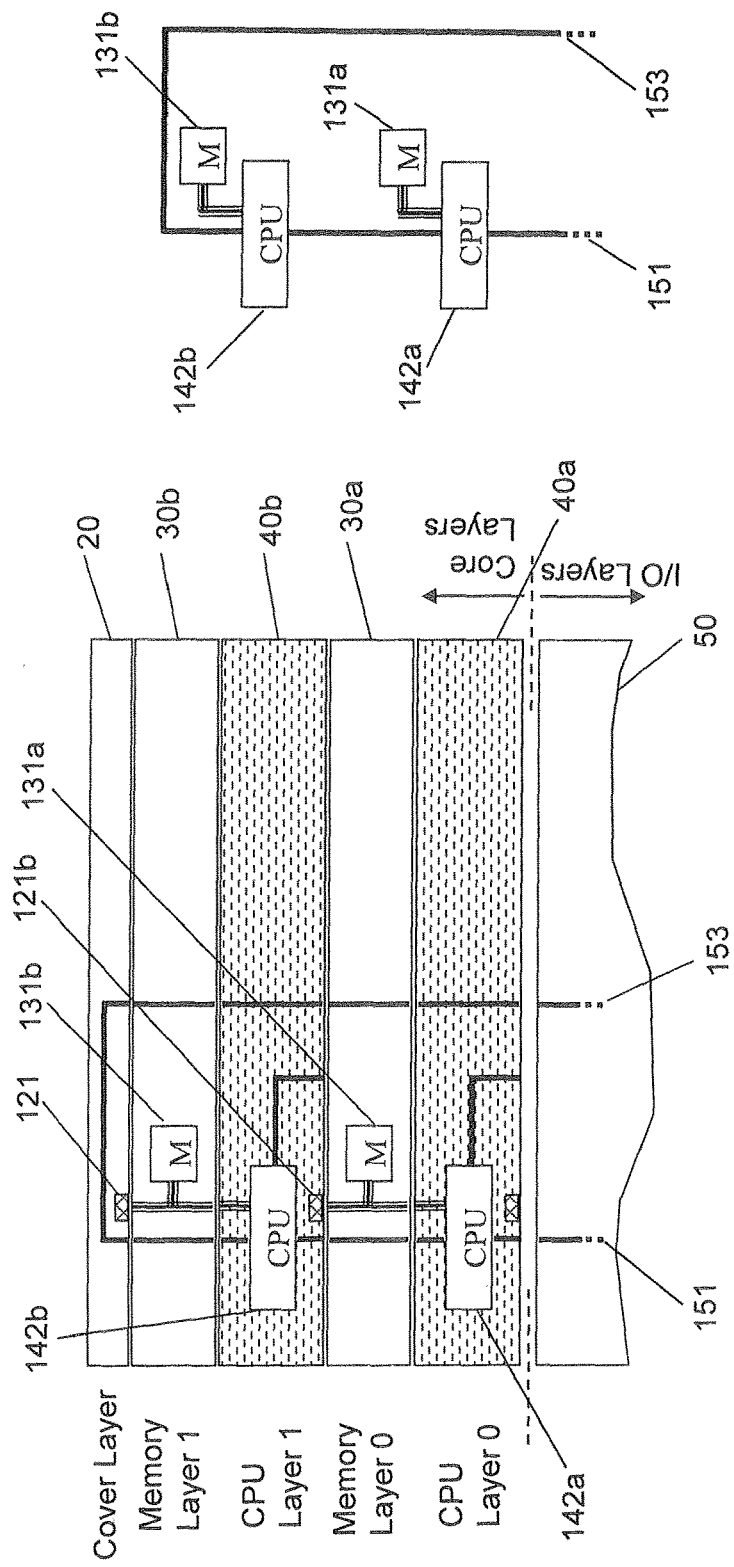
FIGS. 19a and 19b illustrate core stack views of a 2-CPU cores 3DMC platform built of two single CPU layers according to a preferred embodiment of the present invention.

FIGS. 19a and 19b illustrates core stack views of a preferred 2-CPU cores 3DMC platform built of two single CPU layers. In this figure each of the CPU layers 40a and 40b connected to a single memory layer 30a and 30b accordingly. The I/O bus 151 connected to the lower CPU Core 142a directly. Additional I/O bus 153 may be connected in looped back through the cover layer 20. The lower CPU Core memory bus is terminated at the upper CPU Core through termination 121b.

The third HyperTransport bus of the two CPU cores is typically not connected although it may be used in the I/O layer if needed for additional I/O caves.

The second CPU communicates with connected I/O primarily through the looped back connection at the cover but also through the first CPU. The HyperTransport implementing a tunnel—this type of transfer does not require any CPU intervention and therefore is transparent. Bandwidth of HyperTransport it is 3.2 GBps. and is not a cause of concern for less than four processors.

In the embodiment of the current invention, each CPU has at least one dedicated memory layer. Thus in actual implementations, there may be more than one memory layer for each CPU layer.

FIGS. 20a and 20b illustrate core stack views of a preferred 4-CPU cores 3DMC platform built of four single CPU layers according to the present invention; FIG. 20a illustrates the core stack view, and FIG. 20b illustrates the core stack logic view.

FIGS. 20a and 20b illustrate core stack views of a preferred 4-CPU cores 3DMC platform built of four single CPU layers in a similar manner to the previous figures. Each of the single CPU core layers 40a, 40b, 40c, and 40d are connected to a single memory layer 30a, 30b, 30c, and 30d, accordingly. To optimize processors interconnect, the upper processor core 142d is lopped back to the lower processor 142a side bus connection. This topology called Vertical Torus enables lowest latency coherent processors interconnect although other topologies may be implemented for commercial or technical reasons. To implement said topology a special loop-back 52 is built into the top I/O layer 51. This configuration enables a single bus connection to the core stack through 151. If additional I/O connection is desired, the lower CPU core 142a or any higher CPU core may be connected through the side bus connection to achieve this functionality.

Although it is possible to avoid termination at the cover layer, by adding termination logic in each memory layer the current embodiment is preferred as it allows modularity. Alternatively functions of cover layer 20 are integrated into the last layer, for example, memory layer 30d.

Figure 21:
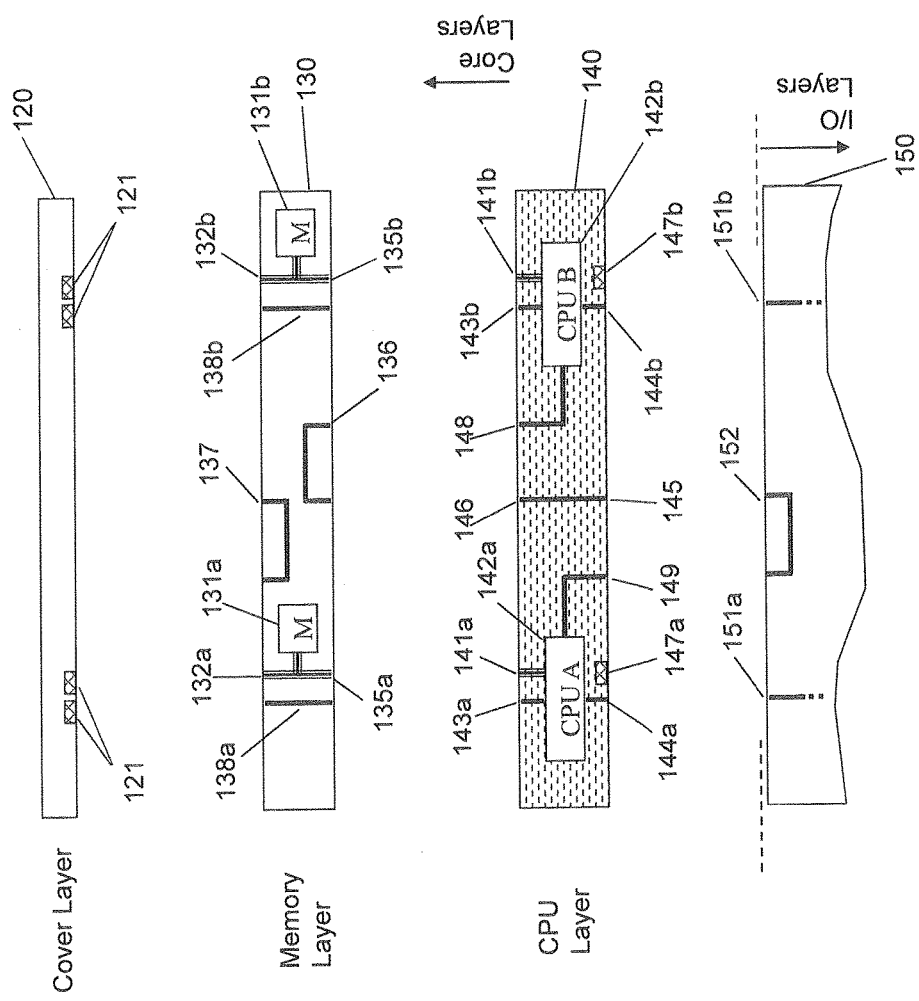
FIG. 21 illustrates the major components of a typical implementation of the present invention based on dual CPU per layer architecture according to the present invention.

FIG. 21 illustrates the major components of a typical implementation of the present invention based on dual CPU per layer architecture. The left side parts marked as FIG. 1a are the components schematic drawings. The right side parts marked as FIG. 1b are the simplified connection diagram of the same layers implementation. For the sake of clarity the two types of drawings will be used side by side.

Also to further simplify the drawings, infrastructure components such as thermal rods, power busses, management buses and sensors, testing circuitry, etc., are not shown here. The following set of figure presents only the high-level architecture of the layers and therefore many details were omitted.

In FIG. 21 cover layer 120 is the upper top layer of the whole stack. It comprises of passive or active terminations 121 of the various connected active busses (two Hyper-Transport and two Memory busses in this arrangement of the typical embodiment shown here).

Memory layer 130 is an example of a simplified dual processor compatible memory. Memory layer is comprising of two separate RAM banks: left side RAM 131a that is connected to CPU Core A side and right side RAM 131b that is connected to CPU Core B side. Memory bus with 64, 128 bit or any other memory bus implemented passes through the memory layer from the bottom side connection 135b to the top side connection 132b. Mirror image of passed through memory bus is implemented on the left side.

Passed-through HyperTransport Coherent busses 138a on the left side and 138b on the right side servers as inter-processors connection buses. These busses are used to interconnect CPU A of lower layer with CPU Core A side of the layer on top and similarly interconnecting CPUs on B side. Loop-back of HyperTransport bus on the lower side of memory layer 136 designed to return back HyperTransport bus signals from the lower CPU layer. In a similar way Loop-back of HyperTransport bus on the upper side of memory layer 137 designed to return back HyperTransport bus signals from the CPU layer positioned on top of that memory layer.

CPU layer 140 comprising of dual CPU cores—CPU Core A 142a on the left side in the figure, and CPU Core B 142b or the right side. Each CPU Core contains a CPU such as AMD Opteron, Memory controller to interface with the connected memory and fast bus links to interconnect with I/O and other CPUs. Fast bus links are typically Hyper-Transport with coherent interconnection to other CPU that enables each CPU to search for latest data in other CPU cache before accessing the slower memory banks. Connections 141a and 141b on the top side of the CPU layer enables memory layer interfacing with the left side CPU Core A 142a and right side CPU Core B 142b. HyperTransport upper connections 143a and 143b enables interconnection of upper positioned CPU layers to the two CPU Cores. Lower side HyperTransport connections 144a and 144b enables in a similar way interconnection of lower positioned CPU layers to the two CPU Cores. Termination 147a and 147b are passive or active terminations designed to terminate the memory busses from lower positioned memory layers.

Upward HyperTransport interconnect bus 148 enables side connection between CPU Core B to CPU Core A. Similarly on the right side downward HyperTransport interconnect bus 149 enables side connection between CPU Core A to CPU Core B through the other layers loop-back.

I/O Layer 150 is shown here for reference only as it is not part of the core stack. Upper side HyperTransport loop-back connection 152 enables bridging between left side HyperTransport and center HyperTransport for the CPU layer positioned on top. The 2 I/O HyperTransport connections 151a and 151b are connected to the HyperTransport Caves or tunnels located under that stack in the I/O layers.

The SMB is "Out-of-Band" management bus—it controls the layer operation without interfacing with that layer primary I/O. SMB may also be powered when all other primary 3DMC supply planes are powered off to enable certain detection, testing and configuration activities.

FIGS. 22a and 22b show a simplified block diagram of crossed memory module to enable crossed lateral inter-processor links according to the present invention.

FIG. 22a illustrates the Crossed Memory Layer in standard mode, while FIG. 22b illustrates the crossed Memory Layer in crossed mode.

FIG. 22a shows a simplified block diagram of crossed memory module to enable crossed lateral inter-processor links. This type of connection option becomes necessary in computer/server cores having three or more dual processor layers (6-way cores). Crossed lateral connection is necessary to assure that inter-processor links will pass through the shortest way possible between each two processors. Short links are necessary to assure low latency in cache coherency and I/O transactions.

FIG. 22a shows a crossed memory module 160b with two bus switches 136s and 137s in normal mode (non-crossed). In this mode the lower switch 136s is positioned to link the lower right bus connection 136r with the lower center bus connection 136c. The upper switch 137s is positioned to link the upper left bus connection 137l with the upper center bus connection 137c.

FIG. 22b shows a static crossed memory module 160b with two memory banks 131a and 131b that connected to the passed through memory bus 135a to 132a and 135b to 132b accordingly. Lower right surface bus connection 136r is crossed to upper surface left connection 137l and right connector 137r. Lower center surface bus connection 136c is connected to upper surface center connection 137c.

While this type of layer is simple, it does not allow the usage of such layer as a standard memory layer. The unique crossing function makes it non-interchangeable with the other memory layers in the stack. To resolve this problem crossed layer may contain certain bus switches to enable inter-changeability and free stacking at the price of additional circuitry. Bus switches may be implemented using near-zero propagation delay CMOS switches.

The bus switches implementation enables stacking of multiple memory layers on one CPU layer while maintaining the crossed bus configuration. Layer switches are statically managed by the management computer 338 and configured properly during the post-build system setup.

Figure 23:
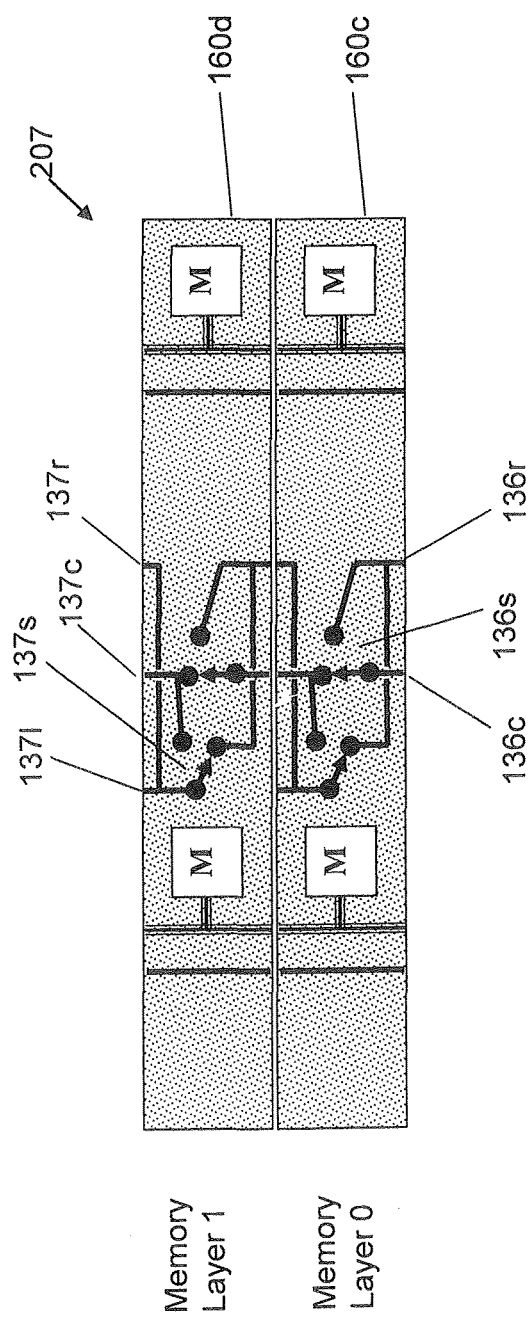
FIG. 23 shows two stacked memory modules, both configured in a crossed mode, for use, for example, with Dual CPU Core Components according to an embodiment of the current invention.

FIG. 23 shows two stacked memory modules 160c and 160d, both configured in a crossed mode, for use for example, with Dual CPU Core Components according to an embodiment of the current invention.

Figure 24:
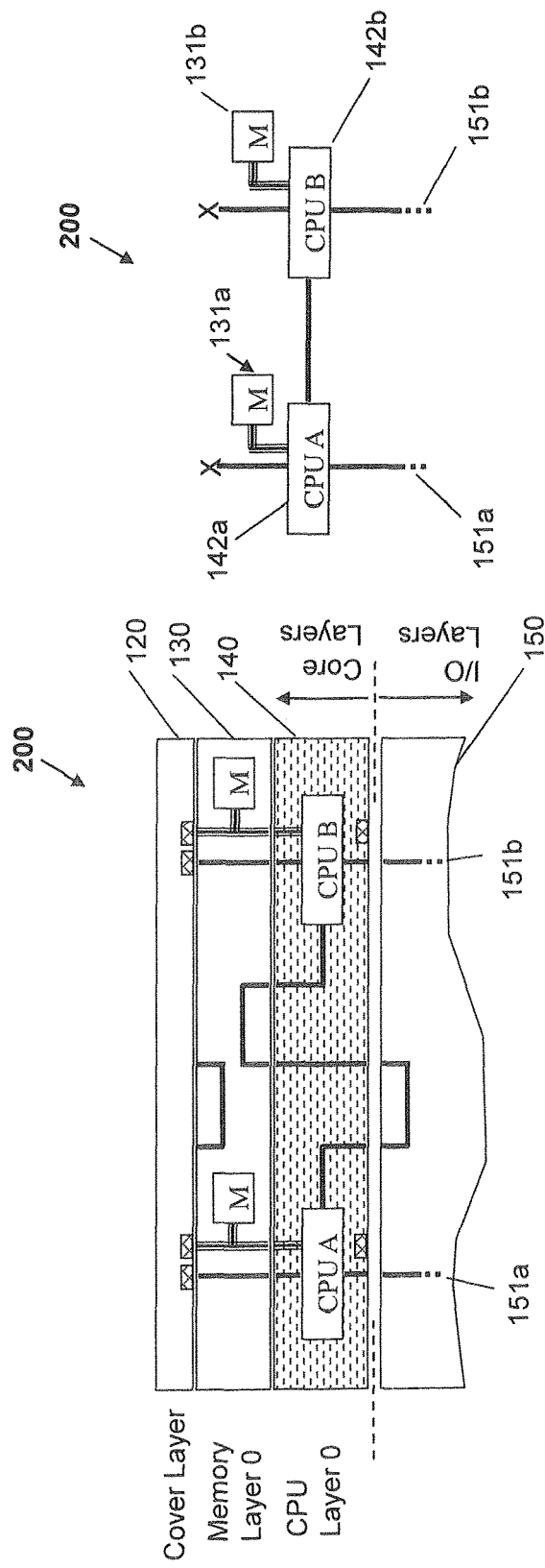
FIGS. 24a and 24b present a typical core stack of a dual processor (2-Way) configuration having one CPU layer and one memory layer according to an embodiment of the present invention; core stack side view and core stack logic view, respectively.

FIGS. 24a and 24b present a typical core stack of a dual processor (2-Way) configuration 200 having one CPU layer 140 and one memory layer 130. Processors lateral interconnection is achieved through the I/O layer 150 on the lower side and through the memory layer 130 on the upper side. Two I/O busses are available at the I/O layer 150.

The structure implemented in this typical dual processor architecture offers a highly standardized and scaleable solution. It enables building a wide range of computer/server combinations using same CPU layers and same memory layers. Same layers can be used to assemble anything from 2-way to 12-way core with one or more same memory layers for each CPU layer. Combining these capabilities with powerful 64 bit processors and fast HyperTransport Coherent busses provides a strong computational core.

Figure 25:
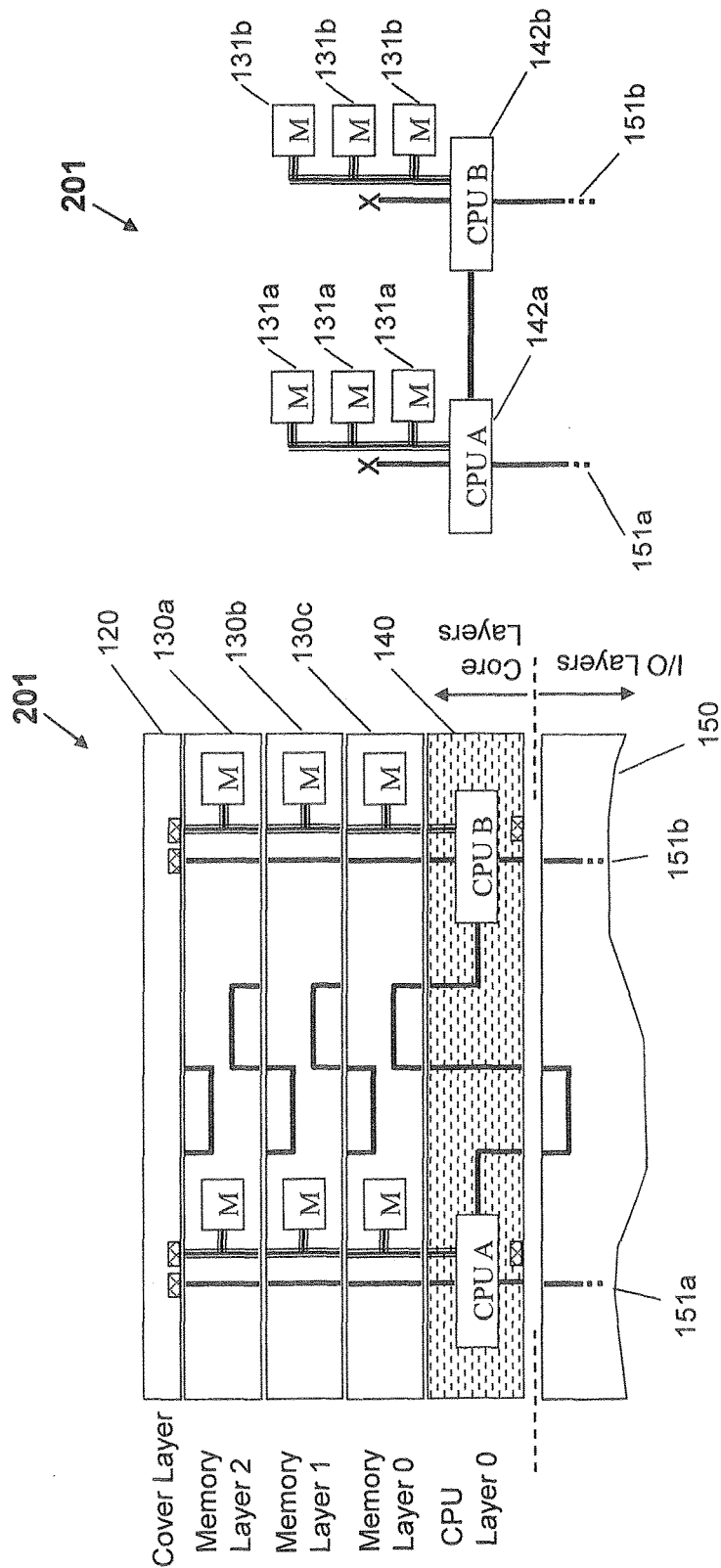
FIGS. 25a and 25b present a typical core stack of a dual processor (2-Way) configuration having one CPU layer and three memory layer according to an embodiment of the present invention; core stack side view and core stack logic view.

FIGS. 25a and 25b illustrate a similar configuration to the one shown in FIGS. 24a and 24b only at this particular core configuration 201 there are three memory layers 130a, 130b, and 130c stacked on top of the dual CPU layer 140. This configuration illustrates the 3DMC scalability through memory expansion.

Figure 26:
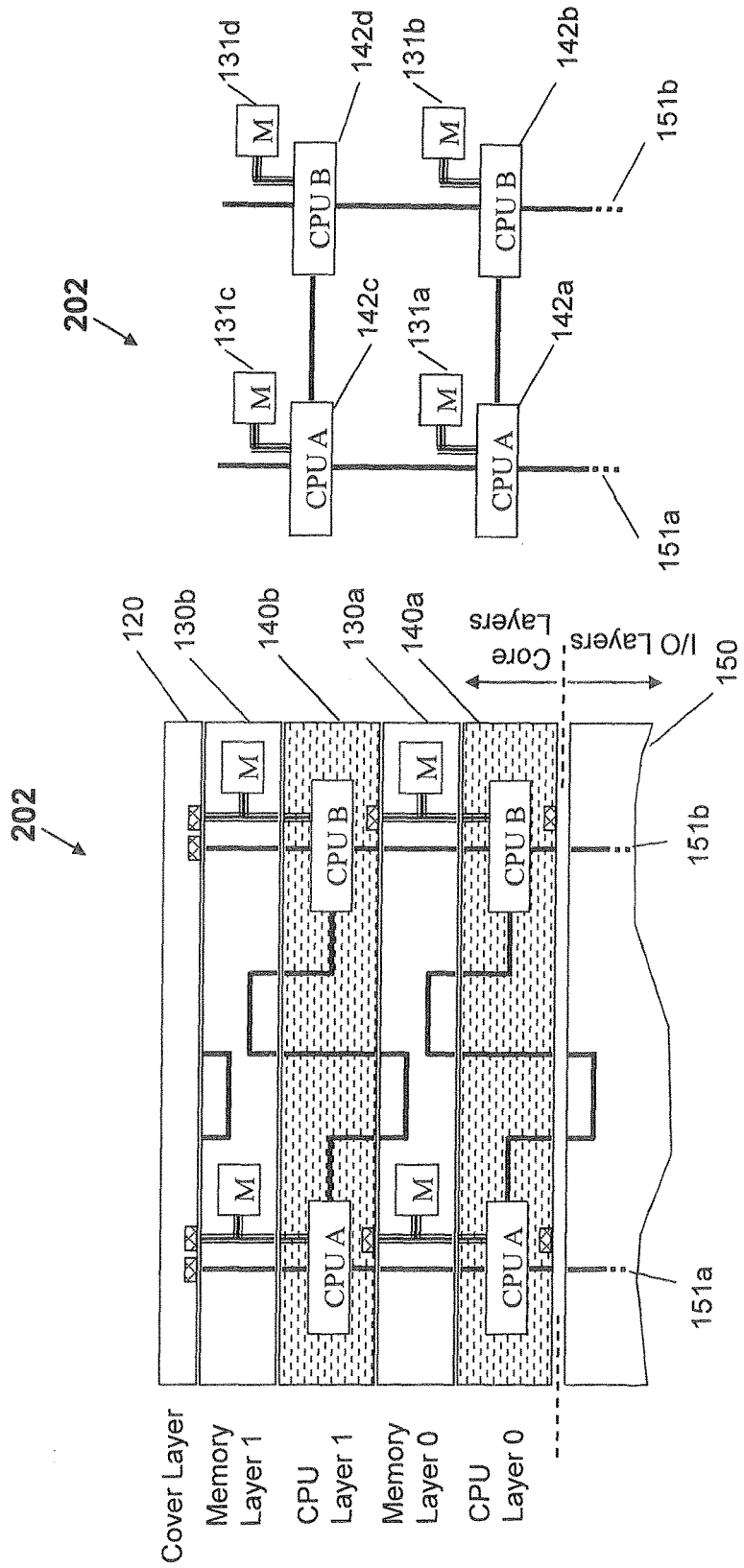
FIGS. 26a and 26b illustrate yet another configuration of a typical 3DMC embodiment of the present invention having four CPUs (4-Way) arranged in two dual CPU layers according to an embodiment of the current invention, wherein lateral CPU interconnect is achieved through loop-back in the memory layers bellow and above that CPU layer.

Reference is now made to FIGS. 26a and 26b illustrating yet another configuration of a typical 3DMC embodiment of the present invention 202 having four CPUs (4-Way) arranged in two dual CPU layers according to an embodiment of the present invention, wherein lateral CPU interconnect is achieved through loop-back in the memory layers bellow and above that CPU layer; FIG. 26a illustrates the core stack side view, while FIG. 26b illustrates ore stack logic view.

This particular configuration has four CPUs (4-Way) arranged in two dual CPU layers 140a and 140b. The lateral CPU interconnect is achieved through loop-back in the memory layers bellow and above that CPU layer. Again two I/O busses are available at the I/O layer 150.

Figure 27:
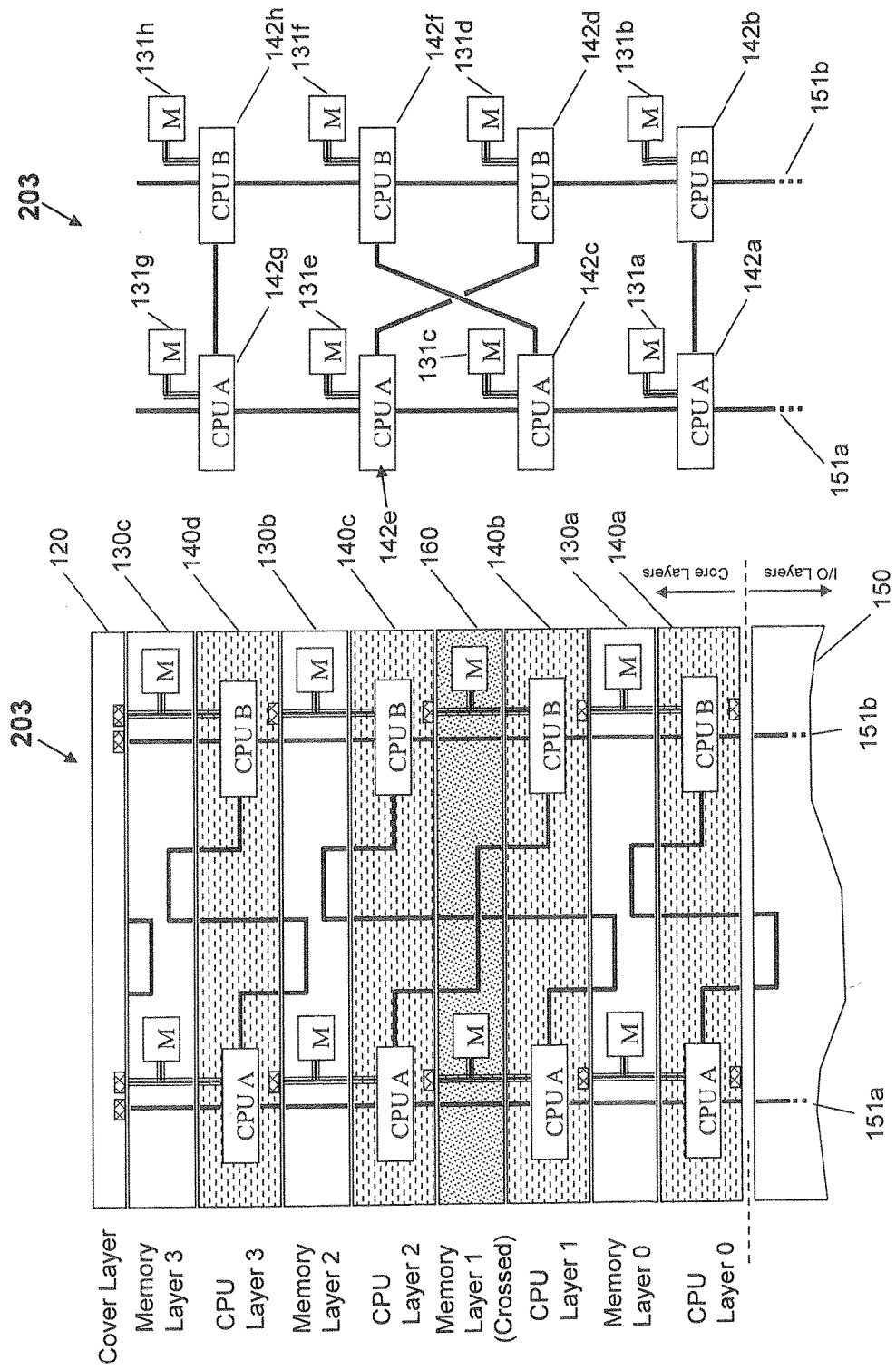
FIGS. 27a and 27b illustrate a configuration of a 3DMC having 8 CPUs (8-Way) arranged in four identical dual CPU layers according to a preferred embodiment of the present invention; core stack side view and core stack logic view.

FIGS. 27a and 27b illustrate a configuration of a 3DMC having eight CPUs (8-Way) arranged in four identical dual CPU layers according to a preferred embodiment of the current invention wherein each of these dual CPU layers connected to one dual memory layer add wherein the second memory layer is switched to a crossed memory mode to enable proper CPU interconnection layout; FIG. 27a illustrates the core stack side view, while FIG. 27b illustrates one stack logic view.

These figures illustrate a larger configuration of a preferred 3DMC embodiment of the present invention 203. This particular configuration having eight CPUs (8-Way) arranged in four identical dual CPU layers 140a, 140b, 140c, and 140d. Each of these dual CPU layers connected to one dual memory layer 130a, 130b and 130c. The second memory layer 160 is switched to a crossed memory configuration to enable proper CPU interconnection layout. The crossed configuration interconnects CPU Core A 142c in CPU layer 140b with CPU Core B 142f in CPU layer 140c and similarly CPU Core 142d with CPU Core 142e. This 3DMC embodiment also provides two I/O busses at the lower I/O layer 150.

Figure 28:
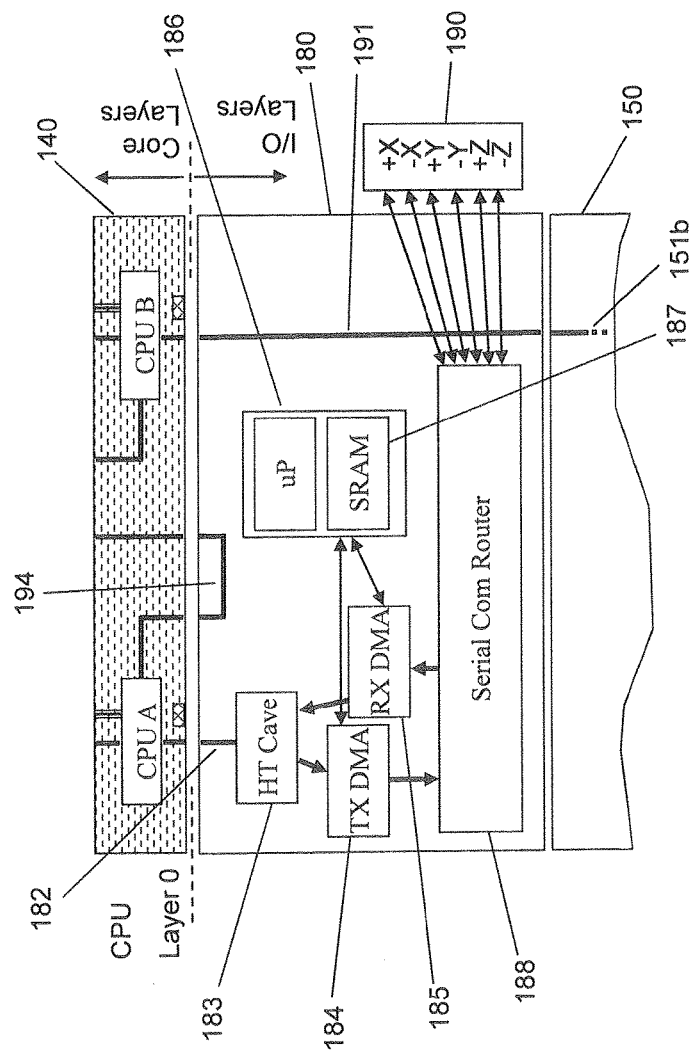
FIG. 28 illustrates an MPP PE 3D Node Interface layer block diagram in accordance with a preferred embodiment of the present invention.

FIG. 28 illustrates a layer cross-sectional view of 3DMC Massively Parallel Processing (MPP) Processing Element (PE) 3D interface layer. This layer can be added between the core stack and the I/O stack to specifically adapt the 3DMC to function as a Processing Element node in MPP system. 3DMC may ideally suited MPP due to the higher density and easier 3D implementation. As 3DMC can implement multiprocessor coherent platform internally, the resulting model may be highly effective to implement both multiprocessor and multi-computer architectures in the same system.

The following describes the architecture and functions a 3DMC cores used as PE nodes in first-phase massively parallel processing (MPP) system. The full MPP system typically contains hundreds or thousands of microprocessors, each accompanied by a local memory. These systems are typically designed to support two styles of MPP programming: data parallel and message passing. Data parallel programs, such as High Performance Fortran (HPF), are designed to provide a programmer with ease of use while still utilizing fair percentage of MPP theoretical peak performance. Message passing programs, such as parallel virtual machine (PVM) messaging, provide a higher percentage of peak MPP performance. The following 3DMC implementation is optimized for message passing in 3D mesh topology. With minor changes this implementation may be adapted to function in data parallel mode as well.

In a multi-computer MPP each PE is considered a stand-alone computer with its own central processor, local memory, and associated control logic. Each PE can only address its own local memory. It cannot directly read or write the local memory associated with another PE but instead must read data from another PE's memory by sending a message in an I/O-like packet to the target PE requesting that some data from its memory be formatted and sent back to the requesting PE, or vice versa for writes. Thus in a multi-computing system, each remote reference is essentially an I/O operation involving the target PE. This style of inter-processor communications is called "message passing." Message passing is a well-known and prevalent MPP programming model because multi-computers are relatively easy to build. The ease of construction of a multi-computer MPP arises from the use of commodity microprocessors in an environment that closely resembles their "natural habitat" (i.e., that hardware and software implementation envisioned by the microprocessor designers), that is, a network of small autonomous computers. To enable message passing interface in a 3DMC structure, a special interface layer 180 may be added to the 3DMC core stack.

The interface layer comprises of HyperTransport Cave 183 to interface between the CPU Core/s above and the message passing network below. The HyperTransport cave 183 transfers data through two Direct Memory Access (DMA)-one for transmitted data 184 and another one for received data 185. The DMA engines provide support for transferring data between the network and memory while providing support for the message packetization needed by the network. They also provide hardware support for reliability functions such as an end-to-end 32 bit CRC check. This augments the extremely high reliability provided by a 16 bit CRC check (with retries) that is performed on each of the individual links.

To optimize network tasks a small microprocessor 186 is integrated with fast SRAM array 187 that temporarily stores traffic components and reliability data. The microprocessor 186 may be RISC architecture such as MIPS, ARM or PowerPC. This microprocessor enables fast packet headers and reliability features handling off-loading the host processor/s. Additionally the microprocessor 186 is responsible for the 3DMC PE support functions necessary to provide Reliability, Availability, and Serviceability (RAS) and boot services.

The router 186 connected to the two DMA engines 184 and 185 have six downstream ports to enable 3D mesh networking. Outgoing packets are routed to their destination PE node through the best directional output using mesh 3D mapping. Ingoing packets intended for that PE are received and delivered to the DMA engine 184 and 185 for further processing. Typical physical links in the 3D topology support up to 2.5 GB/s of data payload in each direction. This accounts for overhead in both the 64 byte packets used by the router and the reliability protocol on the individual links. The interface to the Opteron typically uses 800 MHz Hyper-Transport, which can provide a theoretical peak of 3.2 GB/s per direction with a peak payload rate of 2.8 GB/s after protocol overheads (and a practical rate somewhat lower than that). The router is directionally connected through a flexible PCB 190 to the neighboring PE nodes using +X, 'X, +Y. -Y, +Z and -Z ports. Although the router's six directional ports may be routed through the base layer, in this particular example directional routing is done through mid-layer flex PCB wiring that attached to the 3DMC six faces as will be described in details in the next two figures.

Additional HyperTransport pass-through bus 191 enable connection of additional standard I/O layers underneath if needed.

Figure 28A:
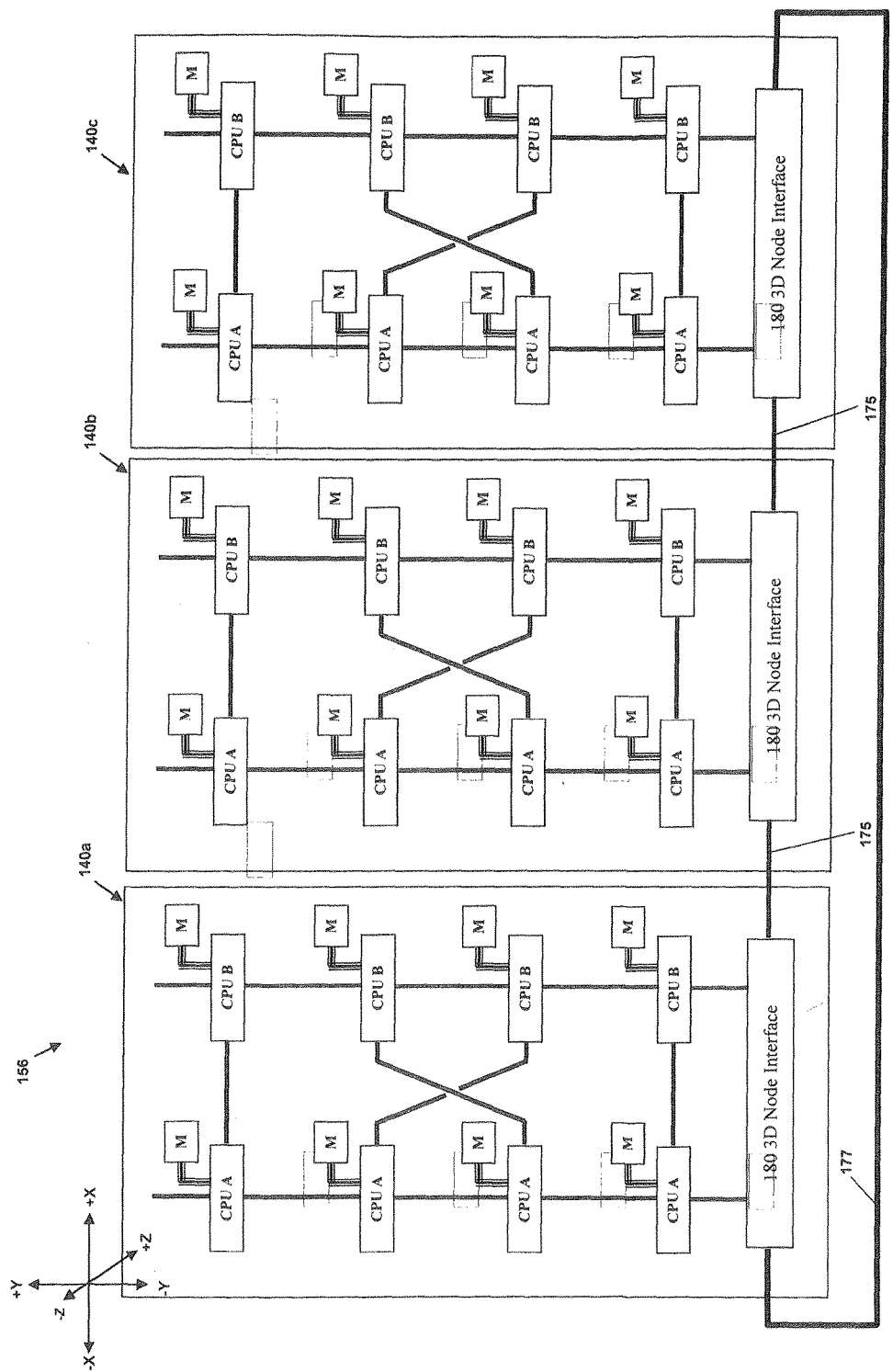
FIG. 28a illustrates a simplified block diagram of a 2D torus using three 8-Way 3DMC MPP PEs in accordance with a preferred embodiment of the present invention.

FIG. 28a illustrates a simplified block diagram of a 2D torus 156 using three 8-Way 3DMC MPP PEs 140 of the present invention. The three PEs are cross-connected in the X axis with interconnect 175. PE 140a-X axis and PE 140c+X axis are interconnected using horizontal cable link 177.

This simplified structure can be replicated in both the vertical and the horizontal plane to form a large 3-dimensional MPP PE mesh with 3D torus form. As each PE is made of multiple tightly connected CPUs, the combined system is a 2D mesh inside a 3D mesh. This structure can be highly optimized for intensive parallel processing using proper operating and control systems and special compilers.

Figure 29:
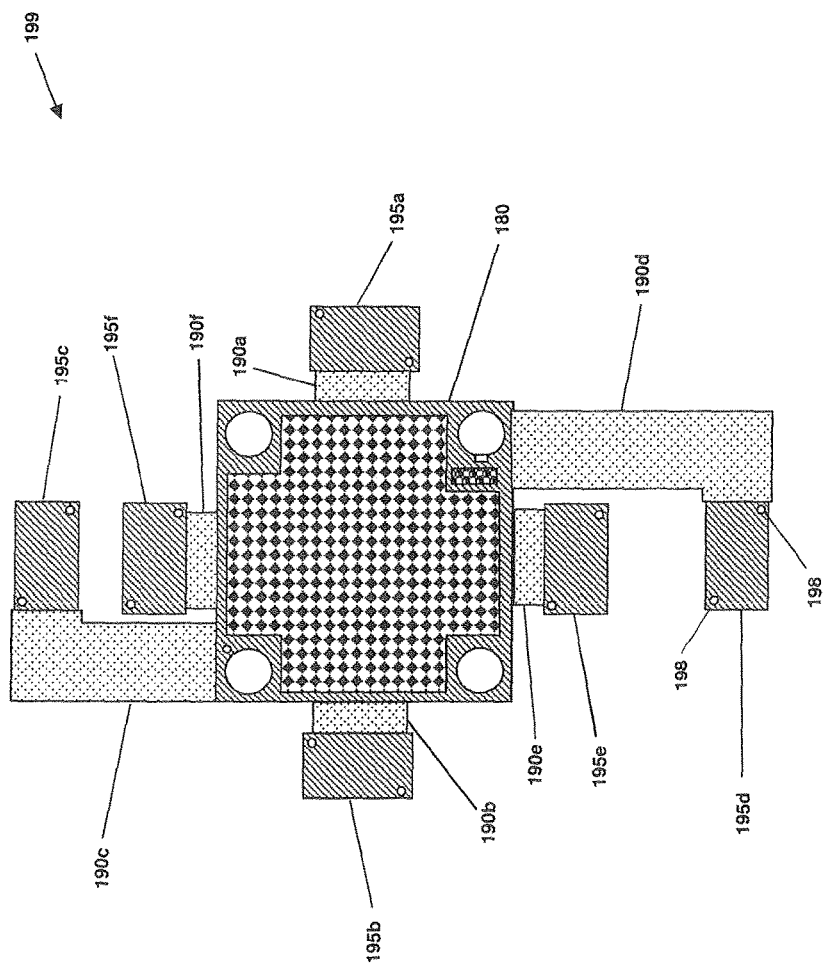
FIG. 29 illustrates a flat view of implementing 3DMC MPP PE 3D Node Interface depicting the six 3D flexible PCB wiring before it is fixed to the 3DMC cube faces according to a preferred embodiment of the present invention.

FIG. 29 illustrates a flat view 199 of a preferred implementation of 3DMC MPP PE 3D Node Interface 180. This view presents the six 3D flexible PCB wiring before it is fixed to the 3DMC cube faces.

Flexible wiring 190a and interconnect rigid PCB pads 195a extends outside of the interface layer 180 to the +X axis. Flexible wiring 190b and interconnect rigid PCB pads 195b extends outside of the interface layer 180 to the -X axis. Flexible wiring 190c and interconnect rigid PCB pads 195c extends outside of the interface layer 180 to the -Y axis. The flexible part 190c is longer to enable it to reach the lower surface of the 3DMC under the base layer. Flexible wiring 190d and interconnect rigid PCB pads 195d extends outside of the interface layer 180 to the +Y axis. The flexible part 190d is longer to enable it to reach the upper surface of the 3DMC. Flexible wiring 190e and interconnect rigid PCB pads 195e extends outside of the interface layer 180 to the +Z axis. Flexible wiring 190f and interconnect rigid PCB pads 195f extends outside of the interface layer 180 to the -Z axis. The six flex PCBs and connected rigid pads area enable loose attachment to the 3DMC faces. Two or more guiding sockets 198 on each rigid pad area enable precision mechanical alignment with the connected neighboring 3DMC.

Figure 30:
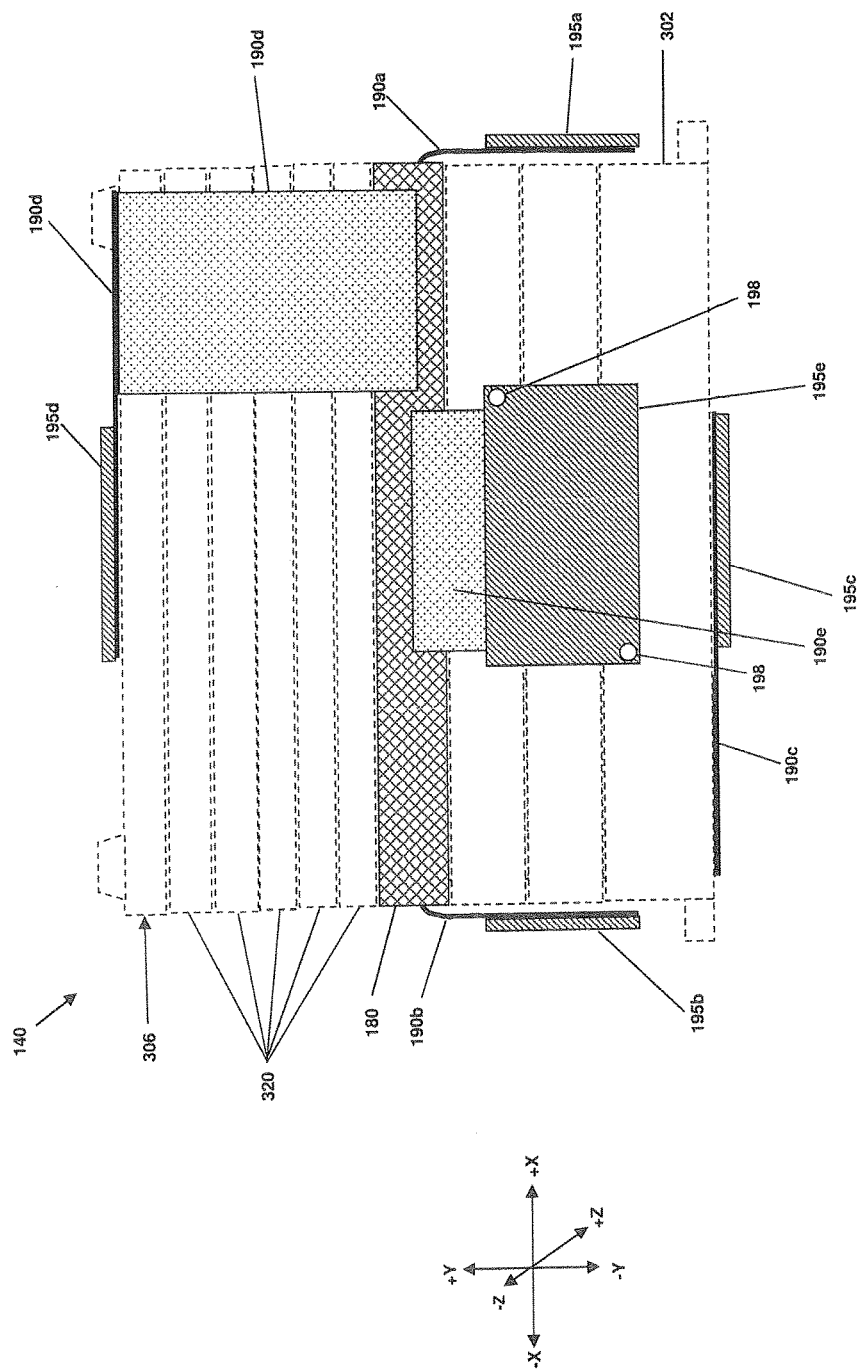
FIG. 30 illustrates the MPP PE 3-D Node Interface assembled on 3DMC illustrating the flexible PCB of the MPP PE 3-D Node Interface that are attached to the faces of the 3DMC cube according to an embodiment of the present invention.

FIG. 30 illustrates the MPP PE 3-D Node implementation 140 comprising of 3DMC stack having Interface layer 199 assembled on it. In this illustration the flexible PCB of the MPP PE 3D Node Interface 180 is attached to the six faces of the 3DMC cube to enable 3DMC chaining in the six directions. Flex PCB 190a, 190b, 190e and 190f are bent down and attached at the sides of the 3DMC to connect the rigid part with the network connection pads or connector 195a, 195b, 195e and 195f. The two longer flex PCB 190c and 190d are bent up and down and connect to the rigid parts located at the upper and lower surfaces of the 3DMC. The rigid part is secured to the 3DMC faces using free displacement (floating link) feature to enable some guidance through guiding pins to accurately position these surfaces before interconnect mating.

Figure 31:
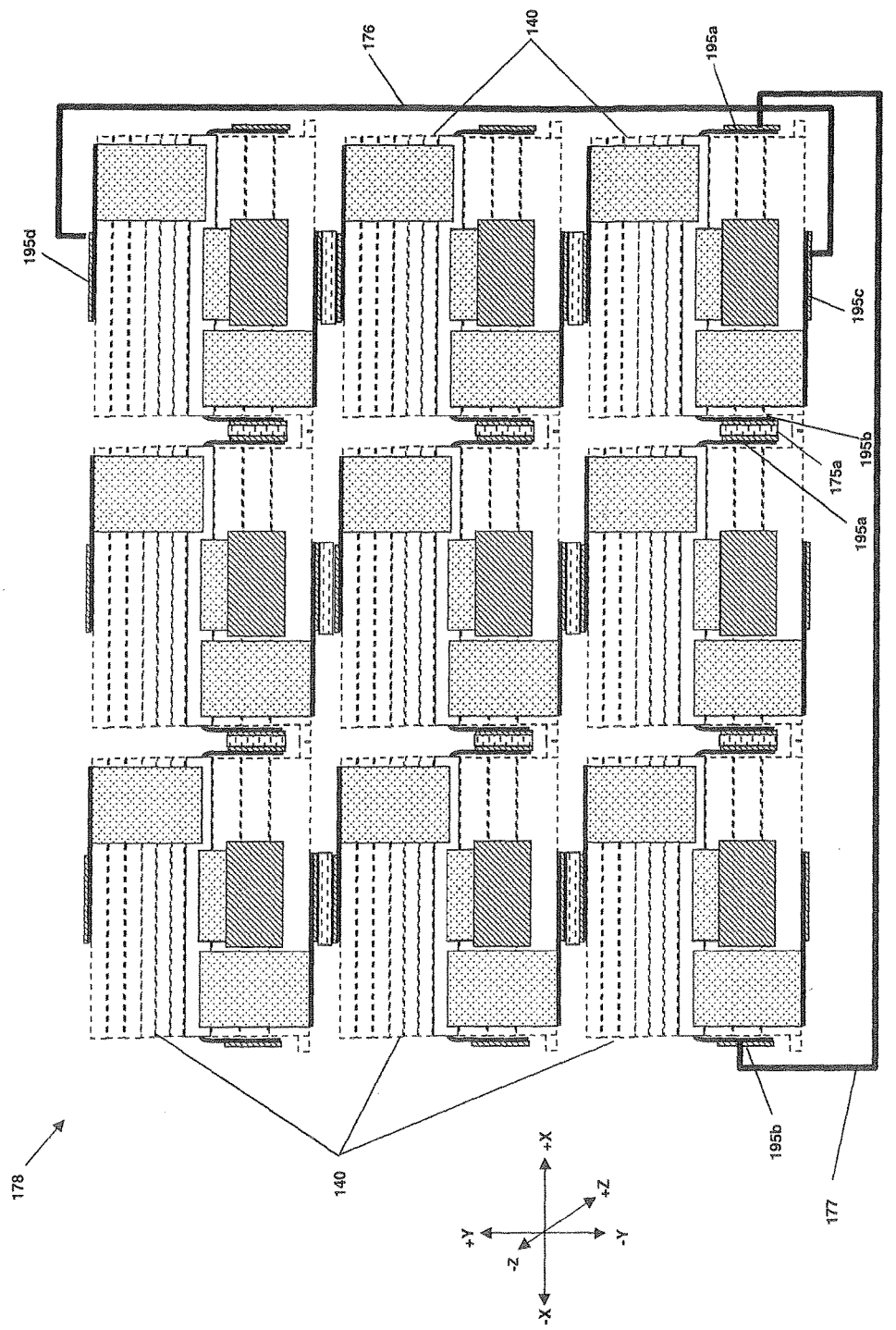
FIG. 31 illustrates MPP system 3D mesh implementation using 3DMCs with PE 3D Node Interface according to an embodiment of the present invention.

FIG. 31 illustrates 3DMC based MPP system 3D mesh implementation 178 using multiple 3DMCs PEs 140 interconnected to neighboring PE by 3D Node Interfaces 195. Referring now to the lower row in the figure. The lower right 3DMC based MPP PE 3-D Node 140 is interconnected to the neighbor lower center 3DMC MPP PE 3-D Node 140 via interconnect rigid PCB pads 195*b*, PE interconnect layer 175 and left side interconnect rigid PCB pads 195*b* of the neighbor 3DMC node 140. Similarly the 3DMC MPP PE 3-D Node 140 interconnected to the lower positioned neighbor 3DMC MPP PE 3-D Node 140 via interconnect rigid PCB pads 195*c*, PE interconnect layer 175 and lower side interconnect rigid PCB pads 195*a*. In this 2-dimensional drawing each 3DMC MPP PE 3-D Node 140 is connected to its neighboring nodes at X and Y axis. Although not visible in this drawing—the 3DMC MPP PE 3-D Nodes 140 are also interconnected in the Z axis to neighboring nodes. In order to create a torus topology, the outer nodes in each line and column is interconnected to the opposite end of that column or line. For example, the upper right node 140 is interconnected to the lower right node via lower side interconnect rigid PCB pads 195*c*, vertical torus interconnection cable 176 and upper side interconnect rigid PCB pads 195*d* of the lower right node. Similarly horizontal torus interconnection cables 177 connects outer upper nodes with outer lower nodes.

Figure 32:
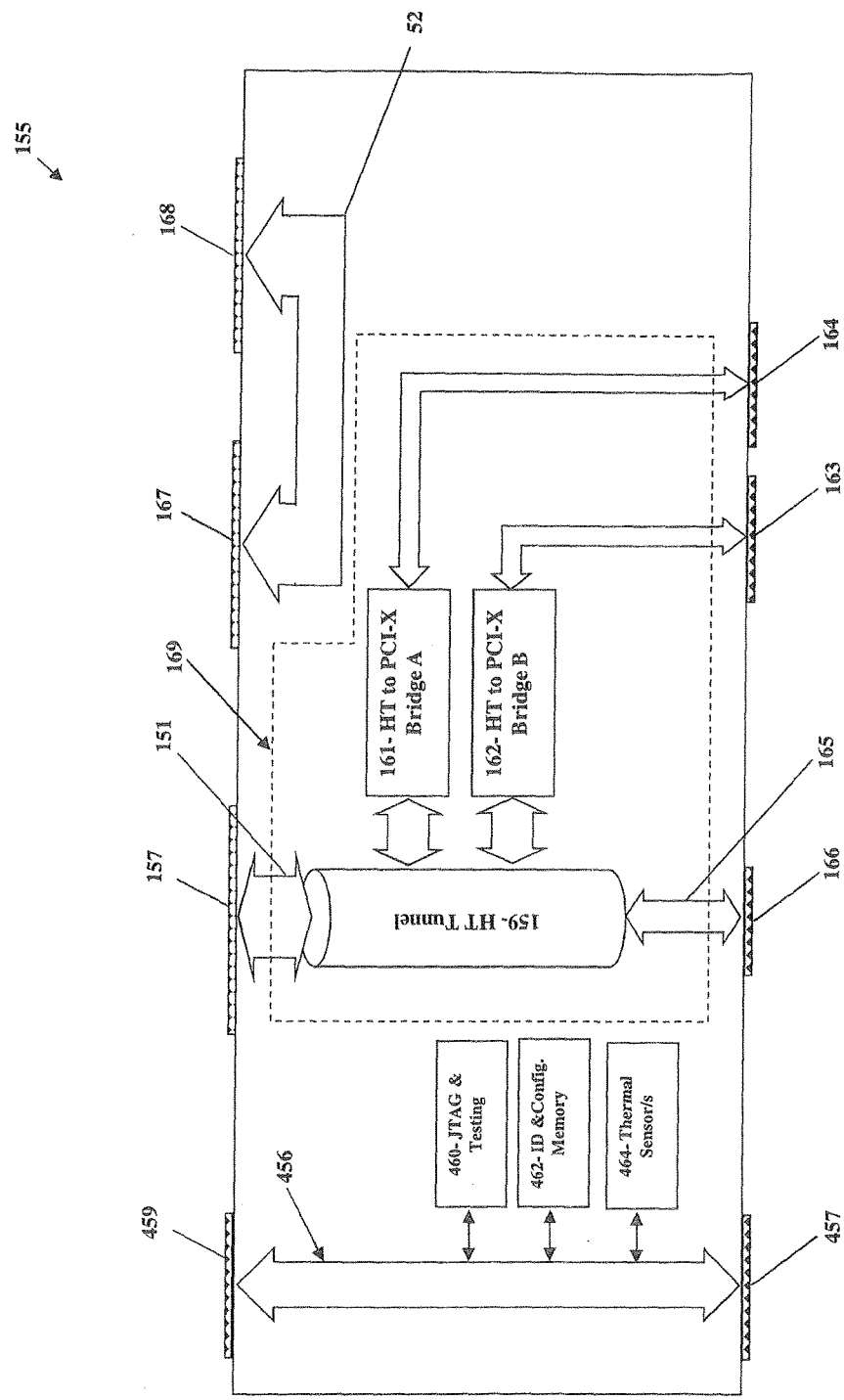
FIG. 32 illustrates an example of 3DMC HyperTransport to dual PCI-X I/O layer block diagram according to an embodiment of the present invention.

FIG. 32 illustrates an example of 3DMC I0 layer. This figure specifically illustrates HyperTransport to dual PCI-X I/O layer block diagram. This relatively simple layer that may be interfaced with a single CPU core per layer stack or dual CPU cores per layer stack as shown in FIGS. 16-20 and 24-27 with minor changes.

Layer 155 designed to be the upper I/O layer interfacing with the core stack through host HyperTransport bus interconnect pads 157 at the layer upper surface. This HyperTransport bus 151 is typically 16 bit in/16 bit out to provide a maximum of 6.4 GBps of aggregated bandwidth. The host HyperTransport bus 151 connected internally to HyperTransport Tunnel 159. The Tunnel feeds two bridges from HyperTransport to PCI-X busses designated as bridge A 161 and bridge B 162. The PCI-X side of the bridges is connected to the PCI-X bus interconnect pads at the layer lower surfaces designated as 164 for A and 163 for B. These PCI-X busses are used at lower I/O layers for various I/O interfaces such as network and storage.

The other end of the HyperTransport tunnel 159 is connected through HyperTransport bus 165 to the HyperTransport bus interconnect pads 166 at the layer lower surface. This bus is typically restricted to 8 bit in/8 bit out to provide maximum of 3.2 GBps of aggregated bandwidth. This bus may be used by lower I/O layers for additional HyperTransport tunnels or cave.

It is possible to include more than one channel of HyperTransport host interface in order to provide additional downstream PCI-X busses is needed for multi-processor 3DMC stacks.

The SMB buss/es 456 are passed through the layer similar to the memory layer presented in FIG. 15. Connected modules may provide layer identification and parameters, thermal conditions, power required, testing services, etc.

Looped-back HyperTransport bus 52 may be implemented to interconnect processors at the core stack above.

The HyperTransport tunnel and dual PCI-X bridge functionality 169 described in this exemplar I/O layer may be found in standard Chipsets such as AMD 8131.

Figure 33:
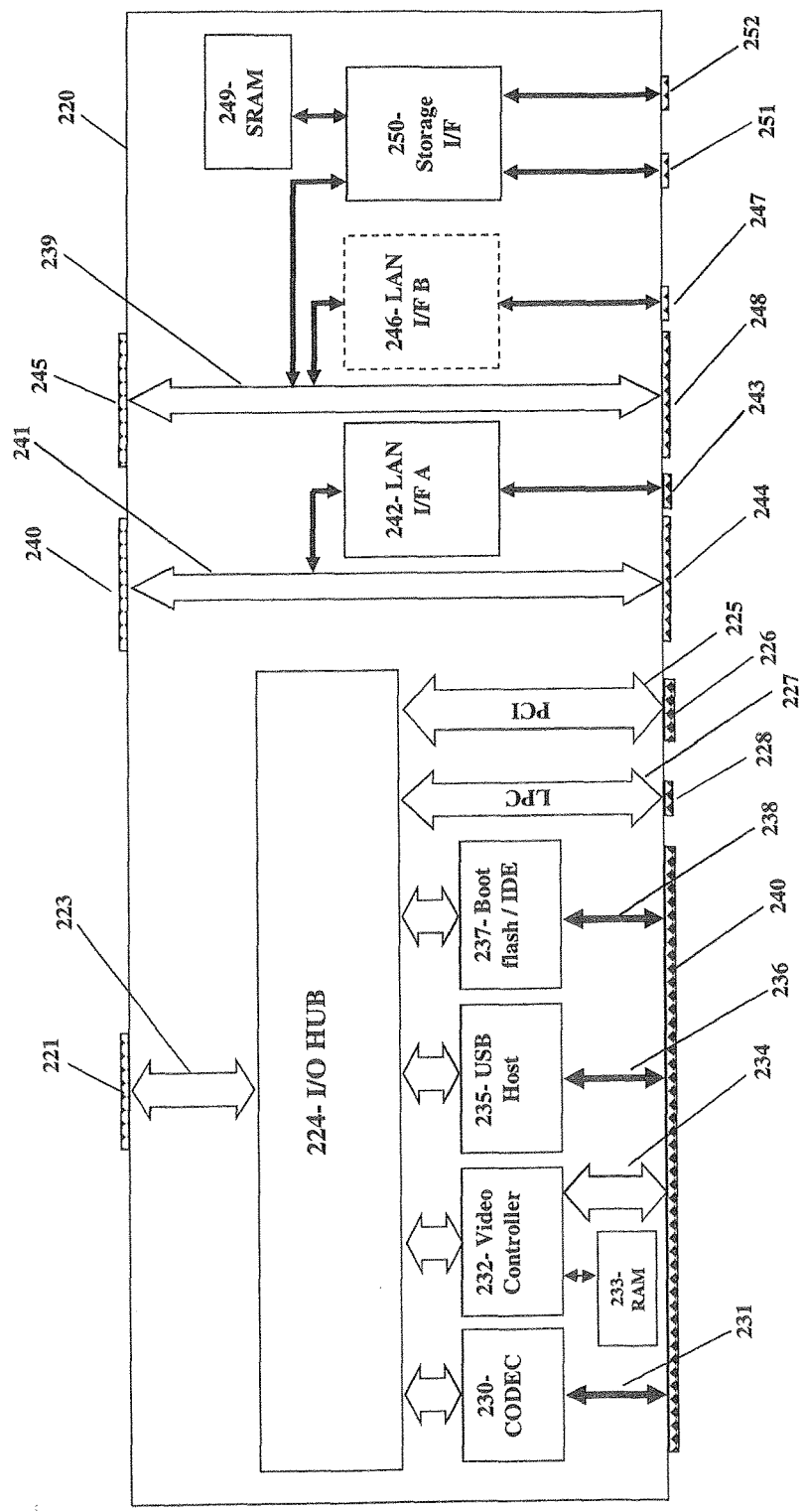
FIG. 33 illustrates an example of 3DMC PCI-X I/O Hub and Dual LAN layer block diagram according to another embodiment of the present invention.

FIG. 33 illustrates an example of 3DMC PCI-X I/O Hub and Dual LAN layer block diagram according to another embodiment of the current invention.

FIG. 33 illustrates a second example of I/O layer. This layer 220 may be stacked under the layer 470 presented in the previous figure. The primary inputs to this layer are the restricted I/O HyperTransport bus of the I/O tunnel layer above and the one or more PCI-X of that layer. To simplify this figure the SMB bus and connected modules were omitted.

Restricted I/O HyperTransport bus is connected to the layer through the interconnect pads 221 at the upper surface of the layer. The HyperTransport bus 223 is typically 8 bit in/8 bit out. The connected legacy I/O Hub 224 is primarily a HyperTransport cave connected to a PCI/LPC bridge internally. The hub may be similar to AMD 8111 or other standard chipsets. The Hub is connected through AC97 type interface to Audio Codec or Codec emulator for KVM 230. The Audio in and Audio out of the Codec 231 are connected to the Legacy ports interconnect pads 240 at the lower surface of the layer. These ports are typically connected to the base layer but may be passed through additional I/O layers if needed.

Additional module connected to the I/O Hub 224 is the video controller 232. This controller may have attached video memory RAM 233 to store displayed pages. The video controller output 234 is typically LCD digital video, LVDS, Analog video or DVI. If no local video output is needed, the video controller functions may be emulated to simplify the interface to the KVM function at the base layer. Video output is passed to the base through the Legacy ports 240. In case that stronger video performance is needed, the video controller may be implemented on the PCI-X bus instead of PCI bus attached to the I/O Hub. This type of architecture will assure better graphical bandwidth from the video controller to the host memory.

Another module connected to the I/O Hub 224 is the USB Host controller 235. This controller 235 enables connection of local or remote USB devices such as keyboard and mouse. Controller may have just one port or multiple ports if needed. USB protocols 236 supported may be USB 1.1 standard USB 2.0 or any other common standard. USB port/s are also connected to the Legacy ports 240 to connect to the base layer.

Another (optional) module connected to the I/O hub 224 is the IDE interface 237 that connected to the Legacy ports 240. This port may have internally boot flash of 512 MB to 10 GB to enable local OS boot.

The two downstream busses of the I/O hub 224—the Low PIN Count (LPC) bus 227 and the PCI bus 225 are also connected through the lower face interconnect pads 228 and 226.

One or two PCI-X 241 and 239 are passed through the layer 220 from the upper surface 240 and 245 to the lower surface interconnect pads 224 and 248. This 64 bit bus typically supports 133, 100 and 66 MHz transfer rates.

First bus 241 is connected to the LAN interface A 242. This LAN interface is typically a Giga LAN or higher MAC, RAM and Physical layer modules. A second primary LAN interface B 246 may be added if needed. The two LAN ports are connected through the layer lower surface interconnect pads 243 and 247 to enable connection of LAN cabling to the base layer. The LAN filtering and magnetics is usually located at the base layer to avoid high voltage isolation modules in the I/O layers.

Storage interface module 250 is optionally added to enable connection to SATA, Fiber Channel (FC), Infiniband or SCSI remote disks. The storage interface module 250 may have additional SRAM 249 to support buffers and firmware storage.

Due to the structure of this layer, any layer stacked below it must pass-through all legacy ports, LAN/s, Storage, LPC, PCI and PCI-X busses.

Figure 34:
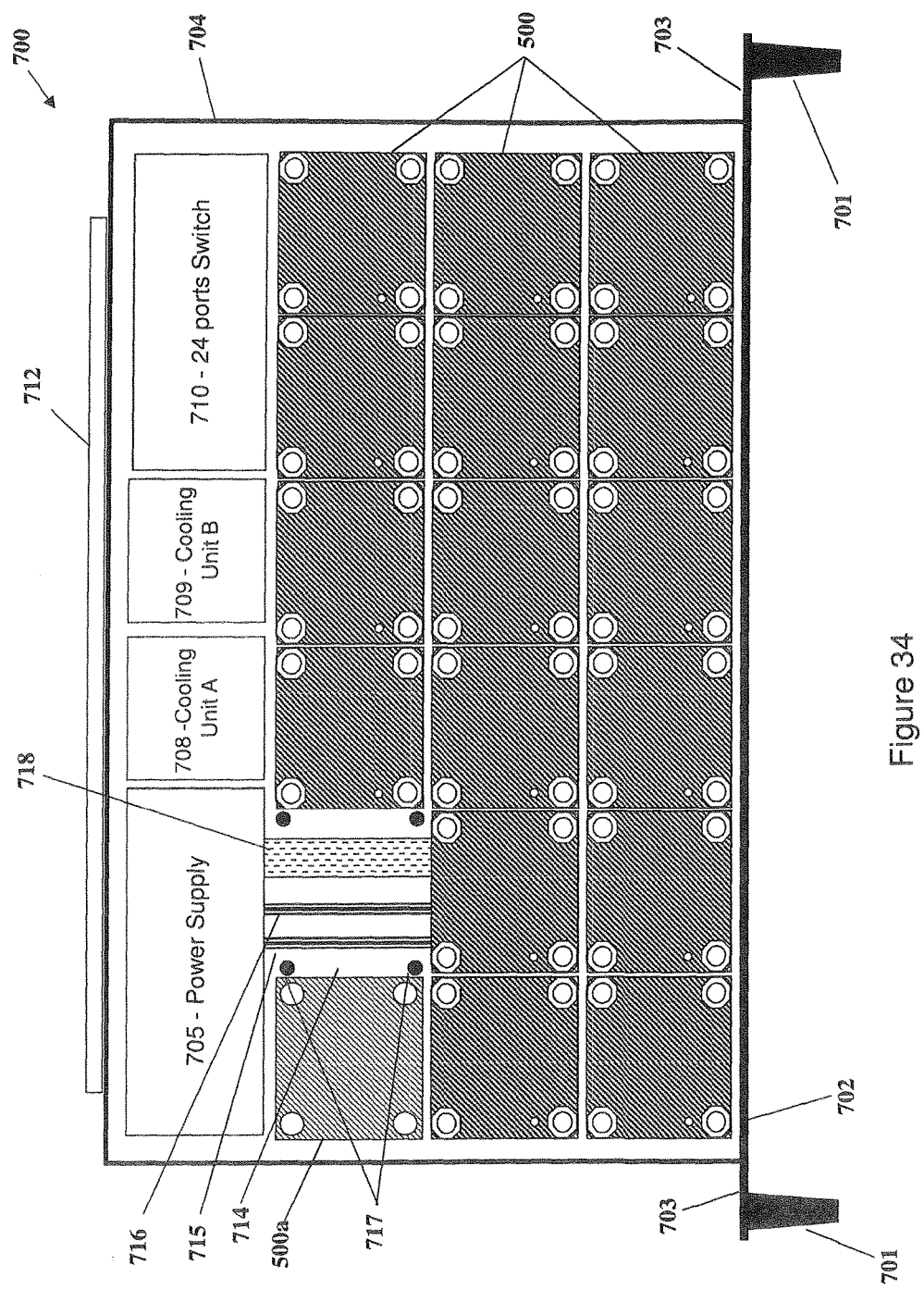
FIG. 34 illustrates a typical 3DMC 3U rack mounted server implementation having 18 cores (16 installed) and built-in redundant cooling power and LAN switch modules according to a preferred embodiment of the present invention.

FIG. 34 illustrates a typical 3DMC 3U rack mounted server implementation 700 having 18 cores and built-in redundant cooling power and LAN switch modules. This example of preferred embodiment server implementation demonstrates the high density characteristics of the 3DMC technology by enabling up to 128 AMD Opteron cores to fit in a standard 19" 3U rack mounted enclosure.

A metal enclosure 704 houses the various server components and attached to the front panel 702. Front panel 702 and the server enclosure 704 can be mounted on a standard 19" rack using standard sets of mounting holes 703 and handles 701. The 18 3DMCs 500 are arranged in three rows on top of the infrastructure rails and busses that interconnect the 3DMCs to the modules located at the back side of the enclosure 704. The 3DMCs are secured to the metal enclosure by removable fasteners to facilitate maintenance and easy upgrades.

Specific 3DMC can be shut down and disassembled by opening the 4 top nuts 308 and removing the cover and the stacked layers. To further illustrate this option—one of the 3DMCs 500*a* is shown in the drawing with layers removed.

If needed for maintenance and upgrade the whole 3DMC can be removed even when other 3DMCs in that server are still running by shutting it down and then inserting a screwdriver to release the mounting screws attaching the 3DMC base layer mounting flanges 514 to the enclosure chassis 704. This option is illustrated in the figure showing one 3DMC location 714 with 3DMC removed exposing the infrastructure connections underneath. The four mounting screw holes 717 are visible as well as the two cooling pipes 715 and 716 and the base electrical interface bus 718. Connection of base layer coolant fluid fitting is dine through plugged quick disconnect fitting to assure that coolant fluid spillage will be minimized.

At the back side of the enclosure 704 several service modules are removably assembled to support the 18 3DMCs. Power supply 705 provides the DC power needed for the 3DMCs from DC input supplied through back side connectors 712. Power supply 705 can switch DC power from external sources and feed the 3DMCs directly or alternatively can operate as a AC to DC converter with one or more redundant channels to allow external AC power input. Cooling System A module 708 provides one channel of heat removal fluid cooling to all 3DMCs. The second Cooling System B module 709 provides a second redundant channel of heat removal fluid cooling to all 3DMCs. This design enables a fail-over mechanism—in case that one channel fails, the other channel may provide the full cooling demand of the 18 3DMCs.

The 24 port LAN switch 710 enable flexible connection of the 18 3DMC primary LAN connections to the external world. In addition this switch may provide a secondary set of 20 ports to support a second primary LAN connection separated or combined with the first 24 ports. In additional the LAN switch may also support additional 20 ports of management LAN of the 3DMCs. This function may also support Fiber Channel switching to enable external connection of remote storage to the 3DMCs. Obviously these functions may be performed by separate and redundant modules to improve system reliability and performance if needed.

Figure 35:
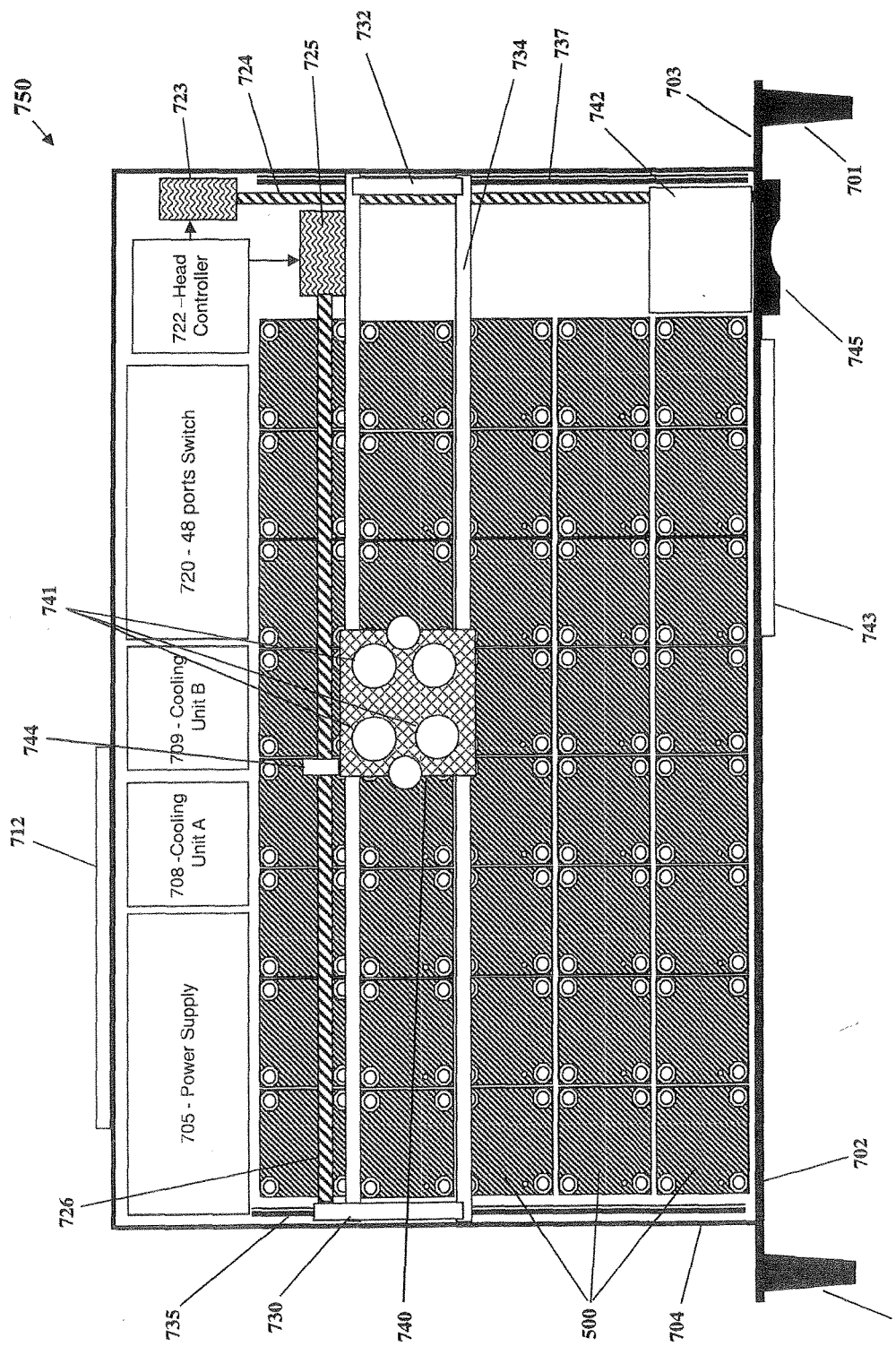
FIG. 35 illustrates yet another typical 3DMC 4U rack mounted server implementation configured as a jukebox having 40 3DMC cores according to a preferred embodiment of the present invention.

FIG. 35 illustrates yet another typical 3DMC 4U rack mounted server implementation 750 configured as a juke-box. This server implementation is having 40 cores and built-in redundant cooling power and LAN switch modules. This example of preferred embodiment server implementation demonstrates the high density characteristics of the 3DMC technology by offering up to 320 AMD Opteron cores to fit in a standard 19" 4U rack mounted enclosure. This particular implementation is built in a juke-box configuration to enable semi-automatic or automatic replacement of faulty layers by robotic head.

This server is built of metal enclosure and chassis 704 and metal panel 702 having a standard 4U dimensions, mounting holes 703 and handles 701 to enable installation in a standard rack.

The 40 3DMC modules 500 are arranged in five rows of eight 3DMCs in each line. Robotic head 740 located on a sliding bridge 734 enables access from above to each one of the 40 3DMCs. The sliding bridge can move in the Y axis by means of electrical stepping motor 723, screw rod 724 and sliding bearings 730 and 732. The sliding bearings enable the sliding bridge to freely move in the Y axis on two sliding rails 735 on the left side and 737 on the right side. The sliding rails are secured to the enclosure and chassis 704. The sliding bridge can be moved by the steeping motors to enable bridge location on top of each 3DMC location. Movement of the sliding bridge in the Y direction is achieved by commands from the head controller 722 that power the stepping motor 723. The stepping motor rotates the Y axis screw rod 724 that moves the bridge through the screw bearing attached to the sliding bridge. Proper location feedback is usually fitted to accurately sense sliding bridge position and deliver it to the head controller 722 that control the two stepping motors 723 and 725.

Movement of the robotic head 740 is done is a similar way by means of stepping motor 725 rotating the X screw rod 726, X axis screw bearing 744. The robotic head is free to move in the X axis by sliding on the lateral rails of the sliding bridge 734. Movement in the X axis is commanded by head controller 722 that powers the X axis stepping motor 725 that rotates the X axis screw rod 726. The sliding screw 744 moves the head in the X direction accordingly.

The robotic head can be accurately positioned on top of each selected 3DMC. Four screw rotation units 741 enable opening and fastening of the 3DMC TCR nuts 308. By executing commands from the head controller 722, the robotic head can disassemble and assemble any 3DMC stack to perform maintenance and upgrades. As the head is moved to the right side, it can unload the stack using stack elevator 742. Layers can be entered or removed by motorized layer slot 745 that fixed to the front panel 702. Said stack elevator 742 can also store spare layers to enable automatic layer exchange in case of a layer failure.

Man-machine interface 743 attached to the front panel 702 enables monitoring and performing specific automatic or semi-automatic actions.

Referring now to FIG. 35 presenting a top view of the complete server and 36*a*-36*c* presenting a side view of a faulty 3DMC an example of fully automated removal of a faulty layer will be further described here. First the faulty 3DMC is shut down by the remote management system. Following the 3DMC complete power down referring to FIG. 35 the robotic head 740 is moved by screw rods 726 and 724 to a position on top of the specific faulty 3DMC 775 shown in FIG. 36*a*.

Figure 36A:
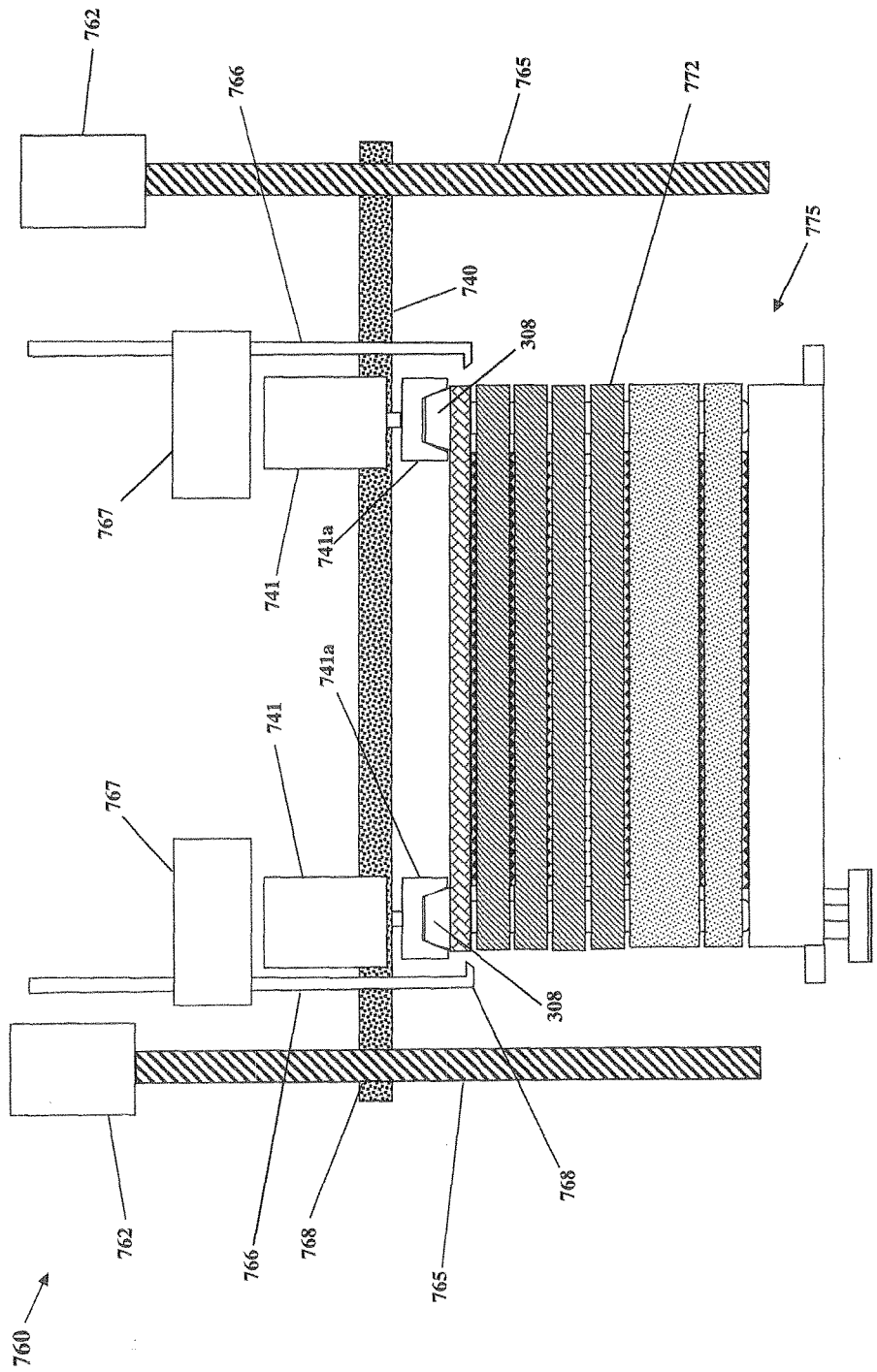
FIG. 36a illustrates side view of the server shown in FIG. 35 while head is positioned on top of the 3DMC stack.

Referring now to FIG. 36*a* once the robotic head 740 accurately positioned on top of the faulty 3DMC the head is lowered by means of two stepping motors 762 and the two vertical screw rods 765 to enable cover unscrewing. The four screw rotating units 741 rotating the nut cups 741a opening unscrewing the four nuts 308.

Figure 36B:
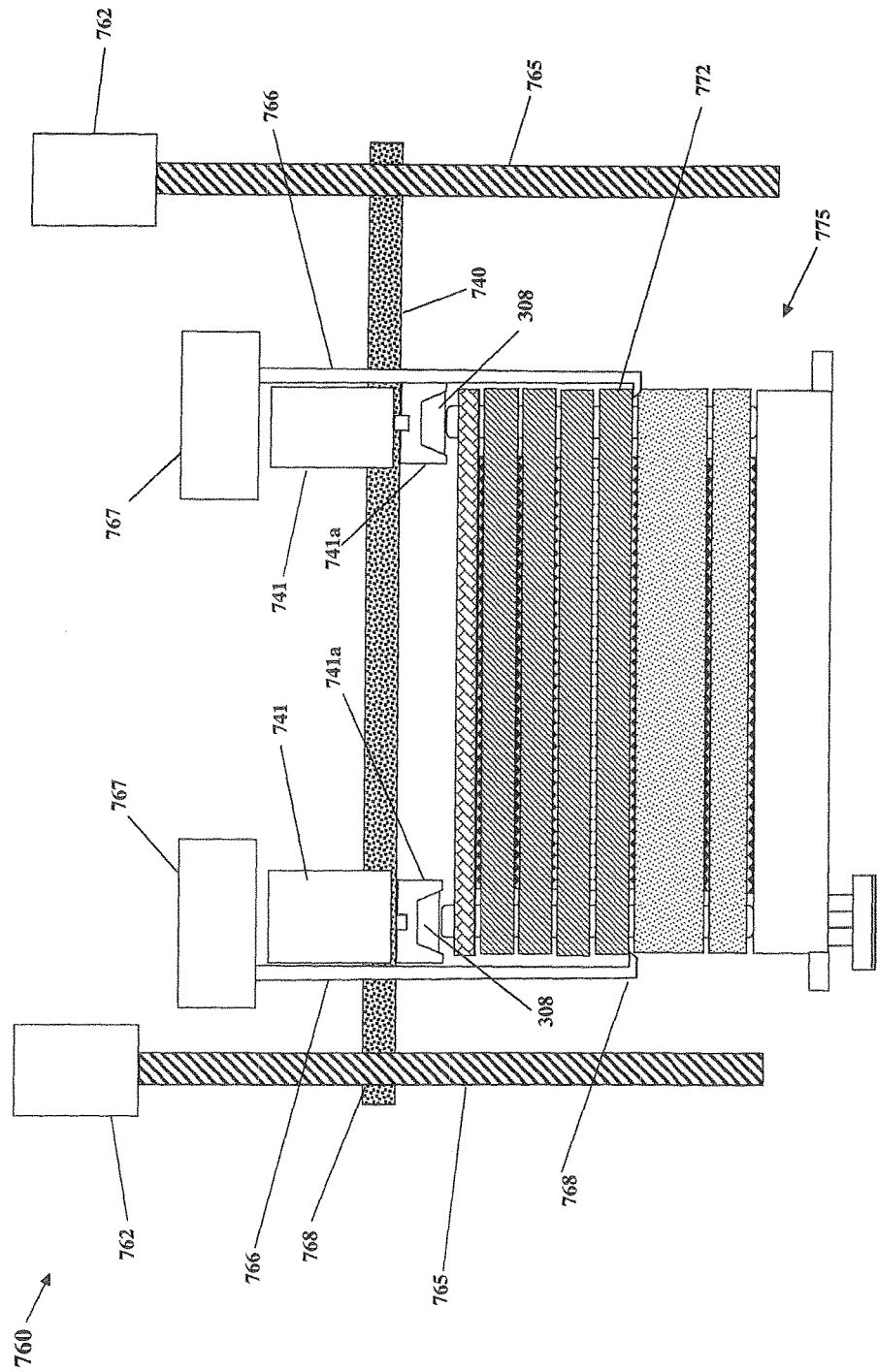
FIG. 36b illustrates side view of the server shown in FIG. 35 while head tweezers are holding the 3DMC stack layers to be removed.

Referring now to FIG. 36b two tweezers 766 are lowered to a specific vertical location motorized and monitored by the two vertical linear actuators 767. Vertical location of the faulty layer is calculated based on the System Management Computer calculated stack data. Solenoid inside actuators 767 then pushes the two tweezers laterally under the faulty layer 772.

Figure 36C:
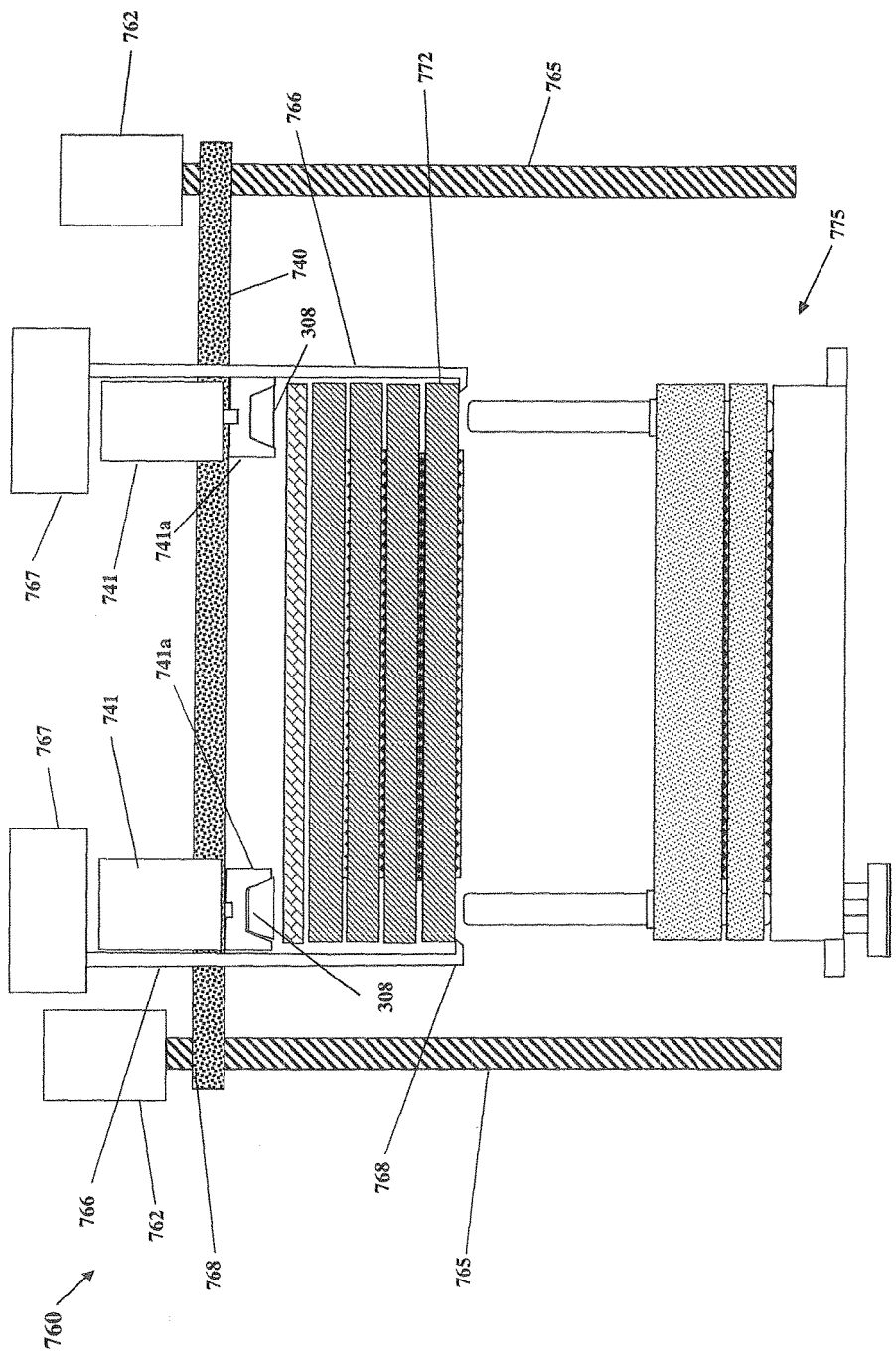
FIG. 36c illustrates side view of the server shown in FIG. 35 while head is lifting up the 3DMC stack layers.

Referring now to FIG. 36c after tweezers 766 located properly, the head is moved vertically upwards to lift the stack by means of two stepper motors 762 and the two screw rods 765. After the stack was lifted above the TCRs, the head is free to move laterally to bring the removed stack to the motorized layer slot area where the process is reversed to lower the stack into the head and leave the lowest layer (said faulty layer 772). In similar manner the stack can then be positioned on top of a god layer to enable addition of that layer to the removed stack.

Using the head and two layers banks, the system may be used to replace, upgrade and maintain all types of layers automatically.

Unwanted layers removed stack may be brought to the stack elevator 742a where it is sorted and the faulty layer is ejected through the motorized layer slot 745. The robotic head can wait for the user to insert an exchange layer into the motorized and then the process is reversed to assemble the stack again.

Automatic action can be programmed into the head controller to enable automatic exchange of faulty layers by the robotic head in case that fault is discovered. This feature enables automatic self-fixing characteristics for the server. This feature is desirable for unattended data-center or at remote sites.

Figure 37:
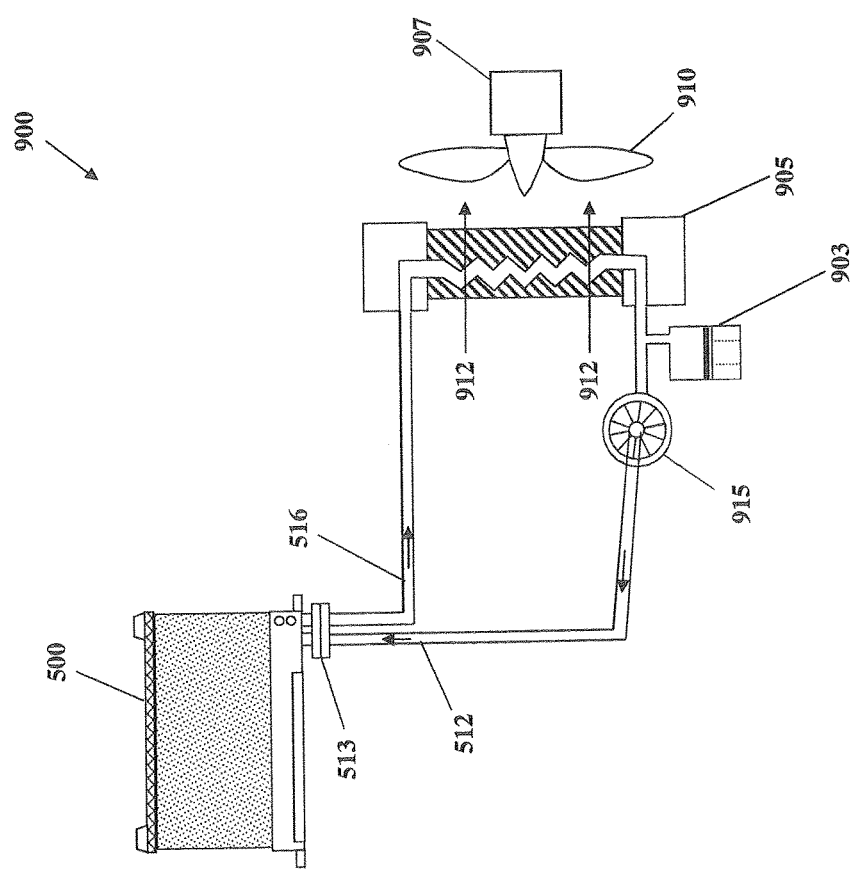
FIG. 37 illustrates a single cycle 3DMC cooling system in accordance with a preferred embodiment of the present invention.

FIG. 37 illustrates a simplified schematic diagram of a 3DMC single cycle liquid cooling system 900. This implementation of a preferred embodiment of the present invention is based on a single system without any redundancy in its design.

Cold coolant fluid 512a such as water enters the 3DMC 500 through quick disconnect fitting 513. Inside the base layer or directly under the base layer, heat delivered by the TCRs elevates the coolant fluid temperature. Hot coolant fluid 516 leaves the 3DMC through same fitting 513 and flow through pipes to a radiator 905 where colder air 912 is forced to flow through by a fan 910 connected to electric motor 907. As passed air 912 takes the heat from the coolant fluid, it is heated. Cold coolant fluid leaving the radiator 905 passed through the reservoir/accumulator 903. The reservoir/accumulator maintain constant fluid level and pressure in the system. It is also used to reduce the risks of air or vapor bubbles. Cold coolant fluid passing through an electric pump 915 controlled by the management system. High pressure cold coolant fluid 512 is then passed back to the 3DMC to complete the closed cycle.

Figure 38:
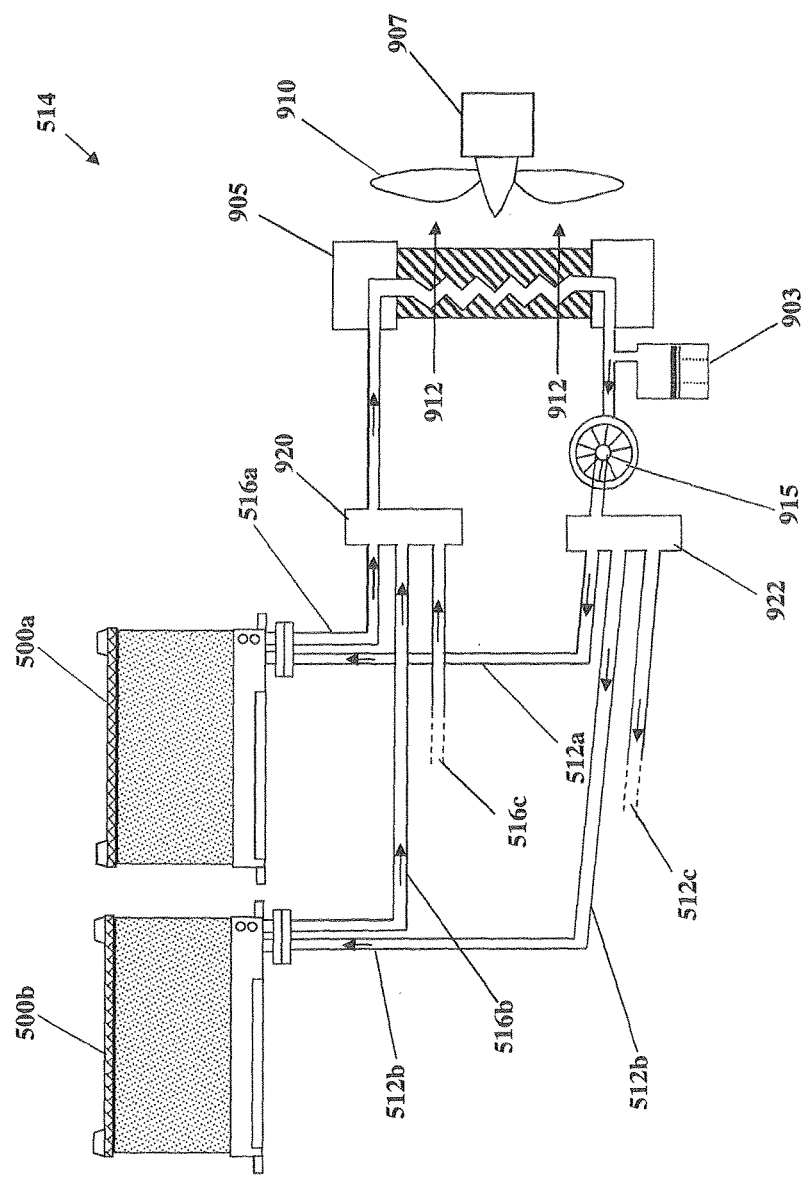
FIG. 38 illustrates a single cycle multiple 3DMC cooling system in accordance with a preferred embodiment of the present invention.

A practical example of a single cycle, single 3DMC having 16 AMD Opteron processors and 4 GB of DDR memory for each CPU, generating around 2.4 KW of heat at 100% load. The cooling capacity to remove this heat using water cycle and water based heat-pipes provides the following:

Water pre-run temperature: 12 deg C.
Water post-run temperature: 18 deg C.
Water pressure loss: 0.5 bar
Water volume flow: 0.01 l/sec
Water inlet pressure: 6 bar Reference is now made to FIG. 38, which illustrates another simplified schematic diagram of a 3DMC single cycle liquid cooling system 514 supporting two 3DMCs. This implementation of a preferred embodiment of the present invention is based on a single cycle similar to the system illustrated in FIG. 37 above with the additional inlet manifold 922 and outlet manifold 920 parts. By adding manifolds more than one 3DMC can be connected in parallel.

In order to avoid thermal stress to the layers, it may be desirable to add a regulation valve in such system for each one of the 3DMCs or even CPU layers. This regulation valve (not shown here) can be used to regulate coolant fluid flow rate resulting changes in heat capture rate.

Figure 39:
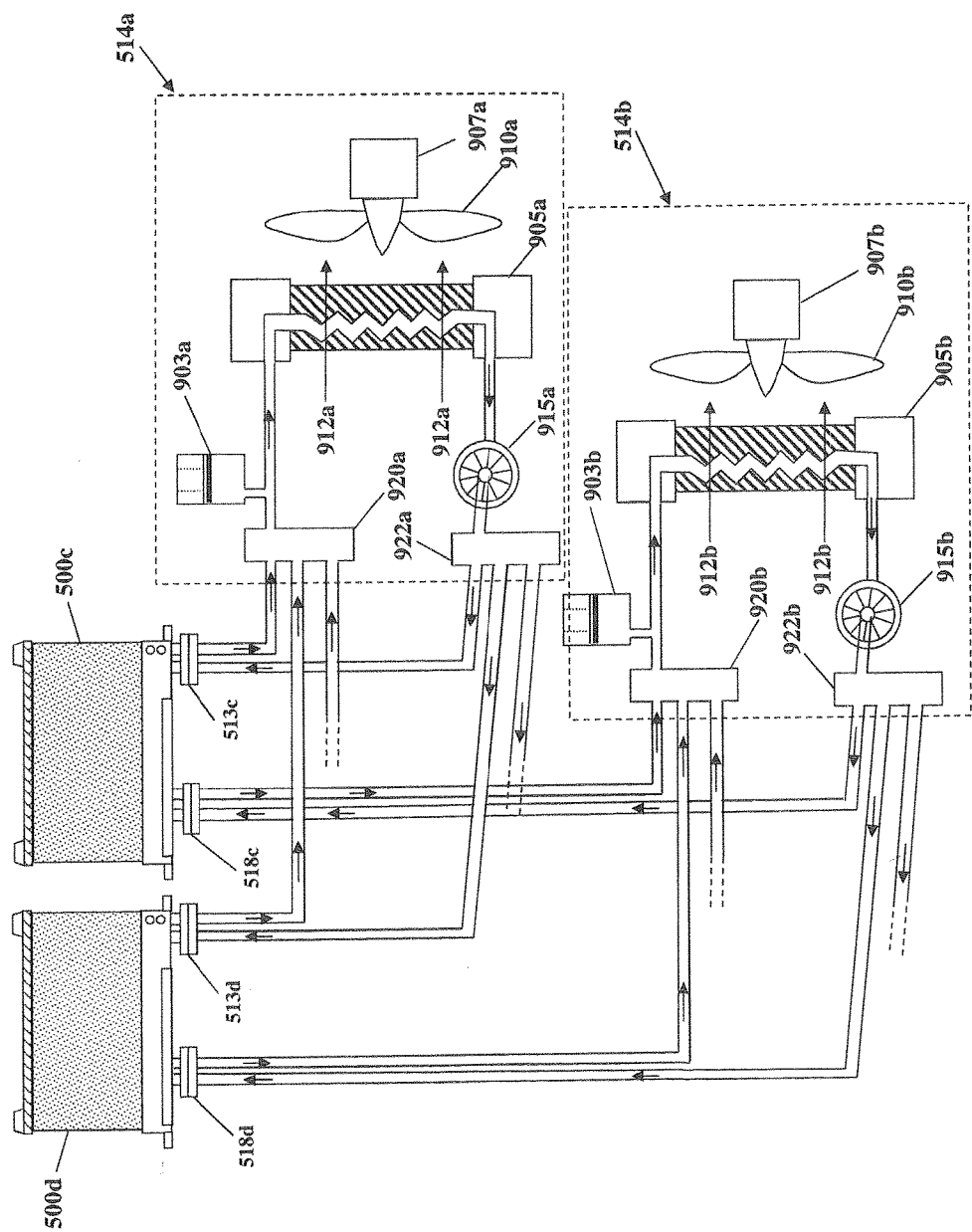
FIG. 39 illustrates a dual cycle multiple 3DMC redundant cooling system in accordance with a preferred embodiment of the present invention.

FIG. 39 illustrates another simplified schematic diagram of a 3DMC liquid cooling system having two redundant coolant fluid cycles 514a and 514b providing cooling for the two 3DMCs 500c and 500d. In this embodiment of the present invention the left side 3DMC 500d receives cold coolant fluid through quick disconnect fitting 518d from the lower cooling system 514b. The same 3DMC also receives cold coolant fluid from the other cooling cycle 514a through quick disconnect fitting 513d.

The right side 3DMC 500c receives cold coolant fluid through quick disconnect fitting 518c from the lower cooling system 514b. The same 3DMC also receives cold coolant fluid from the other cooling cycle 514a through quick disconnect fitting 513c.

The system may be designed with enough cooling capacity to enable full operation of the two 3DMC on just one operating cooling system. Cooling capacity may be controlled by varying air flow speed 912a and 912b through fan and electric motors 907a and 907b. Cooling may also be controlled by varying pumps speed 915a and 915b.

Figure 40:
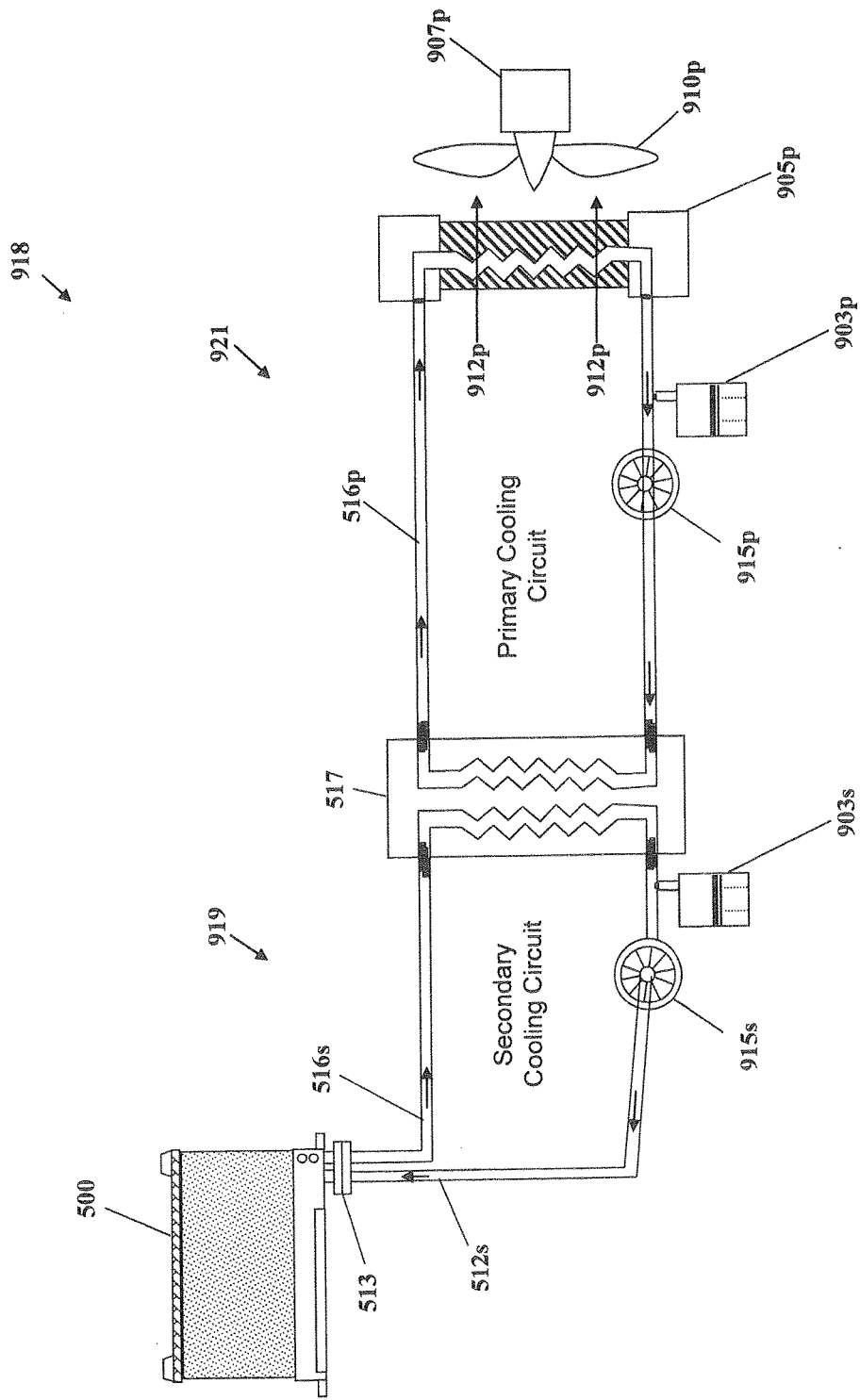
FIG. 40 illustrates a simplified schematic diagram of a 3DMC single cycle liquid cooling system having two liquid circuits in accordance with a preferred embodiment of the present invention.

FIG. 40 illustrates a simplified schematic diagram of a 3DMC single cycle liquid cooling system 918 similar to system 900 illustrated at FIG. 37 above but having two liquid circuits—primary cooling circuit 921 and secondary cooling circuit 919.

Cold coolant fluid enters the 3DMC 500 through pipe 512s and quick connection 513. After absorbing the heat from the TCRs the wanner coolant fluid leaves the 3DMC through the same quick connection 513 and the secondary circuit hot pipe 516s. Warmer coolant fluid then enters the fluid-to-fluid heat exchanger 617 where it releases the heat to the primary cooling circuit coolant fluid. Primary cooling circuit provides colder working fluid flow through heat exchanger 617, then through the primary cooling circuit hot pipe 516p the warm fluid is passed through a chiller or fluid-to-air heat-exchanger 905p. After releasing the heat to the ambient air 912p, the coolant fluid is pumped by the primary circuit cooling pump 915p back to the fluid-to-fluid heat exchanger 917. The working fluid at both primary and secondary circuit is typically water. Water may be mixed with up to 30% anti-freezing agent.

The use of two isolated cooling circuit enables connection of 3DMC racks to standard building cooling circuits. The use of water-to-water or fluid-to-fluid heat exchanger 517 enables efficient connection between the primary—building cooling circuit 921 (typically running with water as the working fluid and connected to external chillers) and the secondary cooling circuit connected to the 3DMC 500 and may run at different pressure, flow rate, temperatures and even different working fluid. This circuit isolation is advantageous for many reasons, such as:

Use of existing cooling infrastructure—building air-conditioning system

Fail-safe cooling system

Better control of operating parameters for 3DMC

Much higher efficiency compared to Air-to-Water cooling method

Less contamination risks due to circuits isolation

Less risks of condensation on colder parts due to better temperatures and flow control at the secondary circuit Better heat fluctuation absorbability due to larger primary circuit mass.

Figure 41:
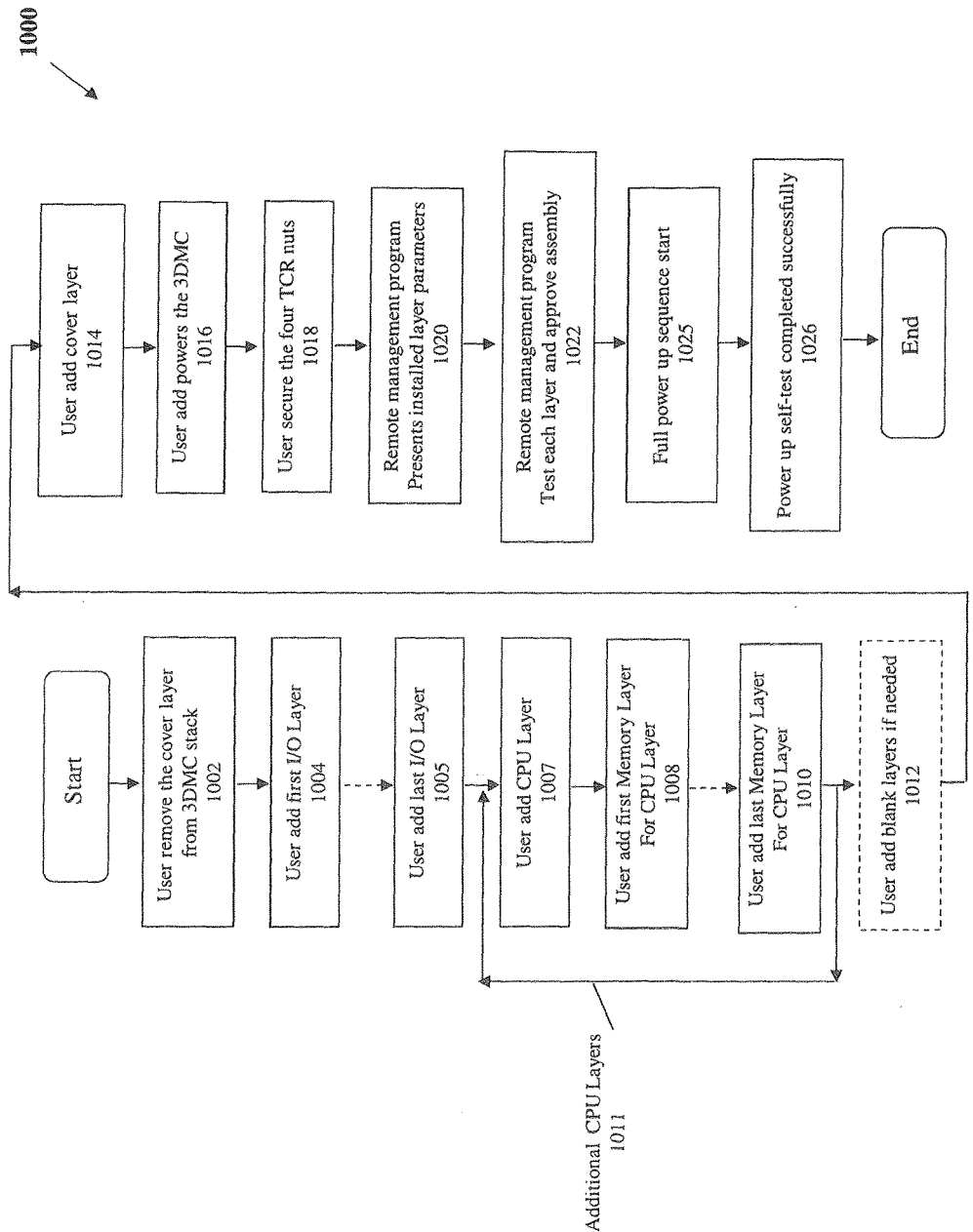
FIG. 41 illustrating a flow-chart representing manual assembly process of 3DMC stack of the present invention.

FIG. 41 illustrates a flow chart of a 3DMC manual layer stacking process. The process starts with the user removing the cover layer from 3DMC stack (1002). Next step the user adds the first I/O layer (1004). In some implementations the user may first add a base layer and/or a power supply layer before I/O layer/s are added.

Next step 1007 the user adds first CPU layer and then one or more memory layer/s are added 1008 until last memory layer is added (1010). Last three steps may be repeated to assemble multiple CPU layers stack. In next optional step 1012 the user adds spacer layers if needed to fill the stack up to the cover layer.

Next step the user adds the cover layer 1014 and apply startup power 1016. During the 3DMC startup sequence the user secures the four TCR nuts using audio or visual torque information measure and generated by the system (step 1018).

After the stack is properly secured, the user receives from the remote management system detailed information about the stack content, layers compatibility, power aspects, layers interconnect status and self test status (step 1022).

If process successfully completed—the management system notifying the user that the build is approved and full 3DMC startup process is initiated (1025).

If power up completed successfully—the management system notifies the user (step 1026) and the 3DMC becomes fully operational.

While the invention has been described with reference to certain exemplary embodiments, various modifications will be readily apparent to and may be readily accomplished by persons skilled in the art without departing from the spirit and scope of the above teachings.

It should be understood that features and/or steps described with respect to one embodiment may be used with other embodiments and that not all embodiments of the invention have all of the features and/or steps shown in a particular figure or described with respect to one of the embodiments. Variations of embodiments described will occur to persons of the art.

It is noted that some of the above described embodiments may describe the best mode contemplated by the inventors and therefore include structure, acts or details of structures and acts that may not be essential to the invention and which are described as examples. Structure and acts described herein are replaceable by equivalents which perform the same function, even if the structure or acts are different, as known in the art. Therefore, the scope of the invention is limited only by the elements and limitations as used in the claims. The terms "comprise", "include" and their conjugates as used herein mean "include but are not necessarily limited to".

The invention claimed is:

1. A 3-Dimensional multi-layered modular computer (3DMC) comprising:
   at least one first CPU layer comprising:
   a) at least one Central Processing Unit (CPU);
   b) a first set of CPU layer contacts and a second set of CPU layer contacts,
      wherein said first set of CPU layer contacts is on a first surface of the CPU layer,
      wherein said second set of CPU layer contact is on a second surface of the CPU layer, and
      wherein the first surface and the second surface are the large and substantially parallel surfaces of the CPU layer;
   c) a System Management Buss (SMB) of the CPU layer coupled to:
      a first portion of said first set of CPU layer contacts,
      a first portion of said second set of CPU layer contacts, and
      the CPU;
   d) a terminator electronically terminating a second portion of said first set of CPU layer contacts;
   e) a memory bus of the CPU layer, connecting said CPU with a second portion of said second set of CPU layer contacts; and
   at least a first memory layer comprising:
   i) a volatile memory;
   ii) a first set of memory layer contacts and a second set of memory layer contacts,
      wherein said first set of memory layer contacts is on a first surface of the memory layer,
      wherein said second set of memory layer contacts is on a second surface of the memory layer, and
      wherein said first surface and said second surface of the memory layer are the large, substantially parallel surfaces of the memory layer;
   iii) a System Management Bus (SMB) of the memory layer coupled to:
      a first portion of said first set of memory layer contacts, and to
      a first portion of said second set of memory layer contacts;
   iv) a memory bus of said memory layer connecting the volatile memory with a second portion of the first set of memory layer contacts and with a second portion of the second set of memory layer contacts,
   wherein locations of said first portion of said second set of CPU layer contacts and second portion of said second set of CPU layer contacts mates the locations of said first portion of said first set of memory layer contacts and second portion of said first set of memory layer contacts such that 3DMC is operational when said first set of memory layer contacts of said at least first memory layer is mated with said second set of said at least first CPU layer.

2. The 3DMC of claim 1, wherein at least a portion of locations of said first set of CPU layer contacts is mirroring the locations of corresponding contacts in said second set of CPU layer contacts.

3. The 3DMC of claim 1, wherein at least a portion of locations of said first set of memory layer contacts is mirroring the locations of corresponding contacts in said second set of memory layer contacts.

4. The 3DMC of claim 1, further comprising a second memory layer, wherein the 3DMC is operational when said second set of memory layer contacts of said at least first memory layer is coupled with first set of contacts of said second memory layer.

5. The 3DMC of claim 1, further comprising a cover layer, wherein said cover layer comprises:
   a) a first set of cover layer contacts on a first surface of said cover layer, wherein said first surface and a second surface of said cover layer are the large, substantially parallel surfaces of said cover layer;
   b) a loop around bus coupled to:
      a first portion of said first set of CPU layer contacts,
      a third portion of said first set of CPU layer contacts; and
   c) a terminator electronically terminating a second portion of said first set of cover layer contacts,
   wherein:
   the CPU layer further comprising a return bus coupled to
      a third portion of said first set of CPU layer contacts, and to
      a third portion of said second set of CPU layer contacts; and
   the memory layer further comprising a return bus coupled to
      a third portion of said first set of memory layer contacts, and to
      a second portion of said second set of memory layer contacts;
   and wherein locations of said third portion of said first set of cover layer contacts matches the locations of said third portion of said second set of memory layer contacts,
   such that the 3DMC is operational when the first set of a memory layer contacts is coupled with said second set of contacts of a CPU layer, and second set of contacts of a memory layer is coupled to said first set of contacts of said cover layer.

6. The 3DMC of claim 5, further comprising a second memory layer, wherein the 3DMC is operational when
   the second set of memory layer contacts of said at least first memory layer is coupled with first set of contacts of said second memory layer,
   and the second set of contacts of said second memory layer is coupled to said first set of contacts of said cover layer.

7. The 3DMC of claim 5, further comprising a second CPU layer, wherein the 3DMC is operational when:
   the second set of memory layer contacts of said at least first memory layer is coupled with first set of contacts of said second CPU layer,
   and the second set of contacts of said second CPU layer is coupled to said first set of contacts of said second memory layer,
   and the second set of contacts of said second memory layer is coupled to said first set of contacts of said cover layer.

8. The 3DMC of claim 5, further comprising a base layer comprising:
   a) a set of base layer contacts; and
   b) a loop-back bus coupled to a third and forth portions of said set of base layer contacts,
   wherein the CPU layer further comprising a side bus coupled to the CPU in said CPU layer and to a forth portion of said first set of CPU layer contacts,
   and wherein the 3DMC is operational when:
      a first portion of said set of base layer contacts is coupled to the first portion of a first set of contacts in a CPU layer,
      a third portion of said set of base layer contacts is coupled to the third portion of a first set of contacts in said CPU layer, and
      a forth portion of said set of base layer contacts is coupled to the forth portion of a first set of contacts in said CPU layer.

9. A 3-Dimensional multi-layered modular computer (3DMC) comprising:
   a cover layer;
   a base layer;
   at least one Central Processing Unit (CPU) layer;
   at least one memory layer; wherein:
   said cover layer comprises terminators coupled to contacts on a lower surface of
   said cover layer;
   wherein said base layer comprises:
      a) a right and a left System Management Busses (SMB), having respective right and left SMB contacts on the upper surface of said base layer; and
      b) a right loop-back bus, lopping between right side bus contacts and pass-through contacts on said upper surface of said base layer,
   wherein each of the CPU layers comprises:
      a) an upper and a lower surface, respectively, having upper and lower electric contacts;
      b) a right CPU and a left CPU;
      c) a right SMB bus and left SMB bus, wherein each SMB bus is coupled to the respective CPU, and to respective upper and lower SMB contacts on said upper and said lower surfaces;
      d) a right terminator and a left terminator connected to respective terminator contacts on said lower surface;
      e) a right memory bus and left memory bus, each coupled to the respective CPU, and to the respective memory bus contacts on said upper surface;
      f) a right side bus coupled to said right CPU and to right side bus contacts on the upper surface of the CPU layer;
      g) a left side bus coupled to said left CPU and to left side bus contacts on lower surface of the CPU layer; and
      h) a pass-through bus coupled to respective upper and lower pass-through bus contacts on the upper and the lower surfaces of the CPU layer,
   each of the memory layers comprising:
      a) an upper surface and a lower surface respectively having upper and lower electric contacts;
      b) a right SMB bus and a left SMB bus, each coupled to respective upper and lower SMB contacts on the upper and lower surfaces, wherein respective left and right SMB contacts on said lower surfaces of a memory layer is capable of coupling to one of:
         i) respective SMB contacts on upper surface of a CPU layer, or
         ii) respective SMB contacts on upper surface of another memory layer, or
         iii) respective SMB terminator on lower surface of a cover layer;
      c) a left memory and a right volatile memory;
      d) a right memory bus and left memory bus, each coupled to respective upper and lower memory bus contacts on said upper and said lower surfaces, wherein respective left and right memory bus contacts on said lower surfaces of a memory layer is capable of coupling to one of:
  i) respective memory bus contacts on upper surface of a CPU layer, or
  ii) respective memory bus contacts on upper surface of another memory layer, wherein respective left and right memory bus contacts on said upper surfaces of a memory layer are capable of coupling to one of:
    i) respective terminator contacts on lower surface of a CPU layer, or
    ii) respective memory contacts on lower surface of another memory layer; or
    ii) respective memory bus terminator on said lower surface of said cover layer;
  e) a right loop-back buss connected to:
    i) pass-through bus contacts on the lower surface of the memory layer, capable of coupling to pass-through bus contacts on the upper surface of a CPU layer; and
    ii) right side-bus contacts on the lower surface of the memory layer, capable of coupling to right side-bus contacts on the upper surface of a CPU layer; and
  f) a left loop-back buss connected to:
    i) pass-through bus contacts on the upper surface capable of coupling to pass-through bus contacts on the lower surface of a CPU layer; and
    ii) left side-bus contacts on the upper surface capable of coupling to left side-bus contacts on the lower surface of a CPU layer.

10. The 3DMC of claim 9, wherein said 3DMC comprises:
  a base layer;
  a first CPU layer coupled to said base layer;
  a first memory layers stack comprising at least one memory layer coupled to said first CPU layer on one side and to a cover layer on the other side.

11. The 3DMC of claim 10, wherein said first memory layers stack comprises a plurality of memory layers coupled to each other.

12. The 3DMC of claim 9, wherein said 3DMC comprises:
  a base layer;
  a first CPU layer coupled to said base layer;
  a first memory layers stack, comprising at least one memory layer coupled to said first CPU layer on one side and to a second CPU layer on the other side;
  a second memory layers stack comprising at least one memory layer, coupled to said second CPU layer on one side and to a cover layer on the other side.

13. The 3DMC of claim 12, wherein the first memory layers stack comprises a plurality of memory layers coupled to each other.

14. The 3DMC of claim 12, wherein said second memory layers stack comprises a plurality of memory layers coupled to each other.

15. The 3DMC of claim 9, further comprising a crossed memory layer comprising:
  a) an upper surface of crossed memory layer and a lower surface of crossed memory layer, respectively having upper electric contacts of crossed memory layer and lower electric contacts electric contacts of crossed memory layer;
  b) a right SMB bus of crossed memory layer and a left SMB bus of crossed memory layer, each coupled to respective upper SMB contacts of crossed memory layer and lower SMB contacts of crossed memory layer, on the respective upper surface of crossed memory layer and the lower surface of crossed memory layer,
    wherein respective lower left SMB contacts of crossed memory layer and lower right SMB contacts of crossed memory layer on the lower surfaces of a memory layer is capable of coupling to one of respective SMB contacts on the upper surface of a CPU layer;
  c) a left volatile memory and a right volatile memory;
  d) a right memory bus of crossed memory layer and left memory bus of crossed memory layer, each respectively coupled to: respective volatile memory, respective upper memory bus contacts of crossed memory layer and lower memory bus contacts of crossed memory layer on said upper surface the of the crossed memory layer and the lower surface of the crossed memory layer,
    wherein respective lower left memory bus contacts of crossed memory layer and lower right memory bus contacts of crossed memory layer on said lower surfaces of a memory layer is capable of coupling to one of respective memory bus contacts on the upper surface of a CPU layer,
    and wherein respective upper left memory bus contacts of crossed memory layer and right memory bus contacts of crossed memory layer on the upper surface of a memory layer are capable of coupling to one of respective terminator contacts on the lower surface of a CPU layer;
  e) a lower center bus connection on the lower surface of crossed memory layer connected to a lower switch, wherein said lower center bus connection is capable to be coupled to a pass-through bus contacts on the upper surface of a CPU layer;
  f) a lower right bus connection on the lower surface of the crossed memory layer connected to the lower switch and to a left switch, wherein the lower right bus connection is capable of coupling to a right side bus contacts on the upper surface of a CPU layer;
  g) an upper center bus connection on the upper surface of the crossed memory layer connected to the lower switch and to the left switch, wherein said upper center bus connection is capable to be coupled to a pass-through bus contacts on the lower surface of a CPU layer;
  h) an upper bus connected to: the left switch, to an upper right bus connection of crossed memory layer on the upper surface of the crossed memory layer, and to an upper left bus connection of crossed memory layer on the upper surface of the crossed memory layer,
    wherein said upper right bus connection of crossed memory layer is capable of coupling to:
      A) a lower right bus connection on the lower surface of another crossed memory layer; and
      B) right side-bus contacts on the lower surface of a memory layer,
    wherein said upper left bus connection of crossed memory layer is capable of coupling to a left side bus contacts on lower surface of a CPU layer, and wherein the lower switch and the left switch are configured to be in one of two states:
      A) standard configuration state, in which:
        said lower switch connects the lower center bus connection to the lower right bus connection;

and said left switch connects said upper center bus connection to said upper bus; and B) crossed memory configuration state, in which
said lower switch connects said lower center bus connection to said upper center bus connection, and said left switch connects said upper bus to said 1ower right bus connection.

16. The 3DMC of claim 15, wherein the lower switch and the left switch are configured to be only in the standard configuration state.

17. The 3DMC of claim 15, wherein the lower switch and the left switch are configured to be only in the crossed memory configuration state.

18. The 3DMC of claim 15, wherein the lower switch and the left switch are configured to be switched between the standard configuration state and the crossed memory configuration state.

* * * * *